(12) United States Patent
Tonegawa et al.

(10) Patent No.: US 12,652,873 B2
(45) Date of Patent: Jun. 9, 2026

(54) SOLID-STATE IMAGING APPARATUS AND METHOD FOR MANUFACTURING THE SAME

(71) Applicant: SONY SEMICONDUCTOR SOLUTIONS CORPORATION, Kanagawa (JP)

(72) Inventors: Susumu Tonegawa, Kanagawa (JP); Hiroaki Ammo, Kanagawa (JP); Akiko Honjo, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 289 days.

(21) Appl. No.: 18/561,210

(22) PCT Filed: Mar. 17, 2022

(86) PCT No.: PCT/JP2022/012319
§ 371 (c)(1),
(2) Date: Nov. 15, 2023

(87) PCT Pub. No.: WO2022/249678
PCT Pub. Date: Dec. 1, 2022

(65) Prior Publication Data
US 2024/0258344 A1 Aug. 1, 2024

(30) Foreign Application Priority Data
May 27, 2021 (JP) ................................. 2021-089586

(51) Int. Cl.
H10F 39/00 (2025.01)

(52) U.S. Cl.
CPC ..... H10F 39/80373 (2025.01); H10F 39/014 (2025.01); H10F 39/811 (2025.01)

(58) Field of Classification Search
CPC ............. H10F 39/80373; H10F 39/014; H10F 39/811; H10F 39/12; H10F 39/199;
(Continued)

(56) References Cited

U.S. PATENT DOCUMENTS

| | | | | |
|---|---|---|---|---|
| 11,984,466 B2 * | 5/2024 | Honjo | ................... | H10F 39/809 |
| 2011/0155893 A1 * | 6/2011 | Endo | ................... | H04N 25/767 |
| | | | | 257/292 |

(Continued)

FOREIGN PATENT DOCUMENTS

| | | |
|---|---|---|
| JP | 2018-011070 A | 1/2018 |
| JP | 2020-519019 A | 6/2020 |

(Continued)

OTHER PUBLICATIONS

International Search Report and Written Opinion of PCT Application No. PCT/JP2022/012319, issued on Jun. 21, 2022, 09 pages of ISRWO.

*Primary Examiner* — Dao H Nguyen
(74) *Attorney, Agent, or Firm* — CHIP LAW GROUP

(57) ABSTRACT

Provided is a solid-state imaging apparatus that includes a first semiconductor substrate including a photoelectric conversion section and a floating diffusion section, and a first transistor including a first semiconductor layer provided above the first semiconductor substrate, a first insulating film provided on a lower surface, an upper surface, and side surfaces of the first semiconductor layer, and a first electrode provided on a lower surface, an upper surface, and side surfaces of the first insulating film. The thickness of the first insulating film on the lower surface of the first semiconductor layer is larger than the thickness of the first insulating film on the upper surface or the side surfaces of the first semiconductor layer.

20 Claims, 39 Drawing Sheets

(58) Field of Classification Search
CPC .. H10F 39/8037; H10F 39/809; H10F 39/812;
H10D 64/27; H10D 64/66; H10D
84/0126; H10D 84/038; H10D 84/00;
H10D 84/83; H10D 99/00; H10D 30/021;
H10D 30/67
See application file for complete search history.

(56) References Cited

U.S. PATENT DOCUMENTS

| | | | | |
|---|---|---|---|---|
| 2014/0042445 | A1* | 2/2014 | Kao | H10F 39/18 |
| | | | | 257/E31.043 |
| 2015/0340393 | A1* | 11/2015 | Tamaki | H10F 39/811 |
| | | | | 257/291 |
| 2020/0381473 | A1* | 12/2020 | Kim | H10K 30/82 |
| 2020/0388681 | A1 | 12/2020 | Yamashita et al. | |
| 2021/0384237 | A1* | 12/2021 | Yamakawa | H04N 25/766 |
| 2022/0059595 | A1* | 2/2022 | Honjo | H10F 39/809 |
| 2025/0221070 | A1* | 7/2025 | Tonegawa | H10F 39/809 |

FOREIGN PATENT DOCUMENTS

| | | | |
|---|---|---|---|
| WO | 2020/075583 | A1 | 4/2020 |
| WO | 2020/090403 | A1 | 5/2020 |

* cited by examiner

F I G . 2
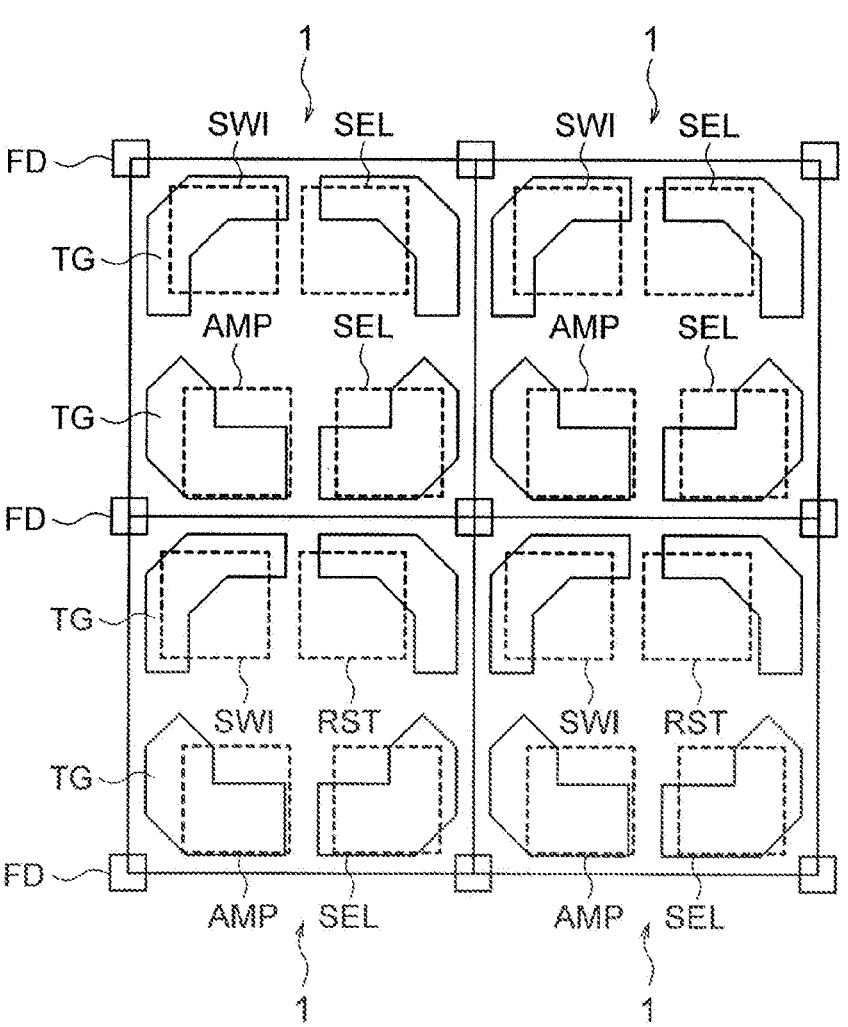

F I G . 3
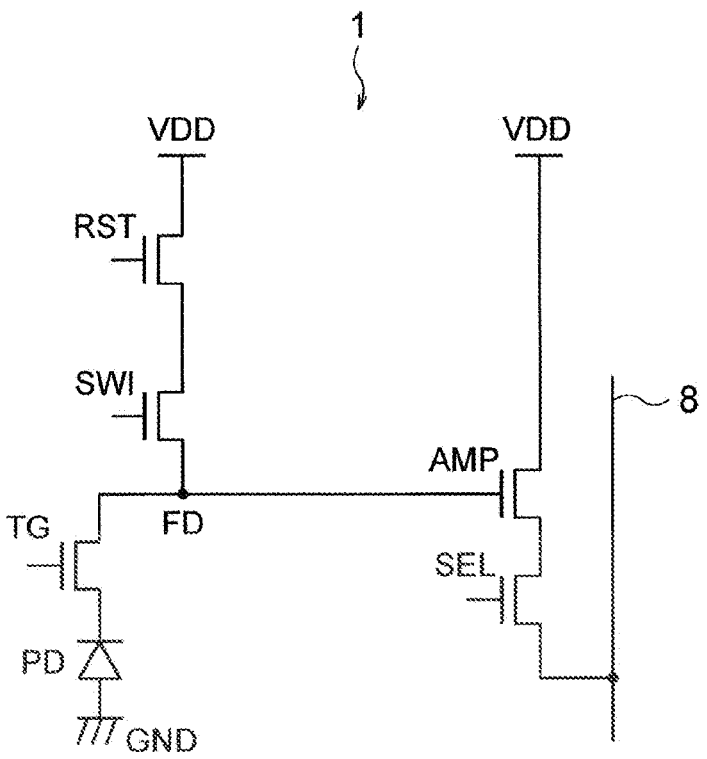

FIG.5

F I G . 6
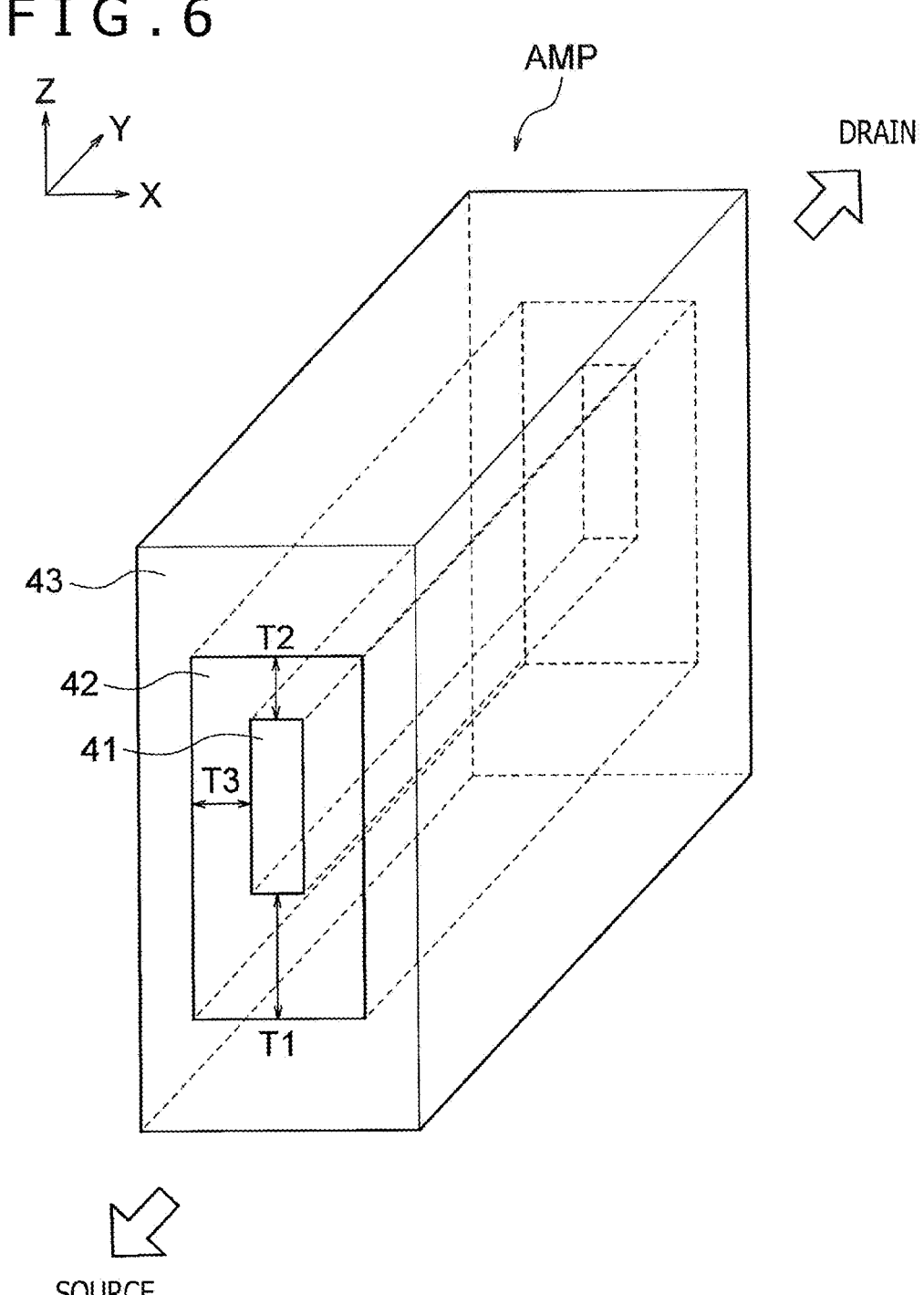

FIG. 8A
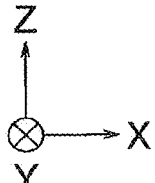
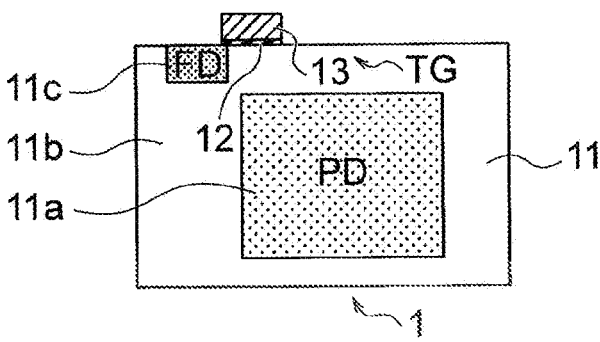
FIG. 8B
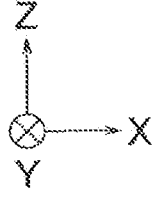
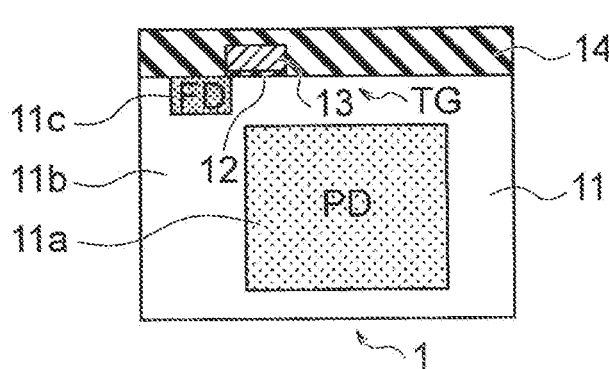

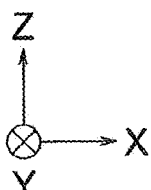
FIG. 9A
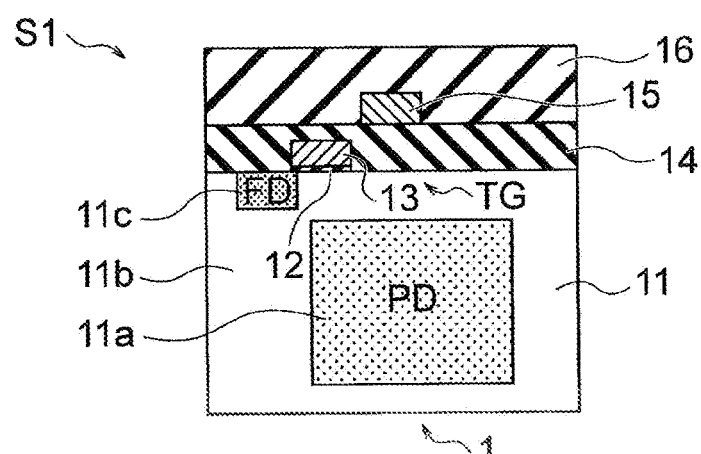
FIG. 9B
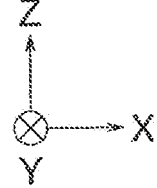
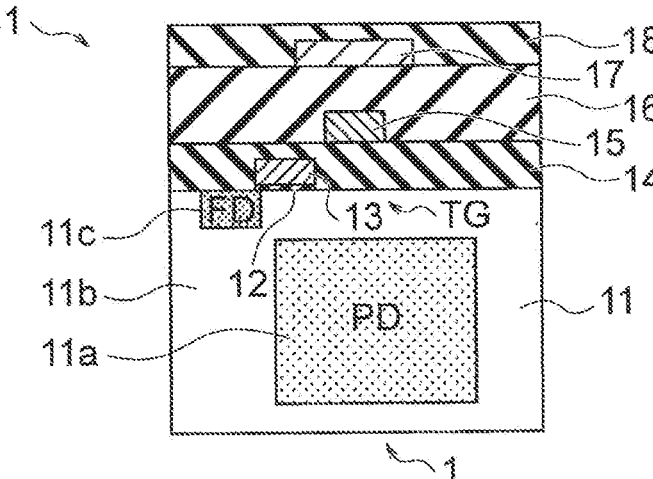

FIG. 16A
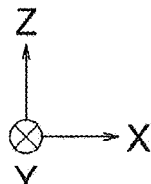
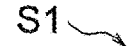
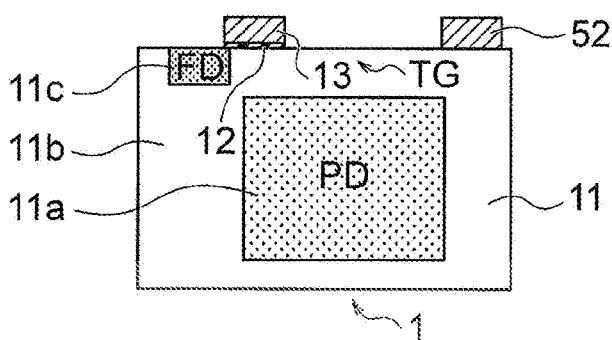
FIG. 16B
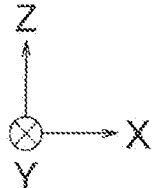
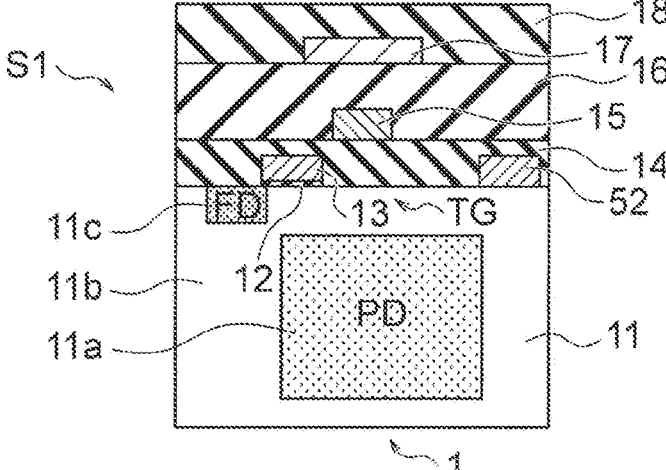

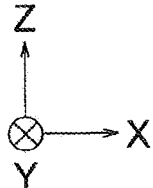
FIG. 20A
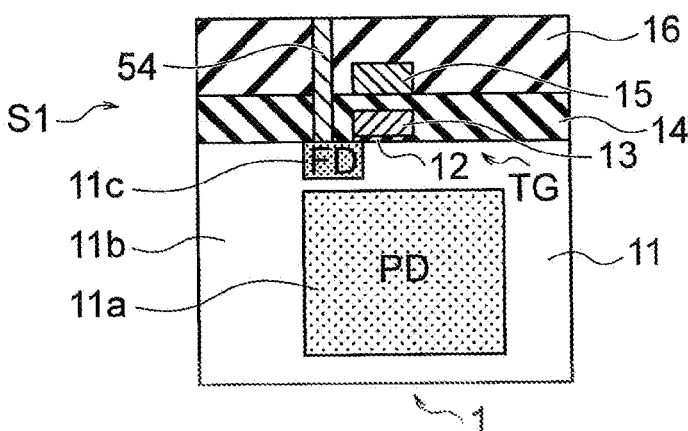
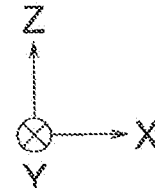
FIG. 20B
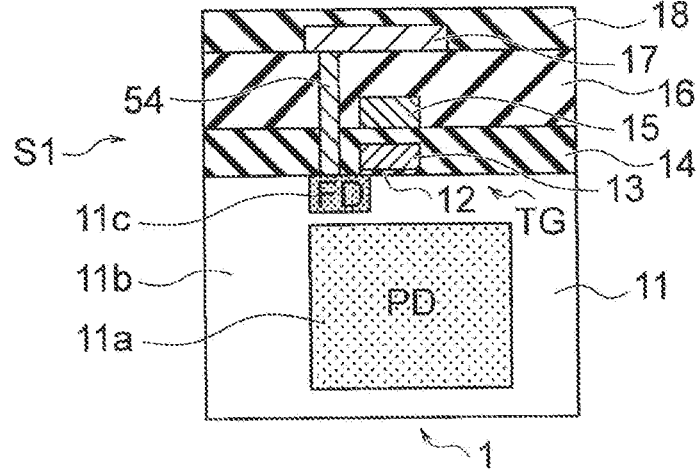

F I G . 2 6
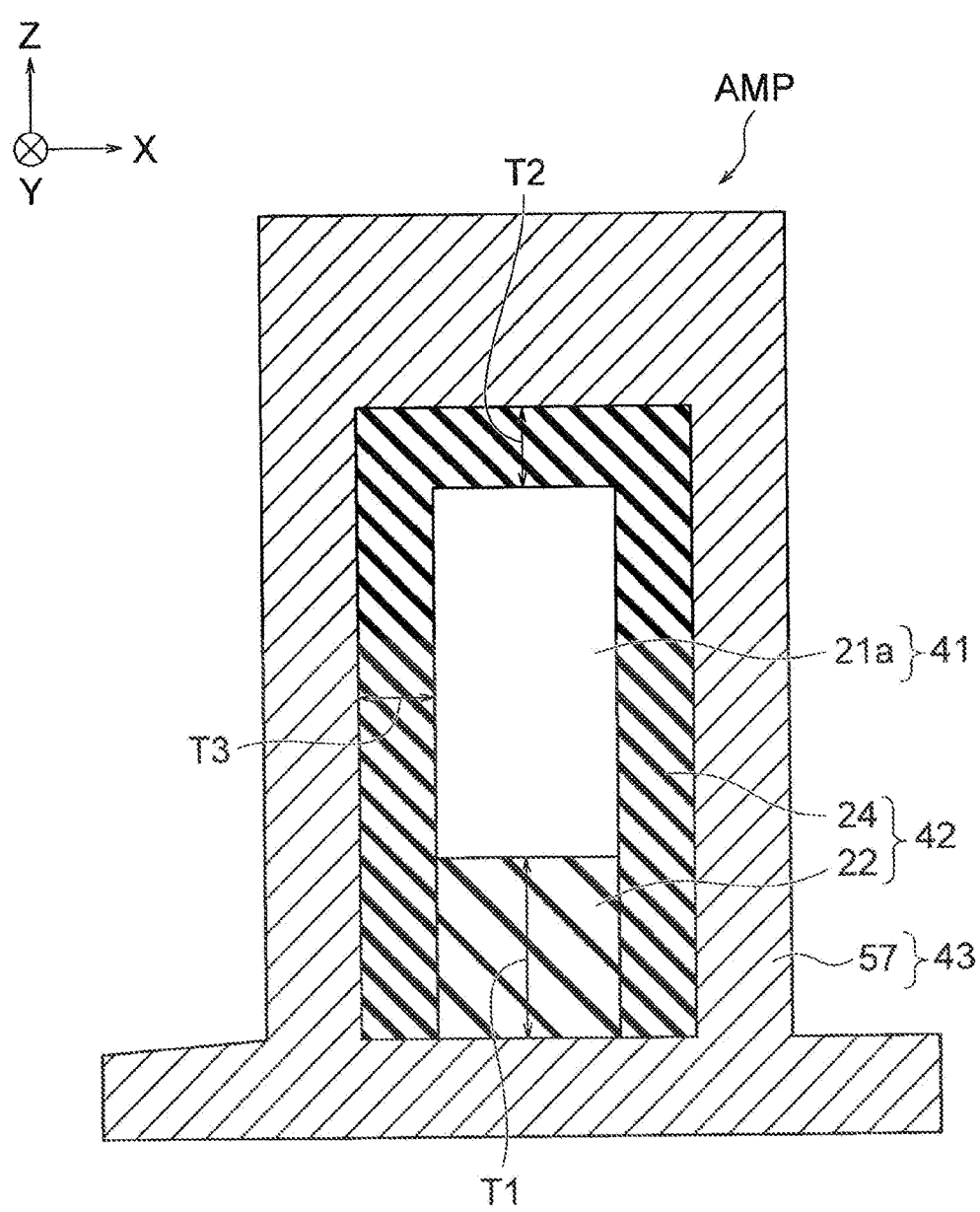

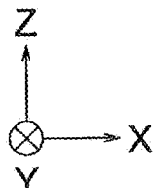
FIG. 27A
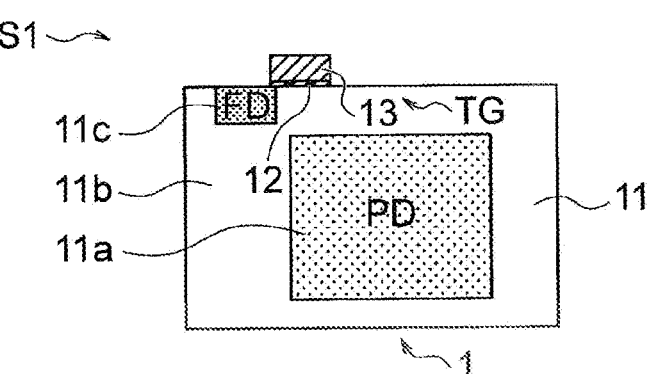
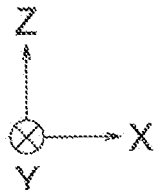
FIG. 27B
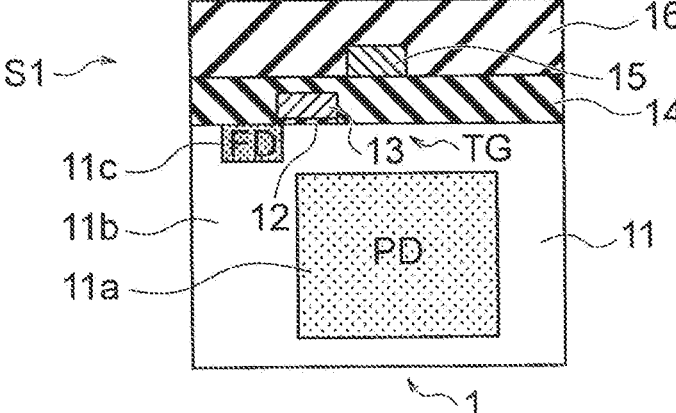

Figure 3:
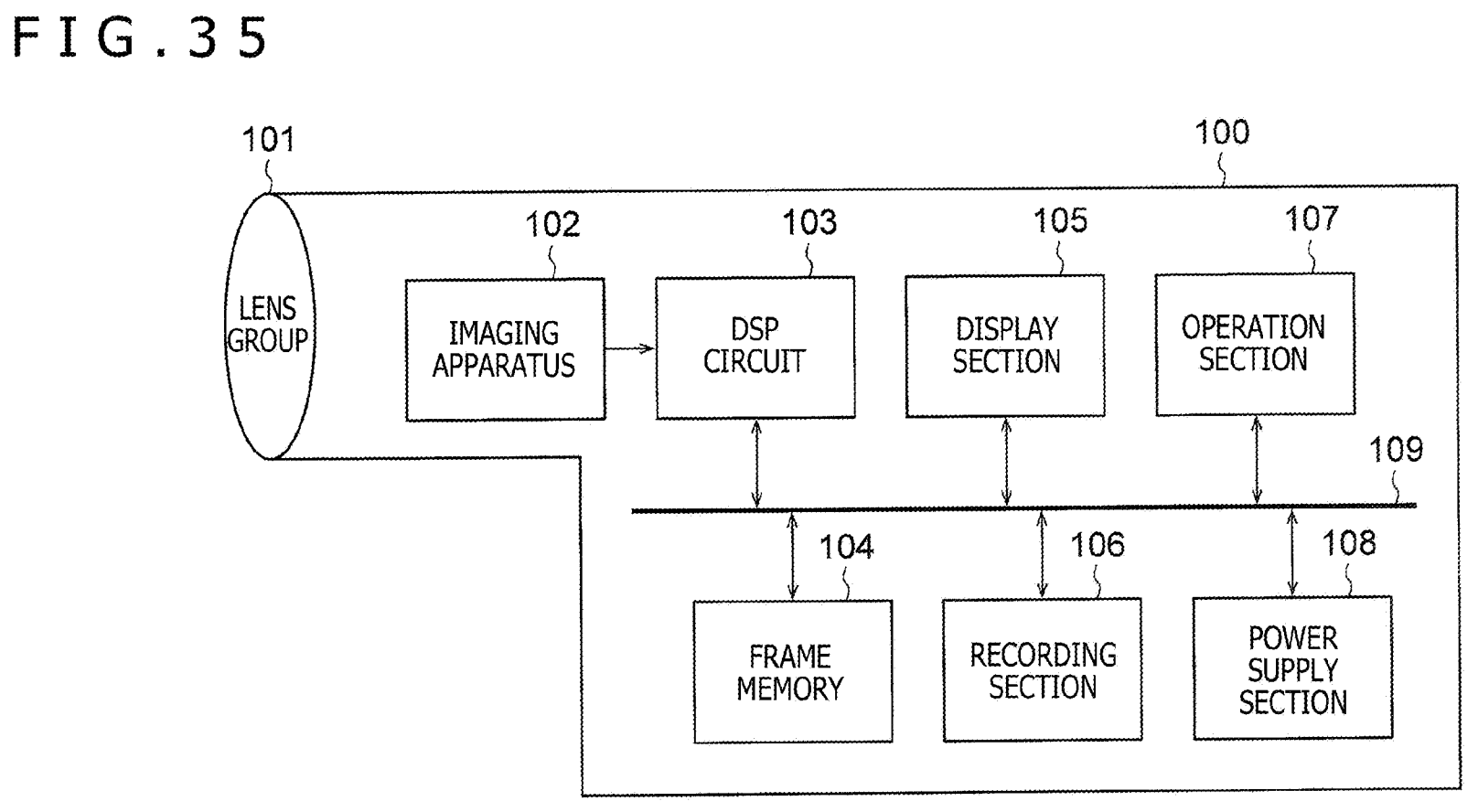

F I G . 3 5

100

101 LENS GROUP

102 IMAGING APPARATUS

103 DSP CIRCUIT

105 DISPLAY SECTION

107 OPERATION SECTION

109

104 FRAME MEMORY

106 RECORDING SECTION

108 POWER SUPPLY SECTION

F I G . 3 6
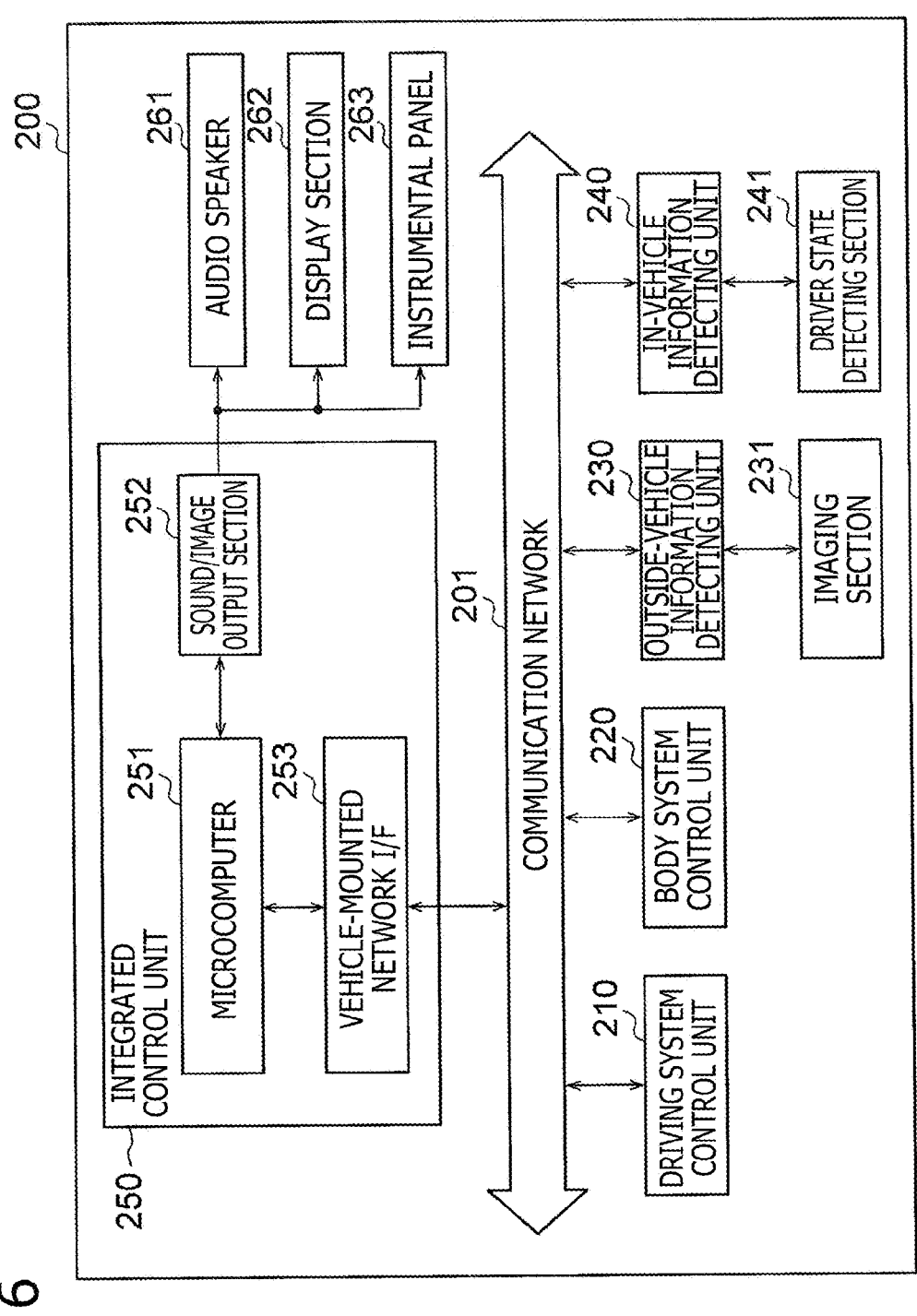

F I G . 3 7
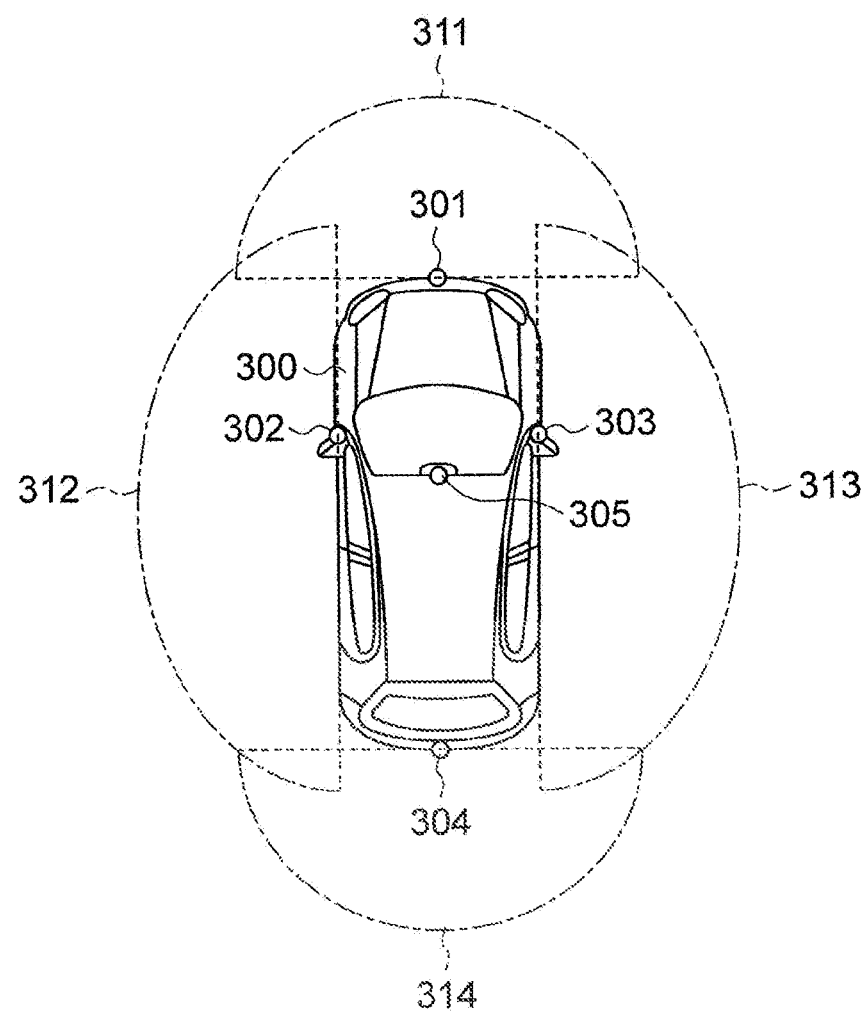

SOLID-STATE IMAGING APPARATUS AND METHOD FOR MANUFACTURING THE SAME

CROSS REFERENCE TO RELATED APPLICATIONS

This application is a U.S. National Phase of International Patent Application No. PCT/JP2022/012319 filed on Mar. 17, 2022, which claims priority benefit of Japanese Patent Application No. JP 2021-089586 filed in the Japan Patent Office on May 27, 2021. Each of the above-referenced applications is hereby incorporated herein by reference in its entirety.

TECHNICAL FIELD

The present disclosure relates to a solid-state imaging apparatus and a method for manufacturing the solid-state imaging apparatus.

BACKGROUND ART

When a solid-state imaging apparatus is manufactured, a photoelectric conversion section and a floating diffusion section may be formed in a semiconductor substrate, and a channel semiconductor layer of a pixel transistor may be formed in a semiconductor layer that is different from the semiconductor substrate in which the photoelectric conversion section and the floating diffusion section are formed. For example, a solid-state imaging apparatus may be manufactured by forming a photoelectric conversion section, a floating diffusion section, wiring, and the like on a first semiconductor substrate side, forming a channel semiconductor layer of a pixel transistor on a second semiconductor substrate side, and laminating the first semiconductor substrate and the second semiconductor substrate to each other. In this case, the wiring is disposed on the first semiconductor substrate, allowing the pixel transistor to be disposed on the second semiconductor substrate with a sufficient margin and hence the solid-state imaging apparatus to be miniaturized.

In such a solid-state imaging apparatus, for an increased effective channel length of the pixel transistor, a groove may be formed in the second semiconductor substrate, and a gate insulating film and a gate electrode of the pixel transistor may be formed in the groove. This enables improvement of noise characteristics of the pixel transistor.

In this case, deepening the groove may further improve the noise characteristics of the pixel transistor. However, the deepened groove hinders impurity atoms from being injected into a channel semiconductor layer or a source/drain region of the pixel transistor, leading to a reduced impurity concentration in these locations. As a result, when a voltage is applied to the wiring, noise from the wiring is likely to affect the pixel transistor, degrading the noise characteristics of the pixel transistor. This makes further miniaturization of the solid-state imaging apparatus difficult.

CITATION LIST

Patent Literature

[PTL 1]
    PCT Patent Publication No. WO2020/075583

SUMMARY

Technical Problem

Accordingly, a gate insulating film and a gate electrode with a GAA (Gate All Around) structure may be formed around the channel semiconductor layer of the pixel transistor in such a manner that the GAA structure protects the channel semiconductor layer from noise. In a case where the GAA structure is applied to the solid-state imaging apparatus, the gate insulating film and the gate electrode are formed by, for example, combining an insulating film and an electrode on the first semiconductor substrate side with an insulating film and an electrode on the second semiconductor substrate side. However, when the first semiconductor substrate and the second semiconductor substrate are laminated to each other, there is the possibility that no high-performance gate insulating film can be formed due to plasma damage being applied to the insulating film on the first semiconductor substrate side at the time of the lamination, or the like. As a result, the noise characteristics of the pixel transistor may fail to be sufficiently improved by the GAA structure.

Accordingly, the present disclosure provides a solid-state imaging apparatus that allows a preferred transistor to be formed in a case where a photoelectric conversion section and a floating diffusion section are formed in a semiconductor substrate and a channel semiconductor layer of a transistor is formed in a semiconductor layer different from the semiconductor substrate, and also provides a method for manufacturing the solid-state imaging apparatus.

Solution to Problem

A solid-state imaging apparatus according to a first aspect of the present disclosure includes a first semiconductor substrate including a photoelectric conversion section and a floating diffusion section, and a first transistor including a first semiconductor layer provided above the first semiconductor substrate, a first insulating film provided on a lower surface, an upper surface, and side surfaces of the first semiconductor layer, and a first electrode provided on a lower surface, an upper surface, and side surfaces of the first insulating film. The thickness of the first insulating film on the lower surface of the first semiconductor layer is larger than the thickness of the first insulating film on the upper surface or side surfaces of the first semiconductor layer. Thus, for example, the thick, first insulating film on the lower surface of the first semiconductor layer can preferably protect the first semiconductor layer, allowing the preferred first transistor to be realized.

Additionally, in the first aspect, the thickness of the first insulating film on the lower surface of the first semiconductor layer may be at least twice the thickness of the first insulating film on the upper surface or side surfaces of the first semiconductor layer. Thus, for example, the first insulating film that is sufficiently thick and is provided on the lower surface of the first semiconductor layer allows the first semiconductor layer to be further preferably protected, allowing the further preferred first transistor to be realized.

Additionally, in the first aspect, the first semiconductor layer, the first insulating film, and the first electrode may extend in a first direction parallel to a surface of the first semiconductor substrate, and the first insulating film and the first electrode may have a tubular shape surrounding the first semiconductor layer. Thus, for example, a GAA structure or a pseudo GAA structure can be realized.

Additionally, in the first aspect, the first semiconductor layer may be a part of a second semiconductor substrate provided above the first semiconductor substrate. Thus, the solid-state imaging apparatus can be manufactured by, for example, laminating the first semiconductor substrate and the second semiconductor substrate to each other.

Additionally, in the first aspect, the first transistor may be an amplifying transistor, a select transistor, a reset transistor, or a switch transistor. Thus, for example, a preferred pixel transistor can be realized.

Additionally, in the first aspect, the first insulating film may include a first film provided on the lower surface of the first semiconductor layer and a second film provided on the upper surface and side surfaces of the first semiconductor layer. Thus, for example, separate steps can be used to form the first insulating film (first film) on the lower surface of the first semiconductor layer and the first insulating film (second film) on the upper surface and side surfaces of the first semiconductor layer.

Additionally, in the first aspect, the first insulating film may further include a third film provided on a lower surface of the first film. Thus, the first insulating film can be formed by, for example, combining the third film on the first semiconductor substrate side with the first film on the first semiconductor layer (for example, the second semiconductor substrate) side.

Additionally, in the first aspect, the first electrode may include a first layer provided on the lower surface of the first insulating film and a second layer provided on the upper surface and side surfaces of the first insulating film. Thus, for example, separate steps can be used to form the first electrode (first layer) on the lower surface of the first insulating film and the first electrode (second layer) on the upper surface and side surfaces of the first insulating film.

Additionally, the solid-state imaging apparatus according to the first aspect may further include a second insulating film that has a thickness same as that of the first electrode on the lower surface of the first insulating film and that is provided laterally to the first electrode on the lower surface of the first insulating film. Thus, for example, the first insulating film can be formed on the first semiconductor substrate via the second insulating film, a part of the second insulating film can then be removed, and a part of the first electrode can then be formed between the first semiconductor substrate and the first insulating film.

Additionally, the solid-state imaging apparatus according to the first aspect may further include a first wire that is provided on an upper surface of the first electrode and that electrically connects the first electrode and the floating diffusion section. Thus, for example, the first wire can be formed after the first transistor is formed.

Additionally, the solid-state imaging apparatus according to the first aspect may include a second semiconductor layer provided above the first semiconductor substrate and a second wire that electrically connects the first semiconductor substrate and the second semiconductor layer. This enables, for example, avoidance of floating of the potential of the second semiconductor layer.

Additionally, in the first aspect, the second semiconductor layer may be a part of a second semiconductor substrate provided above the first semiconductor substrate. Thus, for example, the second transistor on the first semiconductor substrate can electrically be connected to the second semiconductor substrate that is different from the first semiconductor substrate.

Additionally, the solid-state imaging apparatus according to the first aspect may further include a third wire that is provided on a lower surface of the first electrode and that electrically connects the first electrode and the floating diffusion section. Thus, for example, the first wire can be formed before the first transistor is formed.

Additionally, the solid-state imaging apparatus according to the first aspect may further include a fourth wire that is provided on a side surface of the first electrode and that electrically connects the first electrode and the floating diffusion section. Thus, for example, the first wire can be formed after the first transistor is formed.

A method for manufacturing a solid-state imaging apparatus according to a second aspect of the present disclosure includes forming a photoelectric conversion section and a floating diffusion section in a first semiconductor substrate, and forming a first transistor including a first semiconductor layer provided above the first semiconductor substrate, a first insulating film provided on a lower surface, an upper surface, and side surfaces of the first semiconductor layer, and a first electrode provided on a lower surface, an upper surface, and side surfaces of the first insulating film, and the thickness of the first insulating film on the lower surface of the first semiconductor layer is set larger than the thickness of the first insulating film on the upper surface or side surfaces of the first semiconductor layer. Thus, for example, the thick, first insulating film on the lower surface of the first semiconductor layer can preferably protect the first semiconductor layer, allowing the preferred first transistor to be realized.

Additionally, in the second aspect, the first semiconductor layer may be formed by laminating the first semiconductor substrate and a second semiconductor substrate to each other and processing the second semiconductor substrate and the first semiconductor layer. Thus, for example, the solid-state imaging apparatus can be manufactured by laminating the first semiconductor substrate and the second semiconductor substrate to each other.

Additionally, in the second aspect, the first insulating film may include a first film provided on the lower surface of the first semiconductor layer and a second film provided on the upper surface and side surfaces of the first semiconductor layer, and the first semiconductor substrate and the second semiconductor substrate may be laminated to each other via the first film provided on a lower surface of the second semiconductor substrate. Thus, for example, separate steps can be used to form the first insulating film (first film) on the lower surface of the first semiconductor layer and the first insulating film (second film) on the upper surface and side surfaces of the first semiconductor layer.

Additionally, in the second aspect, the first insulating film may further include a third film provided on a lower surface of the first film, and the first semiconductor substrate and the second semiconductor substrate may further be laminated to each other via the third film provided on an upper surface of the first semiconductor substrate. Thus, the first insulating film can be formed by, for example, combining the third film on the first semiconductor substrate side with the first film on the second semiconductor substrate side.

Additionally, in the second aspect, the first electrode may include a first layer provided on the lower surface of the first insulating film and a second layer provided on the upper surface and side surfaces of the first insulating film, and the first semiconductor substrate and the second semiconductor substrate may be laminated to each other via the first layer provided on an upper surface of the first semiconductor substrate. Thus, for example, separate steps can be used to form the first electrode (first layer) on the lower surface of the first insulating film, and the first electrode (second layer) on the upper surface and side surfaces of the first insulating film.

Additionally, in the second aspect, the first semiconductor substrate and the second semiconductor substrate may further be laminated to each other via a second insulating film provided on a lower surface of the first film, and the first electrode may be formed by removing, after the lamination, a part of the second insulating film between the first semiconductor substrate and the second semiconductor substrate, and forming, after the removal, a part of the first electrode between the first semiconductor substrate and the second semiconductor substrate. Thus, for example, the same step can be used to form the first electrode on the lower surface of the first insulating film and the first electrode on the upper surface and side surfaces of the first insulating film.

BRIEF DESCRIPTION OF DRAWINGS

FIG. 2 is a plan view depicting a structure of a solid-state imaging apparatus according to the first embodiment.

FIG. 3 is a circuit diagram depicting a configuration of the solid-state imaging apparatus according to the first embodiment.

FIG. 5 is a cross-sectional view depicting a structure of an amplifying transistor according to the first embodiment.

FIG. 6 is a perspective view depicting the structure of the amplifying transistor according to the first embodiment.

FIGS. 8A and 8B depict cross-sectional views (1/6) illustrating a method for manufacturing the solid-state imaging apparatus according to the first embodiment.

FIGS. 9A and 9B depict cross-sectional views (2/6) illustrating the method for manufacturing the solid-state imaging apparatus according to the first embodiment.

FIGS. 16A and 16B depict cross-sectional views (1/3) illustrating a method for manufacturing the solid-state imaging apparatus according to the first variation described above.

FIGS. 20A and 20B depict cross-sectional views (1/2) illustrating a method for manufacturing the solid-state imaging apparatus according to the second variation described above.

FIG. 26 is a cross-sectional view depicting a structure of an amplifying transistor according to the second embodiment.

FIGS. 27A and 27B depict cross-sectional views (1/5) illustrating a method for manufacturing the solid-state imaging apparatus according to the second embodiment.

FIG. 35 is a block diagram illustrating a configuration example of electronic equipment.

FIG. 36 is a block diagram illustrating a configuration example of a mobile body control system.

FIG. 37 is a plan view illustrating a specific example of set positions of imaging sections of FIG. 36.

DESCRIPTION OF EMBODIMENTS

Embodiments of the present disclosure will be described below with reference to the drawings.

First Embodiment

Figure 1:
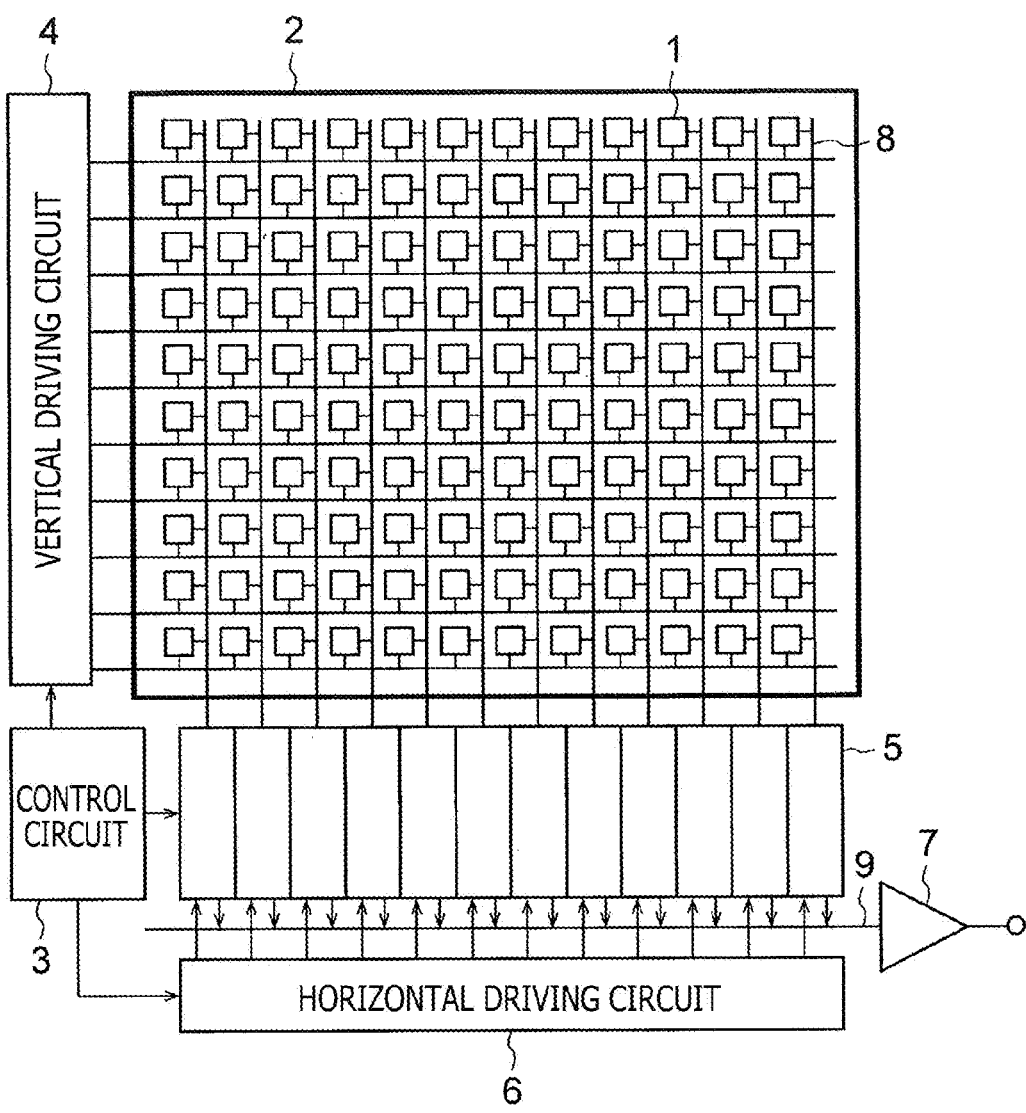
FIG. 1 is a block diagram depicting a configuration of a solid-state imaging apparatus according to a first embodiment.

FIG. 1 is a block diagram depicting a configuration of a solid-state imaging apparatus according to a first embodiment.

A solid-state imaging apparatus in FIG. 1 is an image sensor of a CMOS (Complementary Metal Oxide Semiconductor) type including a pixel array region 2 having multiple pixels 1, a control circuit 3, a vertical driving circuit 4, multiple column signal processing circuits 5, a horizontal driving circuit 6, an output circuit 7, multiple vertical signal lines 8, and a horizontal signal line 9.

Each pixel 1 includes a photodiode functioning as a photoelectric conversion section, and a MOS transistor functioning as a pixel transistor. Examples of the pixel transistor include a transfer transistor, an amplifying transistor, a select transistor, a reset transistor, a switch transistor, and the like. These pixel transistors may be shared by several pixels 1.

The pixel array region 2 includes multiple pixels 1 disposed in a two-dimensional array. The pixel array region 2 includes an effective pixel region that receives light to perform photoelectric conversion and that outputs signal charge generated by the photoelectric conversion, and a black reference pixel region that outputs optical black used as a reference for a black level. In general, the black reference pixel region is disposed in an outer peripheral portion of the effective pixel region.

The control circuit 3 generates, on the basis of a vertical synchronizing signal, a horizontal synchronizing signal, a master clock, and the like, various signals used as references for operations of the vertical driving circuit 4, the column signal processing circuits 5, the horizontal driving circuit 6, and the like. Signals generated by the control circuit 3 include, for example, a clock signal, a control signal, and the like and are input to the vertical driving circuit 4, the column signal processing circuits 5, the horizontal driving circuit 6, and the like.

The vertical driving circuit 4 includes, for example, a shift register to scan the pixels 1 in the pixel array region 2 in a vertical direction on a per-row basis. The vertical driving circuit 4 further supplies a pixel signal based on signal charge generated by each pixel 1, to the column signal processing circuit 5 through the vertical signal line 8.

The column signal processing circuit 5 is disposed, for example, for each column of pixels 1 in the pixel array region 2, and executes signal processing on signals output from the pixels 1 in one row, for each column on the basis of a signal from the black reference pixel region. An example of the signal processing is denoising or signal amplification.

The horizontal driving circuit 6 includes, for example, a shift register to supply a pixel signal from each column signal processing circuit 5 to the horizontal signal line 9.

The output circuit 7 executes signal processing on the signal supplied from each column signal processing circuit

5 through the horizontal signal line 9, and outputs the signal subjected to the signal processing.

FIG. 2 is a plan view depicting a structure of the solid-state imaging apparatus according to the first embodiment.

FIG. 2 illustrates four pixels 1 and nine floating diffusion sections FD in the pixel array region 2 described above. Each pixel 1 includes four transfer transistors TG, an amplifying transistor AMP, a select transistor SEL, a reset transistor RST, and a switch transistor SWI. Each floating diffusion section FD is provided at a respective one of corner portions of the four pixels 1 adjacent to one another.

Each transfer transistor TG is used to transfer signal charge from a photodiode in each pixel 1 to the corresponding floating diffusion section FD. Each floating diffusion section FD converts the signal charge from the photodiode into a voltage signal and outputs the voltage signal. The amplifying transistor AMP amplifies the voltage signal read from the corresponding floating diffusion section FD. The select transistor SEL has a function to bring the corresponding pixel 1 in a selected state. The reset transistor RST resets a potential of the corresponding floating diffusion section FD. The switch transistor SWI has a function to switch the state of the corresponding floating diffusion section FD.

FIG. 3 is a circuit diagram depicting a configuration of the solid-state imaging apparatus according to the first embodiment.

As depicted in FIG. 3, each pixel 1 according to the present embodiment includes a photodiode PD, the transfer transistor TG, the amplifying transistor AMP, the select transistor SEL, the reset transistor RST, the switch transistor SWI, and the floating diffusion section FD. The one transfer transistor TG depicted in FIG. 3 collectively represents the four transfer transistors TG of each pixel 1 depicted in FIG. 2.

An anode of the photodiode PD is electrically connected to a ground wire GND. A cathode of the photodiode PD is electrically connected to the floating diffusion section FD via the transfer transistor TG. The floating diffusion section FD is electrically connected to a gate of the amplifying transistor AMP. The amplifying transistor AMP and the select transistor SEL are connected to each other in series between a power wire VDD and the vertical signal line 8. The reset transistor RST and the switch transistor SWI are connected to each other in series between the power wire VDD and the floating diffusion section FD.

Turning off the switch transistor SWI electrically insulates the floating diffusion section FD from the reset transistor RST to reduce capacity of the floating diffusion section FD. With the capacity of the floating diffusion section FD reduced, few signal electrons significantly reduce the potential of the floating diffusion section FD, and a sensitive voltage signal is output from the floating diffusion section FD. On the other hand, many signal electrons cause the signal charge to overflow from the floating diffusion section FD, preventing acquisition of a voltage signal corresponding to the amount of light incident on the photodiode PD.

Turning on the switch transistor SWI electrically connects the floating diffusion section FD to the reset transistor RST, increasing the capacity of the floating diffusion section FD. With the capacity of the floating diffusion section FD increased, the floating diffusion section FD can receive many electrons but has reduced sensitivity.

Thus, by turning on and off the switch transistor SWI, the solid-state imaging apparatus according to the present embodiment can output an image obtained by reading the signal charge in a high-sensitivity operation mode and an image obtained by reading the signal charge in a low-sensitivity operation mode. By merging these images, the solid-state imaging apparatus according to the present embodiment can achieve enlargement of a dynamic range.

Figure 4:
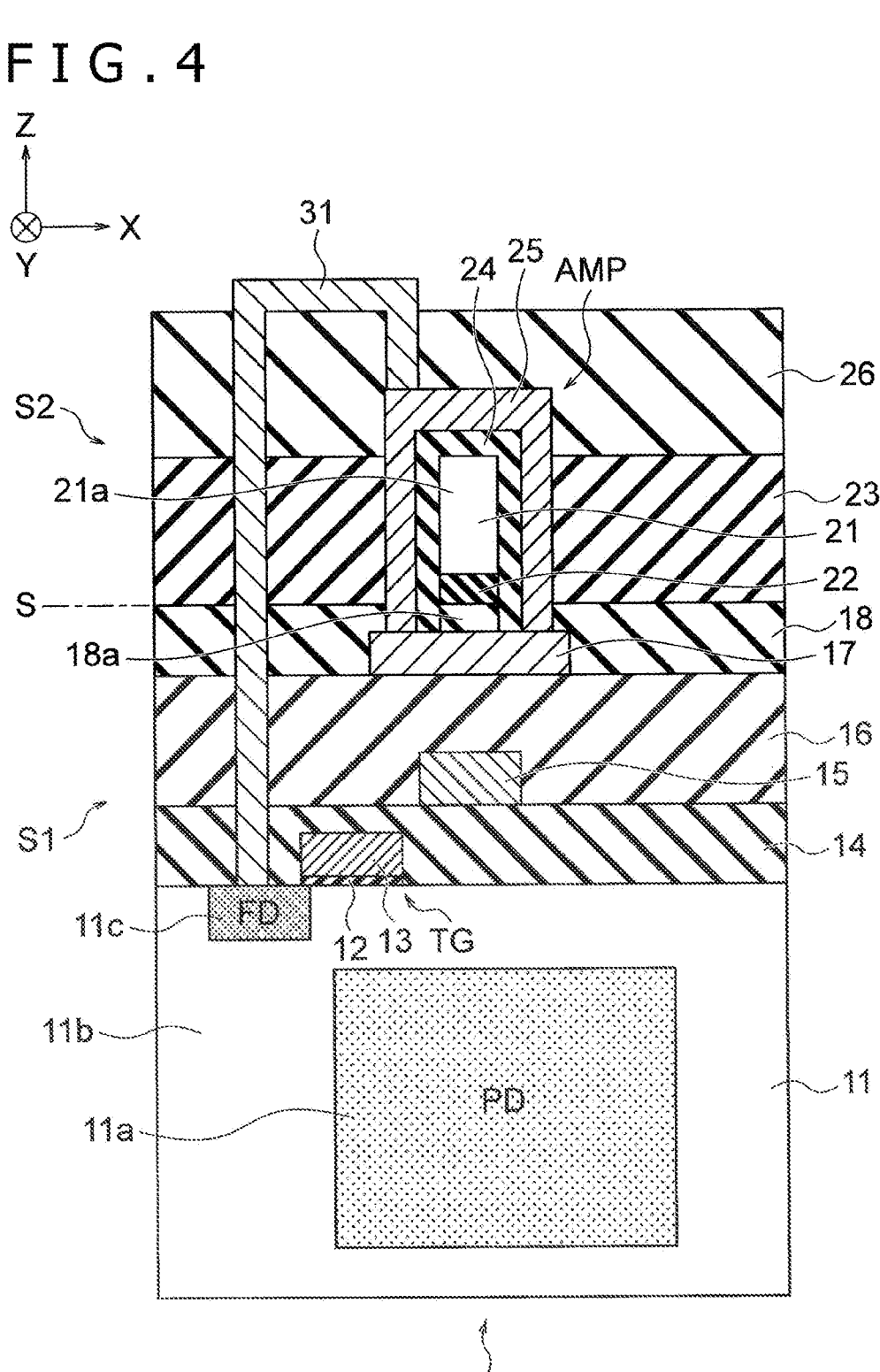
FIG. 4 is a cross-sectional view depicting the structure of the solid-state imaging apparatus according to the first embodiment.

FIG. 4 is a cross-sectional view depicting the structure of the solid-state imaging apparatus according to the first embodiment.

FIG. 4 depicts one of the pixels 1 of the solid-state imaging apparatus according to the present embodiment. As depicted in FIG. 4, the solid-state imaging apparatus according to the present embodiment includes a first semiconductor substrate 11, a gate insulating film 12, a gate electrode 13, a first interlayer insulating film 14, a wire 15, a second interlayer insulating film 16, an electrode 17, a third interlayer insulating film 18, a second semiconductor substrate 21, an insulating film 22, a fourth interlayer insulating film 23, an insulating film 24, an electrode 25, a fifth interlayer insulating film 26, and a wire 31. The first semiconductor substrate 11 includes an n-type region 11a, a p-type region 11b, and an n-type region 11c. FIG. 4 further depicts an insulating film 18a that is a part of the third interlayer insulating film 18 and a semiconductor layer 21a that is a part of the second semiconductor substrate 21.

FIG. 4 depicts an X axis, a Y axis, and a Z axis that are perpendicular to one another. An X direction and a Y direction correspond to a lateral direction (horizontal direction), and a Z direction corresponds to a longitudinal direction (vertical direction). Additionally, a +Z direction corresponds to an up direction, and a −Z direction corresponds to a down direction. The −Z direction may or may not precisely align with the direction of gravitational force.

The solid-state imaging apparatus according to the present embodiment is manufactured by laminating a first substrate S1 including the first semiconductor substrate 11 and the like and a second substrate S2 including the second semiconductor substrate 21 and the like. FIG. 4 depicts a laminated surface S between the first substrate S1 and the second substrate S2. In FIG. 4, the X direction and the Y direction are parallel to an upper surface and the laminated surface S of the first semiconductor substrate 11, and the Z direction is perpendicular to the upper surface and the laminated surface S of the first semiconductor substrate 11. Additionally, the second semiconductor substrate 21 is disposed above the first semiconductor substrate 11, that is, in the +Z direction of the first semiconductor substrate 11.

The first semiconductor substrate 11 is, for example, a silicon substrate. As depicted in FIG. 4, the first semiconductor substrate 11 includes the photodiode PD and the floating diffusion section FD. The photodiode PD is formed by pn junction between the n-type region 11a and the p-type region 11b and functions as a photoelectric conversion section that converts light into charge. In FIG. 4, the p-type region 11b is formed around the n-type region 11a. The floating diffusion section FD includes the n-type region 11c near an upper surface of the first semiconductor substrate 11.

The gate insulating film 12 and the gate electrode 13 are sequentially formed on the first semiconductor substrate 11 to form one transfer transistor TG. The gate insulating film 12 is, for example, a silicon oxide film. The gate electrode 13 is, for example, a polysilicon layer. The three other transfer transistors TG in the pixel 1 depicted in FIG. 4 may have a structure similar to that of the transfer transistor TG depicted in FIG. 4.

The first interlayer insulating film 14 is formed on the first semiconductor substrate 11 and covers the gate insulating film 12 and the gate electrode 13. The wire 15 is formed on the first interlayer insulating film 14. The wire 15 is, for example, a polysilicon wire.

The second interlayer insulating film 16 is formed on the first interlayer insulating film 14 and covers the wire 15. The electrode 17 is formed on the second interlayer insulating film 16 to form the amplifying transistor AMP. The electrode 17 is, for example, a polysilicon electrode. The amplifying transistor AMP is an example of a first transistor according to the present disclosure, and the electrode 17 is an example of a first layer in a first electrode according to the present disclosure.

The third interlayer insulating film 18 is formed on the second interlayer insulating film 16 and covers the electrode 17. The third interlayer insulating film 18 includes an insulating film 18a as described above. The insulating film 18a is formed on the electrode 17 to form the amplifying transistor AMP. The insulating film 18a is, for example, a silicon oxide film. The insulating film 18a is an example of a third film in a first insulating film according to the present disclosure.

The second semiconductor substrate 21 is, for example, a silicon substrate. The second semiconductor substrate 21 includes the semiconductor layer 21a as described above. The semiconductor layer 21a is formed on the insulating film 18a via the insulating film 22. The insulating film 22 is, for example, a silicon oxide film. In FIG. 4, the insulating film 22 is provided on a lower surface of the semiconductor layer 21a, the insulating film 18a is provided on a lower surface of the insulating film 22, and the electrode 17 is provided on a lower surface of the insulating film 18a. The semiconductor layer 21a is an example of a first semiconductor layer according to the present disclosure, and the insulating film 22 is an example of a first film in the first insulating film according to the present disclosure.

The fourth interlayer insulating film 23 is formed on the third interlayer insulating film 18. The insulating film 24 is formed on an upper surface of the semiconductor layer 21a, on side surfaces of the semiconductor layer 21a, the insulating film 22, and the insulating film 18a, and on an upper surface of the electrode 17 to form the amplifying transistor AMP. The insulating film 24 is, for example, a silicon oxide film. The electrode 25 is formed on an upper surface of the insulating film 24, on side surfaces of the insulating film 24, and on the upper surface of the electrode 17 to form the amplifying transistor AMP. The electrode 25 is, for example, a polysilicon electrode. The insulating film 24 is an example of a second film in the first insulating film according to the present disclosure, and the electrode 25 is an example of a second layer in the first electrode according to the present disclosure.

The fifth interlayer insulating film 26 is formed on the fourth interlayer insulating film 23 to cover the amplifying transistor AMP along with the third interlayer insulating film 18 and the fourth interlayer insulating film 23.

The wire 31 is formed in the first interlayer insulating film 14, the second interlayer insulating film 16, the third interlayer insulating film 18, the fourth interlayer insulating film 23, and the fifth interlayer insulating film 26 to electrically connect the floating diffusion section FD and the electrode 25. One end of the wire 31 is provided on an upper surface of the floating diffusion section FD, and the other end of the wire 31 is provided on an upper surface of the electrode 25. The wire 31 is, for example, a metal wire or a semiconductor wire. The wire 31 is an example of a first wire according to the present disclosure.

Note that the solid-state imaging apparatus according to the present embodiment sequentially includes a color filter and an on-chip lens, not illustrated, on a lower surface of the first semiconductor substrate 11.

Figure 5:
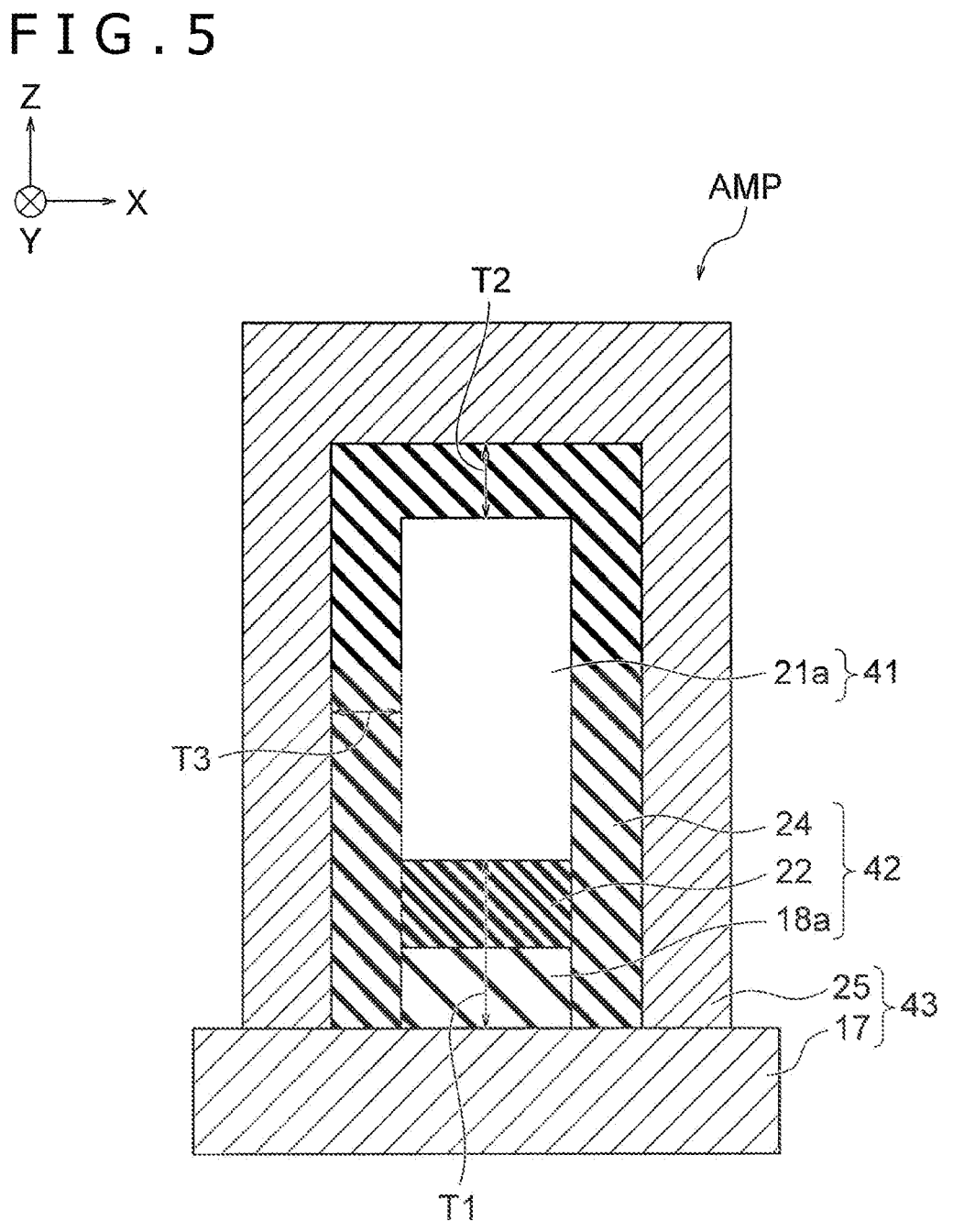

FIG. 5 and FIG. 6 are a cross-sectional view and a perspective view, respectively, depicting a structure of the amplifying transistor AMP according to the first embodiment.

As depicted in FIG. 5 and FIG. 6, the amplifying transistor AMP according to the present embodiment includes a columnar semiconductor layer 41 having a columnar shape extending in the Y direction, a tubular insulating film 42 having a tubular shape extending in the Y direction, and a tubular electrode 43 having a tubular shape 34 extending in the Y direction. The columnar semiconductor layer 41 includes the semiconductor layer 21a described above (FIG. 5). The tubular insulating film 42 includes the insulating films 18a, 22, and 24 (FIG. 5). The tubular electrode 43 includes the electrodes 17 and 25 described above (FIG. 5). The columnar semiconductor layer 41 is an example of the first semiconductor layer according to the present disclosure, the tubular insulating film 42 is an example of the first insulating film according to the present disclosure, and the tubular electrode 43 is an example of the first electrode according to the present disclosure. The Y direction is an example of a first direction according to the present disclosure.

The tubular insulating film 42 is formed on a lower surface, an upper surface, and side surfaces of the columnar semiconductor layer 41 and tubularly extends in the Y direction. Accordingly, the tubular insulating film 42 is tubularly formed around the columnar semiconductor layer 41 in such a manner as to surround the columnar semiconductor layer 41. Similarly, the tubular electrode 43 is formed on a lower surface, an upper surface, and side surfaces of the tubular insulating film 42 and tubularly extends in the Y direction. Accordingly, the tubular electrode 43 is tubularly formed around the tubular insulating film 42 in such a manner as to surround the columnar semiconductor layer 41 and the tubular insulating film 42.

FIG. 5 depicts a thickness T1 of the tubular insulating film 42 on the lower surface of the columnar semiconductor layer 41, a thickness T2 of the tubular insulating film 42 on the upper surface of the columnar semiconductor layer 41, and a thickness T3 of the tubular insulating film 42 on the side surfaces of the columnar semiconductor layer 41. The thickness T1 is equal to the sum of the thickness of the insulating film 18a and the thickness of the insulating film 22. The thickness T2 is equal to the thickness of the insulating film 24 on the upper surface of the columnar semiconductor layer 41. The thickness T3 is equal to the thickness of the insulating film 24 on the side surfaces of the columnar semiconductor layer 41.

In the present embodiment, the thickness of the insulating film 24 is substantially uniform. Accordingly, the thickness T2 according to the present embodiment is substantially equal to the thickness T3 (T2=T3). Meanwhile, the thickness T1 according to the present embodiment is larger than each of the thickness T2 and the thickness T3 (T1>T2, T1>T3), for example, at least twice each of the thicknesses T2 and T3 (T1≥2×T2, T1≥2×T3). Thus, according to the present embodiment, the columnar semiconductor layer 41 can preferably be protected by the thick tubular insulating film 42 on the lower surface of the columnar semiconductor layer 41. The effects of the tubular insulating film 42 as described above will be described below in detail. Note that the thickness T2 may differ from the thickness T3 (T2≠T3).

In a case where the columnar semiconductor layer 41, the tubular insulating film 42, and the tubular electrode 43 wholly function as a channel semiconductor layer, a gate insulating film, and a gate electrode of the amplifying transistor AMP, the tubular insulating film 42 and the tubular electrode 43 are used as a gate insulating film and a gate electrode of the GAA structure described above. In the GAA structure, the gate insulating film and the gate electrode are tubularly formed around the channel semiconductor layer in such as manner as to surround the channel semiconductor layer.

However, in regard to the tubular insulating film 41 according to the present embodiment, the thickness T1 is larger than each of the thickness T2 and the thickness T3. Accordingly, when the thickness T1 is sufficiently larger than each of the thicknesses T2 and T3, the channel in the columnar semiconductor layer 41 is generated only near the upper surface and the side surfaces of the columnar semiconductor layer 41 and not generated near the lower surface of the columnar semiconductor layer 41. In this case, the tubular insulating film 42 and the tubular electrode 43 on the upper surface and the side surfaces of the columnar semiconductor layer 41 correspond to the gate insulating film and the gate electrode, whereas the tubular insulating film 42 and the tubular electrode 43 on the lower surface of the columnar semiconductor layer 41 do not correspond to the gate insulating film and the gate electrode. As a result, the tubular insulating film 42 and the tubular electrode 43 do not correspond to the gate insulating film and the gate electrode of the GAA structure. Accordingly, the tubular insulating film 42 and the tubular electrode 43 according to the present embodiment are not expressed as the gate insulating film and the gate electrode.

In the present embodiment, the columnar semiconductor layer 41, the tubular insulating film 42, and the tubular electrode 43 may wholly function as a channel semiconductor layer, a gate insulating film, and a gate electrode, or the columnar semiconductor layer 41, the tubular insulating film 42, and the tubular electrode 43 may only partly function as a channel semiconductor layer, a gate insulating film, and a gate electrode. For example, in a case where the thickness T1 is sufficiently close to each of the thicknesses T2 and T3, the former gate insulating film and gate electrode having the GAA structure are realized. On the other hand, in a case where the thickness T1 is sufficiently larger than each of the thicknesses T2 and T3, the latter gate insulating film and gate electrode not having the GAA structure are realized. The tubular insulating film 42 and the tubular electrode 43 in the latter case can be said to have a pseudo GAA structure. In other words, the tubular insulating film 42 and the tubular electrode 43 according to the present embodiment may have the GAA structure or the pseudo GAA structure.

Note that, as depicted in FIG. 6, a source region and a drain region of the amplifying transistor AMP according to the present embodiment are formed in the columnar semiconductor layer 41, the tubular insulating film 42, and the tubular electrode 43 in the ±Y direction.

The structure of the amplifying transistor AMP according to the present embodiment is also applicable to the select transistor SEL, the reset transistor RST, and the switch transistor SWI. The gate insulating film and the gate electrode of at least any one of the select transistor SEL, the reset transistor RST, or the switch transistor SWI according to the present embodiment may have a GAA structure or a pseudo GAA structure similar to that of the amplifying transistor AMP.

Figure 7:
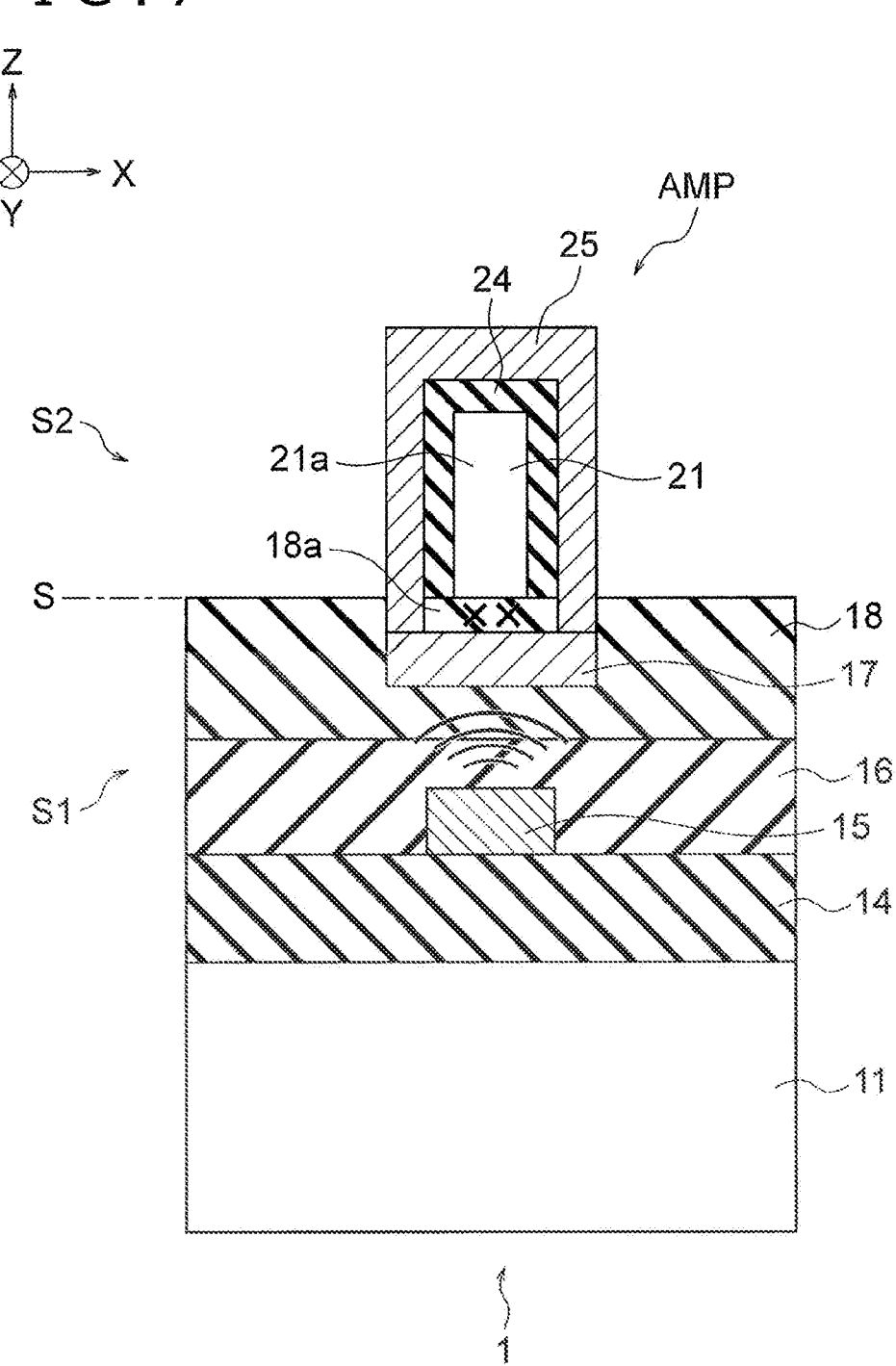
FIG. 7 is a cross-sectional view for describing problems with a solid-state imaging apparatus according to a comparative example of the first embodiment.

FIG. 7 is a cross-sectional view for describing problems with a solid-state imaging apparatus according to a comparative example of the first embodiment.

The solid-state imaging apparatus according to the present comparative example has a structure similar to that of the solid-state imaging apparatus according to the first embodiment, but does not include the insulating film 22. Thus, the thickness T1 of the tubular insulating film 42 according to the present comparative example is substantially equal to each of the thickness T2 and the thickness T3 of the tubular insulating film 42 (T1=T2=T3). See FIG. 5 for the definitions of the tubular insulating film 42 and the thicknesses T1, T2, and T3.

FIG. 7 schematically depicts noise generated from the wire 15. Application of a voltage to the wire 15 may generate noise from the wire 15. When the noise reaches the semiconductor layer 21*a* of the amplifying transistor AMP, operation of the amplifying transistor AMP may be affected by the noise (bias interference).

Accordingly, the amplifying transistor AMP according to the present comparative example includes the insulating film 18*a* and the electrode 17 on the lower surface of the semiconductor layer 21*a*, and as a result, includes a gate insulating film (tubular insulating film 42) and a gate electrode (tubular electrode 43) having a GAA structure. Thus, according to the present comparative example, the insulating film 18*a* and the electrode 17 on the lower surface of the semiconductor layer 21*a* can protect the semiconductor layer 21*a* from noise.

The gate insulating film (tubular insulating film 42) and the gate electrode (tubular electrode 43) according to the present comparative example are formed, for example, as follows. First, the electrode 17 and the third interlayer insulating film 18 (including the insulating film 18*a*) are formed on the first semiconductor substrate 11, and the first semiconductor substrate 11 and the second semiconductor substrate 21 are laminated to each other via the electrode 17 and the third interlayer insulating film 18. Then, the second semiconductor substrate 21 is etched into the semiconductor layer 21*a* (columnar semiconductor layer 41), and the insulating film 24 and the electrode 25 are formed on the upper surface and the side surfaces of the semiconductor layer 21*a*. In this manner, the gate insulating film and the gate electrode having the GAA structure are formed.

In this case, when the first semiconductor substrate 11 and the second semiconductor substrate 21 are laminated to each other, there is the possibility that no high-performance gate insulating film can be formed due to plasma damage being applied to the insulating film 18*a* on the first semiconductor substrate 11 side at the time of the lamination, or the like. FIG. 7 schematically depicts plasma damage applied to the insulating film 18*a*. Such plasma damage may prevent the noise characteristics of the amplifying transistor AMP from being sufficiently improved by the GAA structure. This is because such plasma damage may cause a channel in a non-preferable mode to be generated near the lower surface of the semiconductor layer 21*a*. That is, the gate insulating film and the gate electrode on the lower surface of the semiconductor layer 21*a* may affect the operation of the amplifying transistor AMP.

Accordingly, the thickness T1 of the tubular insulating film 42 according to the present embodiment is set larger than each of the thicknesses T2 and T3 of the tubular insulating film 42 (T1>T2, T1>T3). Thus, the tubular insulating film 42 and the tubular electrode 43 on the lower surface of the columnar semiconductor layer 41 are less likely to or do not contribute to the operation of the amplifying transistor AMP. As a result, with the columnar semiconductor layer 41 protected from noise by the wire 15, the amplifying transistor AMP that has a desired current-voltage characteristics can be realized. Additionally, according to the present embodiment, an increased dimension of the columnar semiconductor layer 41 in the Z direction enables an increase in the effective channel length of the amplifying transistor AMP.

Note that the tubular insulating film 42 and the tubular electrode 43 on the lower surface of the columnar semiconductor layer 41 are desirably as little contributory to the operation of the amplifying transistor AMP as possible. Accordingly, the thickness T1 of the tubular insulating film 42 according to the present embodiment is desirably larger than each of the thicknesses T2 and T3 of the tubular insulating film 42 whenever possible. For example, the thickness T1 according to the present embodiment is desirably at least twice each of the thicknesses T2 and T3 (T1≥2×T2, T1≥2×T3).

FIGS. 8A, 8B, 9A, 9B, 10A, 10B, 11A, 11B, 12A, 12B, 13A, and 13B are cross-sectional views illustrating a method for manufacturing the solid-state imaging apparatus according to the first embodiment.

First, in the first semiconductor substrate 11, ion injection is used to form the n-type region 11*a*, the p-type region 11*b*, and the n-type region 11*c* (FIG. 8A). As a result, the photodiode PD and the floating diffusion section FD are formed in the first semiconductor substrate 11. The n-type region 11*a*, the p-type region 11*b*, and the n-type region 11*c* are formed by, for example, injecting p-type impurity ions into the p-type region 11*b* and injecting n-type impurity ions into the n-type region 11*c*.

Then, the gate insulating film 12 is formed on the first semiconductor substrate 11, and the gate electrode 13 is formed on the gate insulating film 12 (FIG. 8A). As a result, the transfer transistor TG is formed on the first semiconductor substrate 11. The gate insulating film 12 and the gate electrode 13 are formed by, for example, forming, on the first semiconductor substrate 11, a silicon oxide film becoming the gate insulating film 12, using thermal CVD (Chemical Vapor Deposition) to deposit, on the silicon oxide film, a polysilicon layer becoming the gate electrode 13, and using photolithography and dry etching to process the polysilicon layer. The dry etching is used to form the gate electrode 13 from the polysilicon layer and form the gate insulating film 12 from the silicon oxide film.

Then, on the first semiconductor substrate 11, the first interlayer insulating film 14 is formed via the gate insulating film 12 and the gate electrode 13 (FIG. 8B). The first interlayer insulating film 14 is formed by, for example, using plasma CVD to deposit the first interlayer insulating film 14 on the first semiconductor substrate 11 and using CMP (Chemical Mechanical Polishing) to flatten the surface of the first interlayer insulating film 14.

Then, the wire 15 is formed on the first interlayer insulating film 14, and the second interlayer insulating film 16 is formed on the first interlayer insulating film 14 via the wire 15 (FIG. 9A). The wire 15 is formed by, for example, using thermal CVD to deposit, on the first interlayer insulating film 14, a polysilicon layer becoming the wire 15, and using photolithography and dry etching to process the polysilicon layer. The second interlayer insulating film 16 is formed by, for example, using plasma CVD to deposit the second interlayer insulating film 16 on the first interlayer insulating film 14, and using CMP to flatten the surface of the second interlayer insulating film 16.

Then, the electrode 17 is formed on the second interlayer insulating film 16, and the third interlayer insulating film 18 is formed on the second interlayer insulating film 16 via the electrode 17 (FIG. 9B). The electrode 17 is formed by, for example, using thermal CVD to deposit, on the second interlayer insulating film 16, a polysilicon layer becoming the electrode 17, and using photolithography and dry etching to process the polysilicon layer. The third interlayer insulating film 18 is formed by, for example, using plasma CVD to deposit the third interlayer insulating film 18 on the second interlayer insulating film 16, and using CMP to flatten the surface of the third interlayer insulating film 18.

Figure 10A:
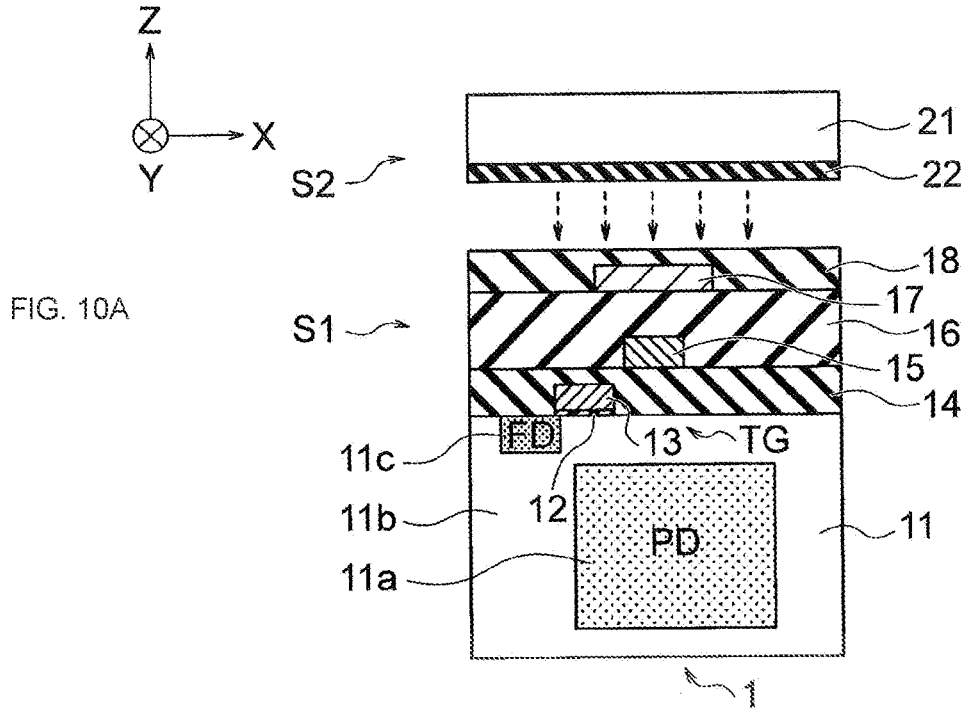
FIGS. 10A and 10B depict cross-sectional views (3/6) illustrating the method for manufacturing the solid-state imaging apparatus according to the first embodiment.

Then, the insulating film 22 is formed on the upper surface of the second semiconductor substrate 21, and the second semiconductor substrate 21 is turned upside down and laminated to the first semiconductor substrate 11 (FIG. 10A). As a result, the first semiconductor substrate 11 and the second semiconductor substrate 21 are laminated to each other via the first interlayer insulating film 14, the second interlayer insulating film 16, the third interlayer insulating film 18, the insulating film 22, and the like. The insulating film 22 is formed by, for example, using plasma CVD to deposit the insulating film 22 on the second semiconductor substrate 21. The second semiconductor substrate 21 is laminated to the first semiconductor substrate 11 by, for example, plasma bonding.

Figure 10B:
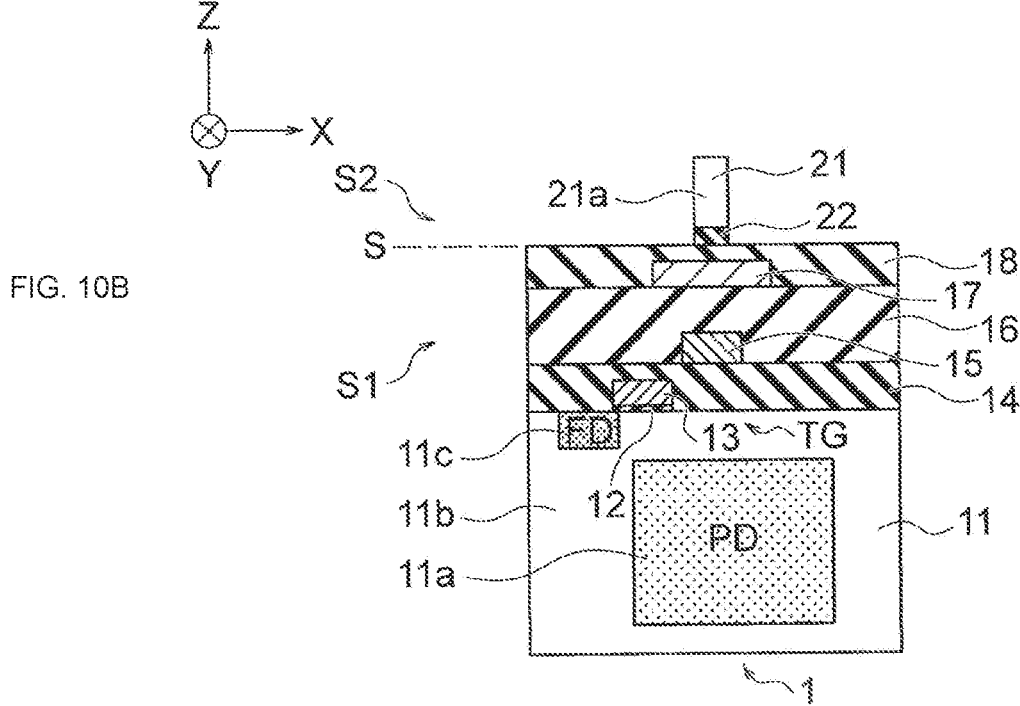

Then, the second semiconductor substrate 21 and the insulating film 22 are processed by photolithography and dry etching (FIG. 10B). As a result, a part of the second semiconductor substrate 21 is processed into the semiconductor layer 21a. Further, the insulating film 22 is processed in such a manner that the insulating film 22 remains on the lower surface of the semiconductor layer 21a.

Figure 11A:
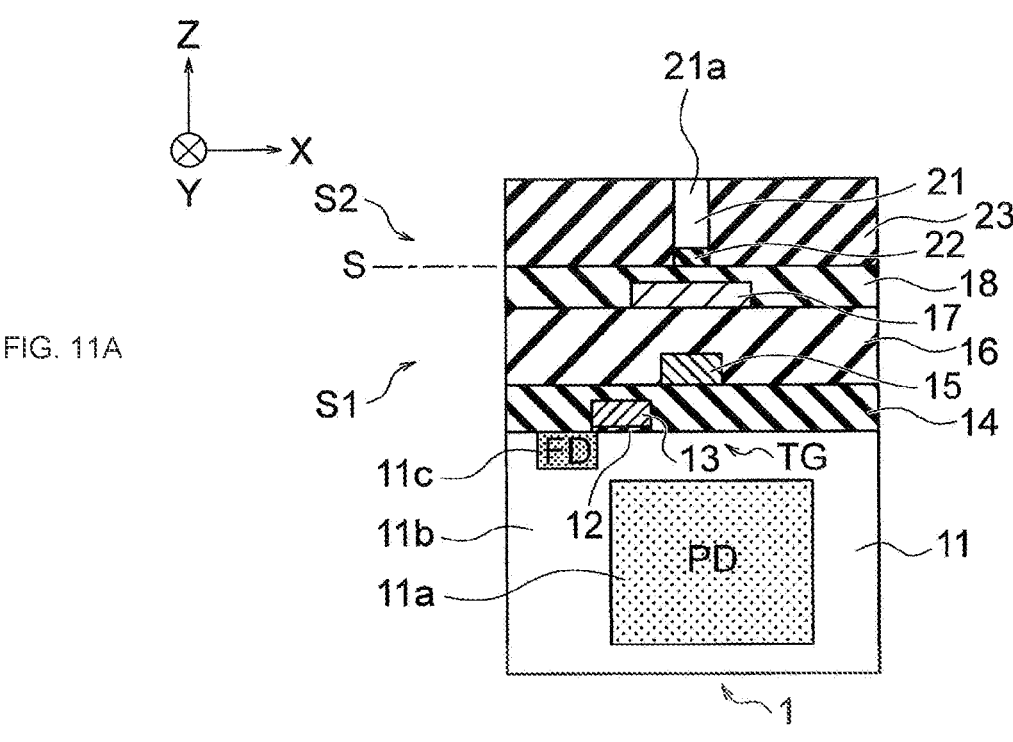
FIGS. 11A and 11B depict cross-sectional views (4/6) illustrating the method for manufacturing the solid-state imaging apparatus according to the first embodiment.

Then, the fourth interlayer insulating film 23 is formed on the third interlayer insulating film 18 (FIG. 11A). The fourth interlayer insulating film 23 is formed by, for example, using plasma CVD to deposit the fourth interlayer insulating film 23 on the third interlayer insulating film 18 via the second semiconductor substrate 21 and the insulating film 22, and using CMP to flatten the surface of the fourth interlayer insulating film 23. The CMP is performed until the upper surface of the second semiconductor substrate 21 is exposed from the upper surface of the fourth interlayer insulating film 23.

Figure 11B:
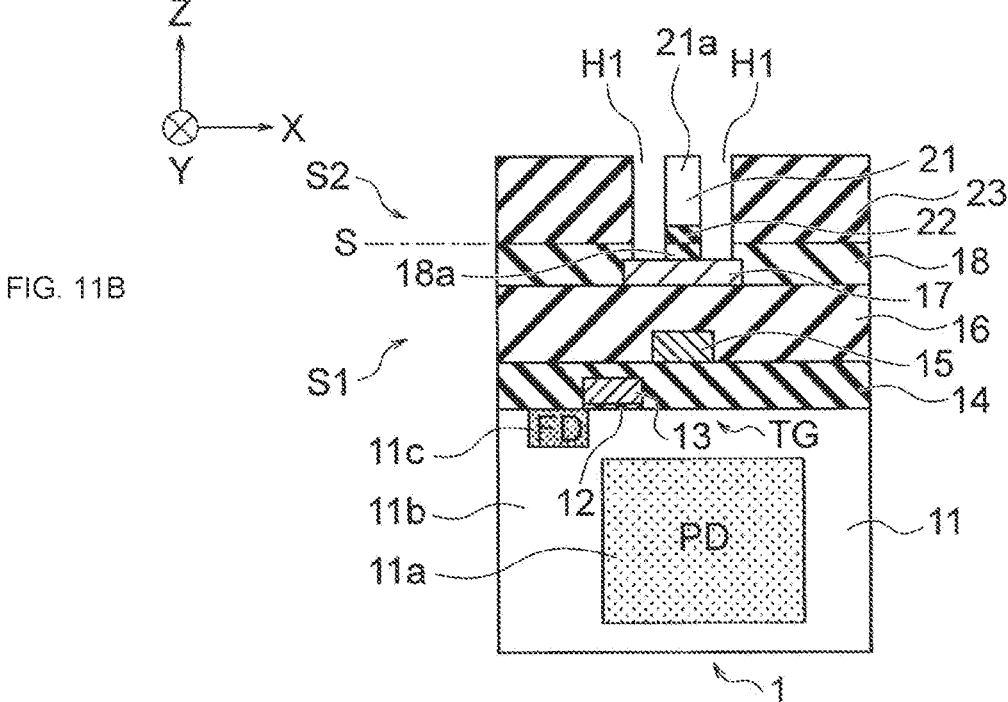

Then, photolithography and dry etching are used to form an opening H1 in the fourth interlayer insulating film 23 and the third interlayer insulating film 18 (FIG. 11B). The opening H1 is formed on the electrode 17 adjacent to the semiconductor layer 21a, and the upper surface of the electrode 17 and the side surfaces of the semiconductor layer 21a are exposed in the opening H1. The opening H1 is formed in a region in which the insulating film 24 and the electrode 25 are intended to be formed. As a result, the third interlayer insulating film 18 below the insulating film 22 is processed into the insulating film 18a.

Figure 12A:
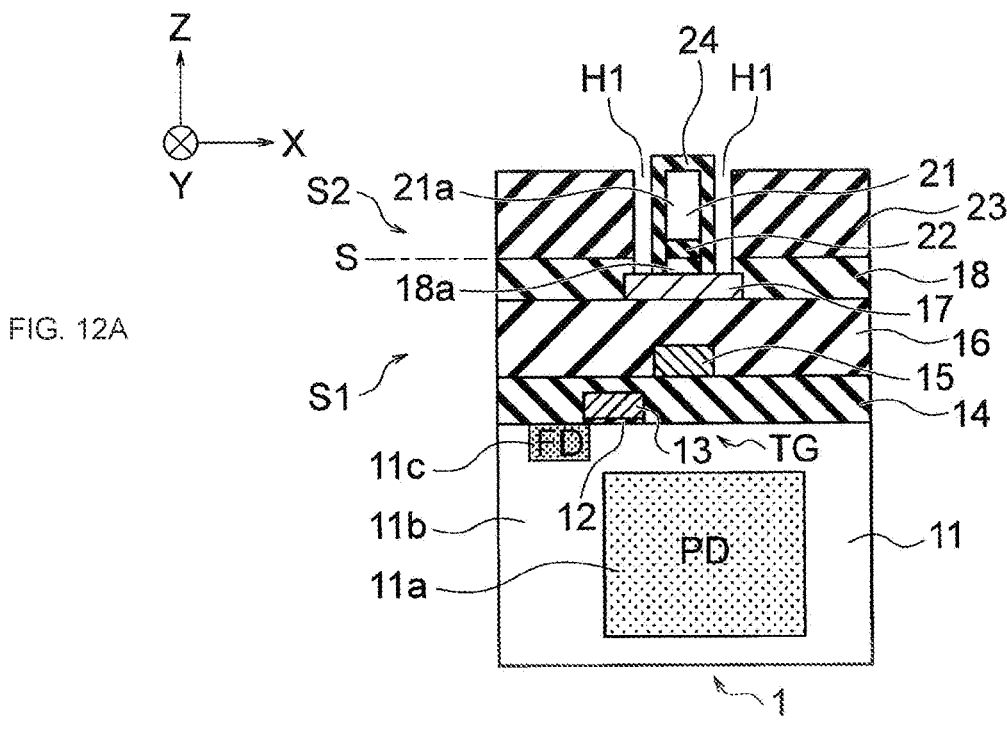
FIGS. 12A and 12B depict cross-sectional views (5/6) illustrating the method for manufacturing the solid-state imaging apparatus according to the first embodiment.

Then, the insulating film 24 is formed by thermal oxidation (FIG. 12A). The insulating film 24 is formed inside and outside the opening H1, and is specifically formed on the upper surface of the semiconductor layer 21a and on the side surfaces of the semiconductor layer 21a, the insulating film 22, and the insulating film 18a. In the present embodiment, the thickness of the insulating film 24 is set smaller than the total of the thicknesses of the insulating film 22 and the insulating film 18a. Thus, the above-described conditions "T1>T2, T1>T3" and "T1≥2×T2, T1≥2×T3" can be realized (see FIG. 5).

Figure 12B:
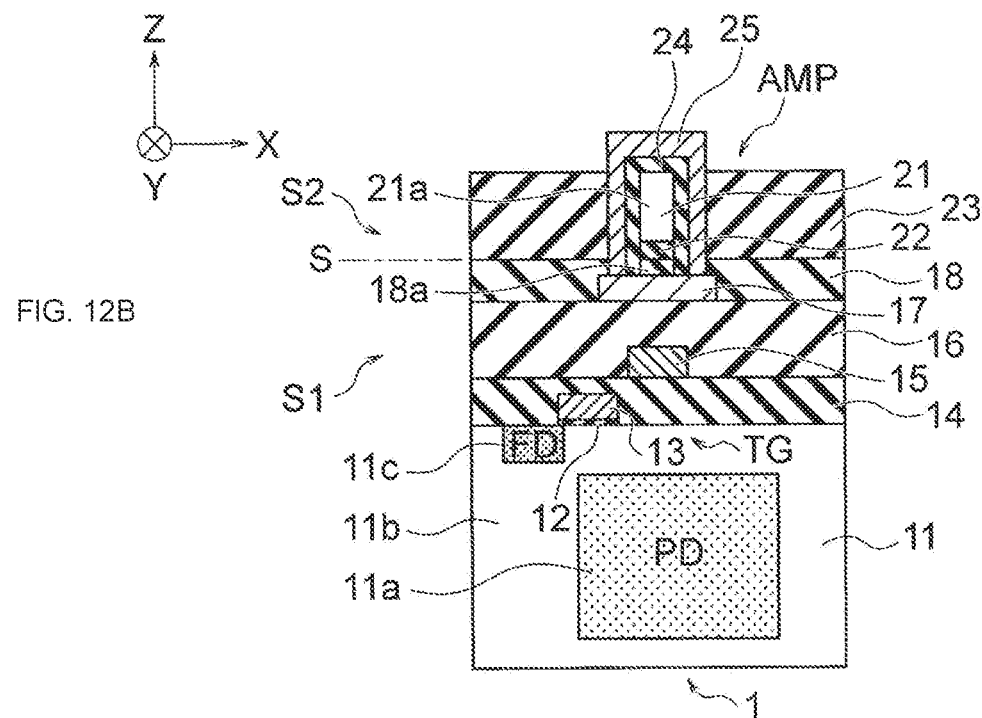

Then, thermal CVD is used to form the electrode 25 (FIG. 12B). The electrode 25 is formed inside and outside the opening H1, and is specifically formed on the upper surface of the insulating film 24, the side surfaces of the insulating film 24, and the upper surface of the electrode 17. As a result, the amplifying transistor AMP is formed including the columnar semiconductor layer 41, the tubular insulating film 42, and the tubular electrode 43.

Figure 13A:
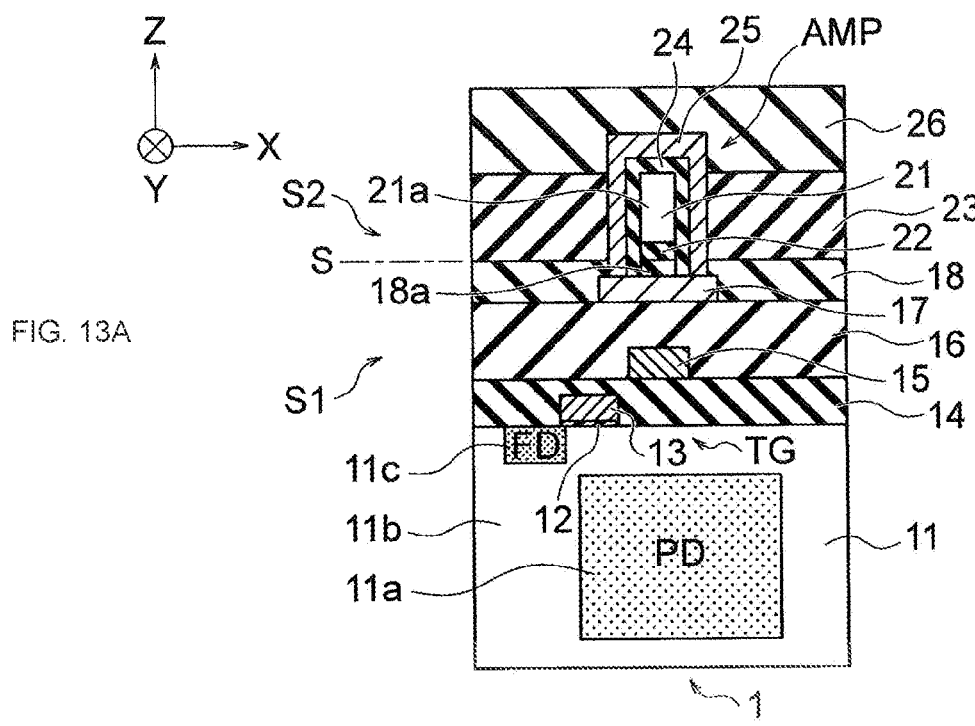
FIGS. 13A and 13B depict cross-sectional views (6/6) illustrating the method for manufacturing the solid-state imaging apparatus according to the first embodiment.

Then, on the fourth interlayer insulating film 23, the fifth interlayer insulating film 26 is formed to cover the amplifying transistor AMP (FIG. 13A). The fifth interlayer insulating film 26 is formed by, for example, using plasma CVD to deposit the fifth interlayer insulating film 26 on the fourth interlayer insulating film 23, and using CMP to flatten the surface of the fifth interlayer insulating film 26.

Figure 13B:
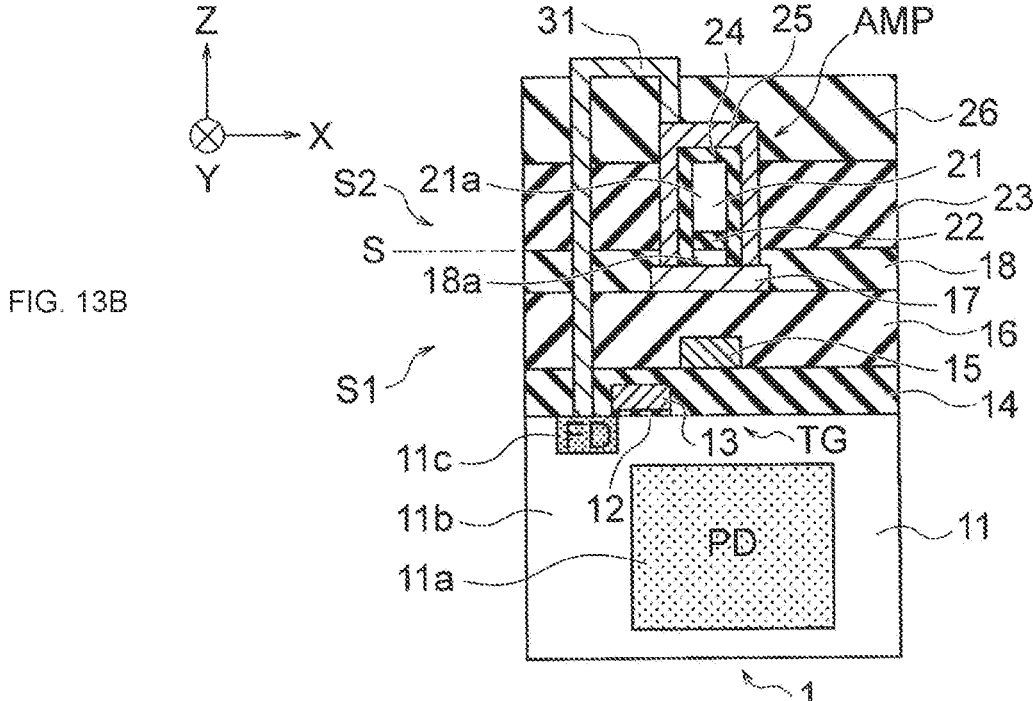

Then, a first opening is formed in the fifth interlayer insulating film 26, a second opening is formed in the first interlayer insulating film 14, the second interlayer insulating film 16, the third interlayer insulating film 18, the fourth interlayer insulating film 23, and the fifth interlayer insulating film 26, and the wire 31 is formed in the first and second openings and on the fifth interlayer insulating film 26 (FIG. 13B). The first opening is formed in the upper surface of the electrode 25. The second opening is formed in the upper surface of the floating diffusion section FD. As a result, the electrode 25 and the floating diffusion section FD are electrically connected by the wire 31. The first and second openings are formed by photolithography and dry etching.

Subsequently, a color filter and an on-chip lens, not illustrated, are formed on the lower surface of the first semiconductor substrate 11. In this manner, the solid-state imaging apparatus according to the present embodiment is manufactured.

First Variation of First Embodiment

Figure 14:
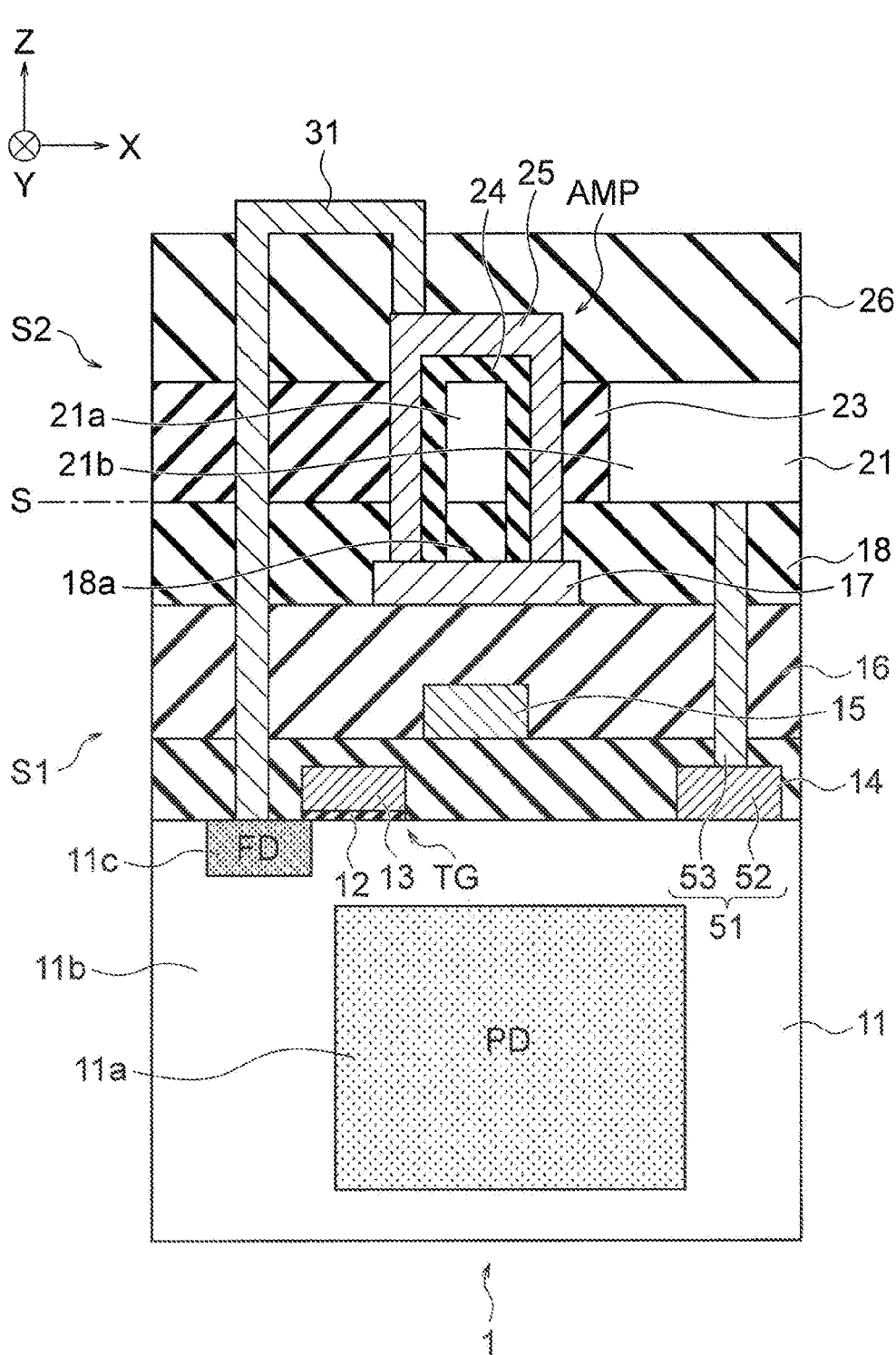
FIG. 14 is a cross-sectional view depicting a structure of a solid-state imaging apparatus according to a first variation of the first embodiment.

FIG. 14 is a cross-sectional view depicting a structure of a solid-state imaging apparatus according to a first variation of the first embodiment.

The solid-state imaging apparatus according to the present variation includes a wire 51 in addition to the components of the solid-state imaging apparatus according to the first embodiment. The wire 51 includes a contact electrode 52 and a vertical wire 53. The solid-state imaging apparatus according to the present variation further includes a semiconductor layer 21b that is a part of the second semiconductor substrate 21. Meanwhile, the solid-state imaging apparatus of the present variation does not include the insulating film 22.

The wire 51 is formed in the first interlayer insulating film 14, the second interlayer insulating film 16, and the third interlayer insulating film 18 to electrically connect the first semiconductor substrate 11 and the semiconductor layer 21b. Specifically, the wire 51 includes the contact electrode 52 formed on the first semiconductor substrate 11 and the vertical wire 53 formed on the contact electrode 52, and the contact electrode 52 and the vertical wire 53 are respectively provided on the upper surface of the first semiconductor substrate 11 and the lower surface of the semiconductor layer 21b. The contact electrode 52 is, for example, a polysilicon electrode. The vertical wire 53 is, for example, a polysilicon wire. The wire 51 is an example of a second wire according to the present disclosure.

The second semiconductor substrate 21 includes the semiconductor layer 21a and the semiconductor layer 21b. The solid-state imaging apparatus according to the present variation does not include the insulating film 22, and thus the semiconductor layer 21*a* is formed directly on the insulating film 18*a*. The thickness of the insulating film 18*a* according to the present variation is larger than the thickness of the insulating film 24. Accordingly, even though the solid-state imaging apparatus according to the present variation does not include the insulating film 22, the above-described conditions "T1>T2, T1>T3" and "T1≥2×T2, T1≥2×T3" are also realized in the present variation (see FIG. 5). On the other hand, the semiconductor layer 21*b* is formed on the third interlayer insulating film 18 and the wire 51 and is electrically connected to the wire 51. The semiconductor layer 21*b* according to the present variation is separated from the semiconductor layer 21*a*. The semiconductor layer 21*b* is an example of a second semiconductor layer according to the present disclosure.

The semiconductor layer 21*b* forms, for example, a certain device. Examples of such a device include a capacitor and a resistor. In such a device, a floating potential of the semiconductor layer 21*b* is not desirable in some cases. According to the present variation, by electrically connecting the semiconductor layer 21*b* to the first semiconductor substrate 11 by the wire 51, a floating potential of the semiconductor layer 21*b* can be avoided.

Figure 15:
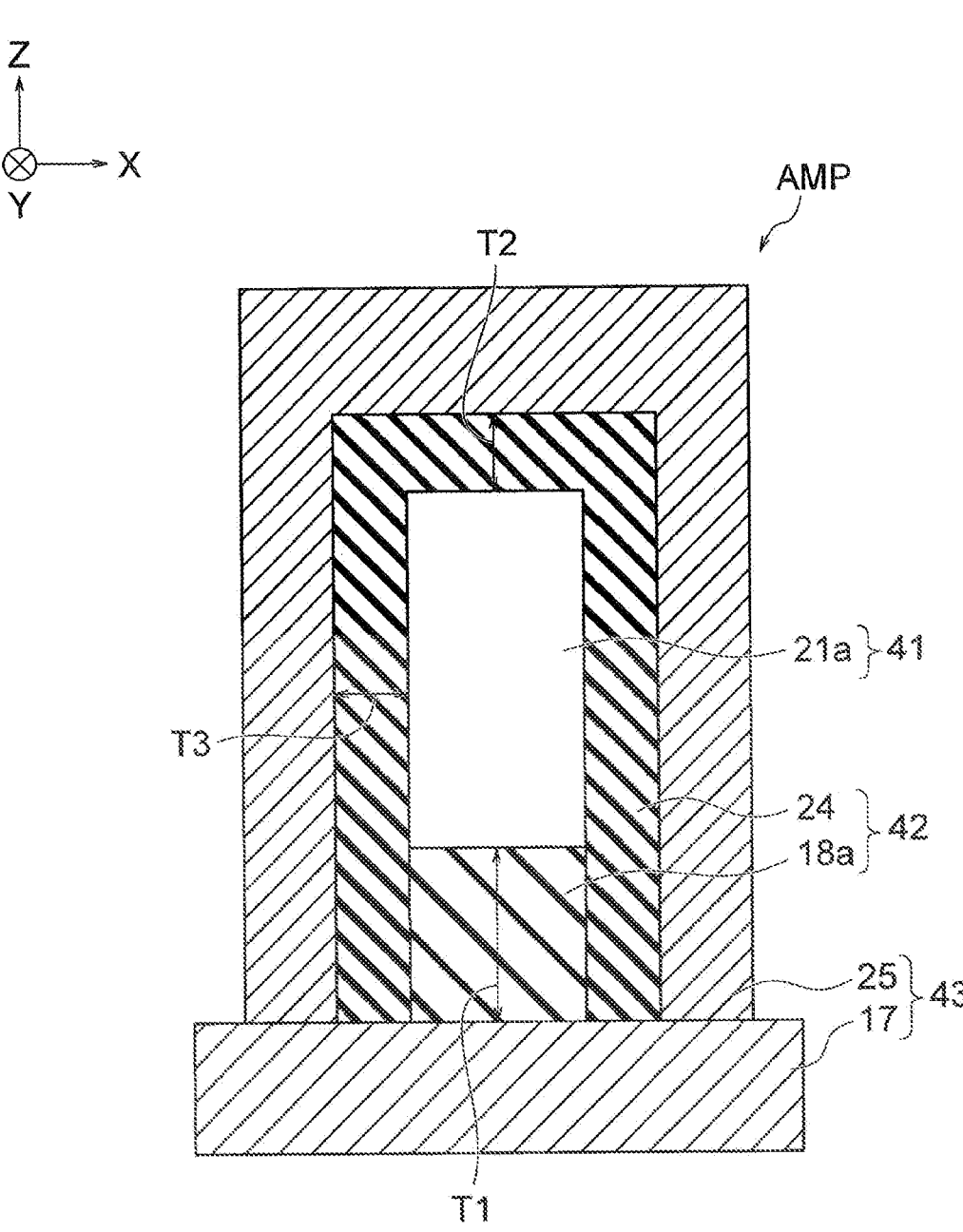
FIG. 15 is a cross-sectional view depicting a structure of an amplifying transistor according to the first variation described above.

FIG. 15 is a cross-sectional view depicting the structure of the amplifying transistor AMP according to the present variation.

Like the amplifying transistor AMP according to the first embodiment, the amplifying transistor AMP according to the present variation includes the columnar semiconductor layer 41 having a columnar shape extending in the Y direction, the tubular insulating film 42 having a tubular shape extending in the Y direction, and the tubular electrode 43 having a tubular shape extending in the Y direction. However, the tubular insulating film 42 according to the first embodiment includes the insulating films 18*a*, 22, and 24, whereas the tubular insulating film 42 according to the present variation includes the insulating films 18*a* and 24.

FIG. 15 depicts the thickness T1 of the tubular insulating film 42 on the lower surface of the columnar semiconductor layer 41, the thickness T2 of the tubular insulating film 42 on the upper surface of the columnar semiconductor layer 41, and the thickness T3 of the tubular insulating film 42 on the side surfaces of the columnar semiconductor layer 41. As is the case with the first embodiment, the thickness T1 according to the present variation is larger than each of the thickness T2 and the thickness T3 (T1>T2, T1>T3) and is, for example, twice each of the thicknesses T2 and T3 (T1≥2×T2, T1≥2×T3). Thus, according to the present variation, the thick tubular insulating film 42 on the lower surface of the columnar semiconductor layer 41 can preferably protect the columnar semiconductor layer 41.

FIGS. 16A, 16B, 17A, 17B, 18A, and 18B are cross-sectional views illustrating the method for manufacturing the solid-state imaging apparatus according to the present variation.

First, in the first semiconductor substrate 11, ion injection is used to form the n-type region 11*a*, the p-type region 11*b*, and the n-type region 11*c* (FIG. 16A). As a result, the photodiode PD and the floating diffusion section FD are formed in the first semiconductor substrate 11.

Then, the gate insulating film 12 is formed on the first semiconductor substrate 11, the gate electrode 13 is formed on the gate insulating film 12, and the contact electrode 52 is formed on the first semiconductor substrate 11 (FIG. 16A). As a result, the transfer transistor TG is formed on the first semiconductor substrate 11. The gate electrode 13 and the contact electrode 52 may include, for example, the same polysilicon layer.

Then, the first interlayer insulating film 14 is formed on the first semiconductor substrate 11 via the gate insulating film 12, the gate electrode 13, and the contact electrode 52 (FIG. 16B). Then, the wire 15 is formed on the first interlayer insulating film 14, and the second interlayer insulating film 16 is formed on the first interlayer insulating film 14 via the wire 15 (B of FIG. 16B). Then, the electrode 17 is formed on the second interlayer insulating film 16, and the third interlayer insulating film 18 is formed on the second interlayer insulating film 16 via the electrode 17 (B of FIG. 16B).

Figures 17A, 17B:
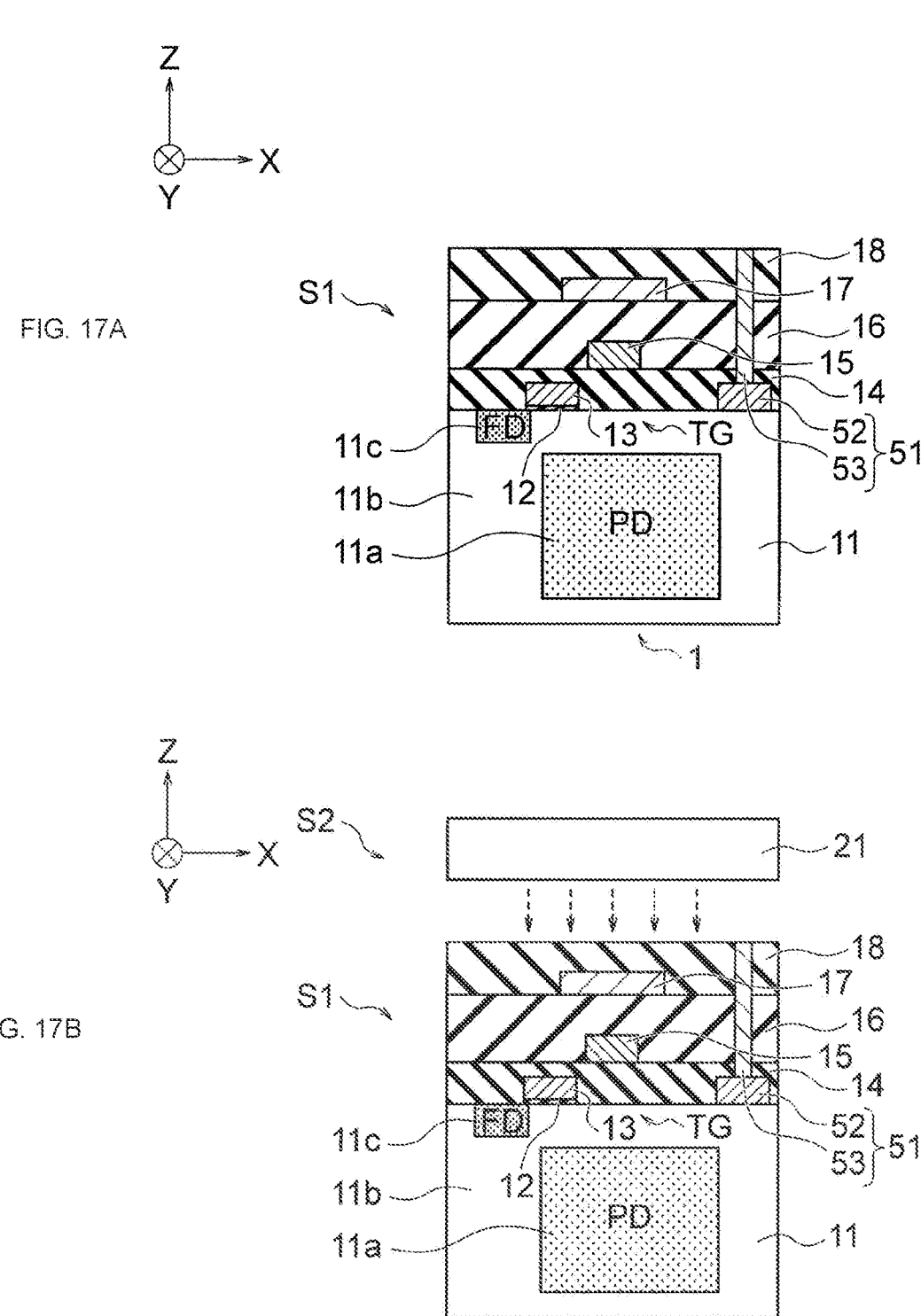
FIGS. 17A and 17B depict cross-sectional views (2/3) illustrating the method for manufacturing the solid-state imaging apparatus according to the first variation described above.

Then, an opening is formed in the first interlayer insulating film 14, the second interlayer insulating film 16, and the third interlayer insulating film 18, and the vertical wire 53 is formed in the opening (FIG. 17A). The opening is formed in the upper surface of the contact electrode 52, and thus the vertical wire 53 is formed on the contact electrode 52. The opening is formed by photolithography and dry etching. The vertical wire 53 is formed by, for example, using thermal CVD to deposit a polysilicon layer in the opening and the like and using CMP to remove the polysilicon layer outside the opening. In this manner, the wire 51 is formed on the first semiconductor substrate 11.

Then, the second semiconductor substrate 21 is laminated to the first semiconductor substrate 11 (FIG. 17B). As a result, the second semiconductor substrate 21 is disposed on the first semiconductor substrate 21 via the first interlayer insulating film 14, the second interlayer insulating film 16, the third interlayer insulating film 18, and the like. The second semiconductor substrate 21 is laminated to the first semiconductor substrate 11 by, for example, plasma bonding. The second semiconductor substrate 21 according to the present variation is electrically connected to the wire 51.

Figure 18A:
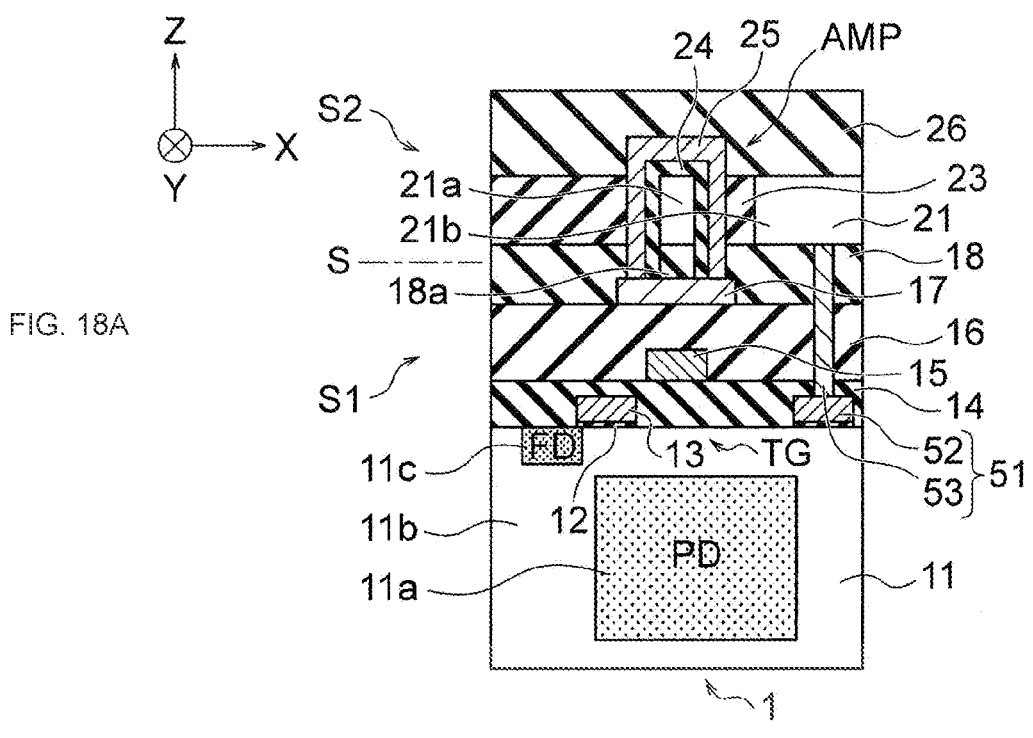
FIGS. 18A and 18B depict cross-sectional views (3/3) illustrating the method for manufacturing the solid-state imaging apparatus according to the first variation described above.
Figure 18B:
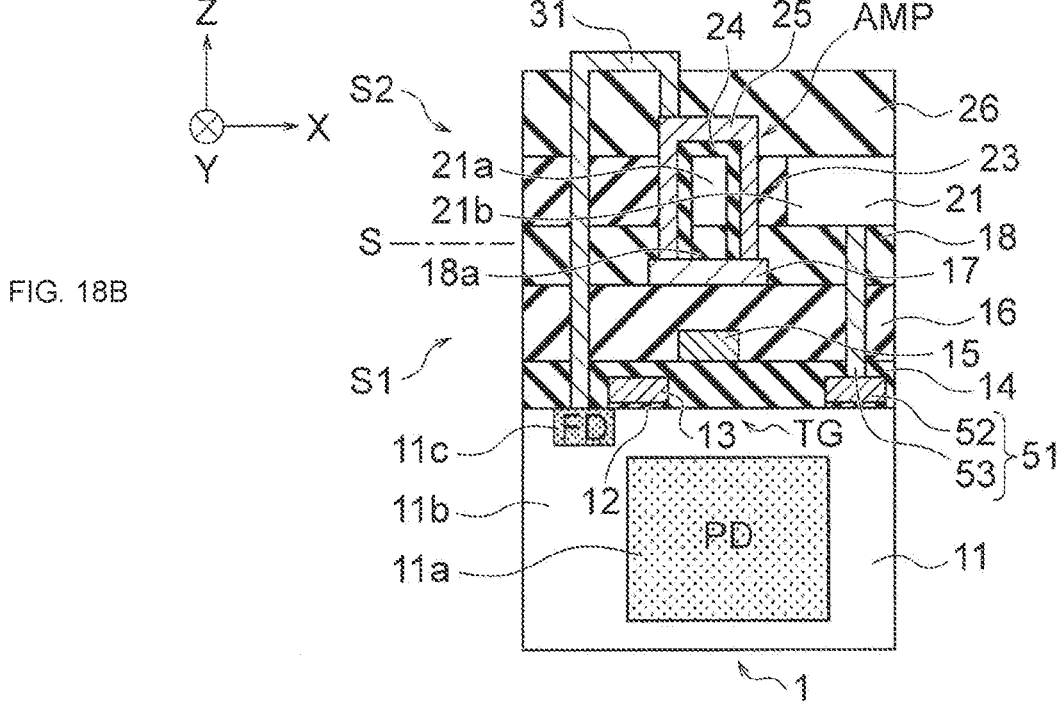

Then, the second semiconductor substrate 21 is processed by photolithography and dry etching (FIG. 18A). As a result, a part of the second semiconductor substrate 21 is processed into the semiconductor layer 21*a*, and another part of the second semiconductor substrate 21 is processed into the semiconductor layer 21*b*. The semiconductor layer 21*b* is formed on the wire 51.

Then, the fourth interlayer insulating film 23 is formed on the third interlayer insulating film 18, and an opening is formed in the fourth interlayer insulating film 23 and the third interlayer insulating film 18. The insulating film 24 and the electrode 25 are formed in the opening, and the fifth interlayer insulating film 26 is formed on the fourth interlayer insulating film 23 (FIG. 18A). This process is executed in a manner similar to that of the process depicted in A of FIGS. 11A, 11B. 12A, 12B, and 13A. Hence, the opening formed in this process is formed in a manner similar to that of the opening H1 depicted in FIG. 11B. As a result, in this process, the insulating film 18*a* and the amplifying transistor AMP are formed. In the present variation, the thickness of the insulating film 24 is set smaller than the thickness of the insulating film 18*a*. Thus, the above-described conditions "T1>T2, T1>T3" and "T1≥2×T2, T1≥2×T3" can also be realized (see FIG. 15).

Then, a first opening is formed in the fifth interlayer insulating film 26, a second opening is formed in the first interlayer insulating film 14, the second interlayer insulating film 16, the third interlayer insulating film 18, the fourth interlayer insulating film 23, and the fifth interlayer insulating film 26, and the wire 31 is formed in the first and second openings and on the fifth interlayer insulating film (FIG.

18B). The first opening is formed in the upper surface of the electrode 25. The second opening is formed in the upper surface of the floating diffusion section FD. As a result, the electrode 25 and the floating diffusion section FD are electrically connected by the wire 31. In this manner, the solid-state imaging apparatus according to the present variation is manufactured.

Second Variation of First Embodiment

Figure 19:
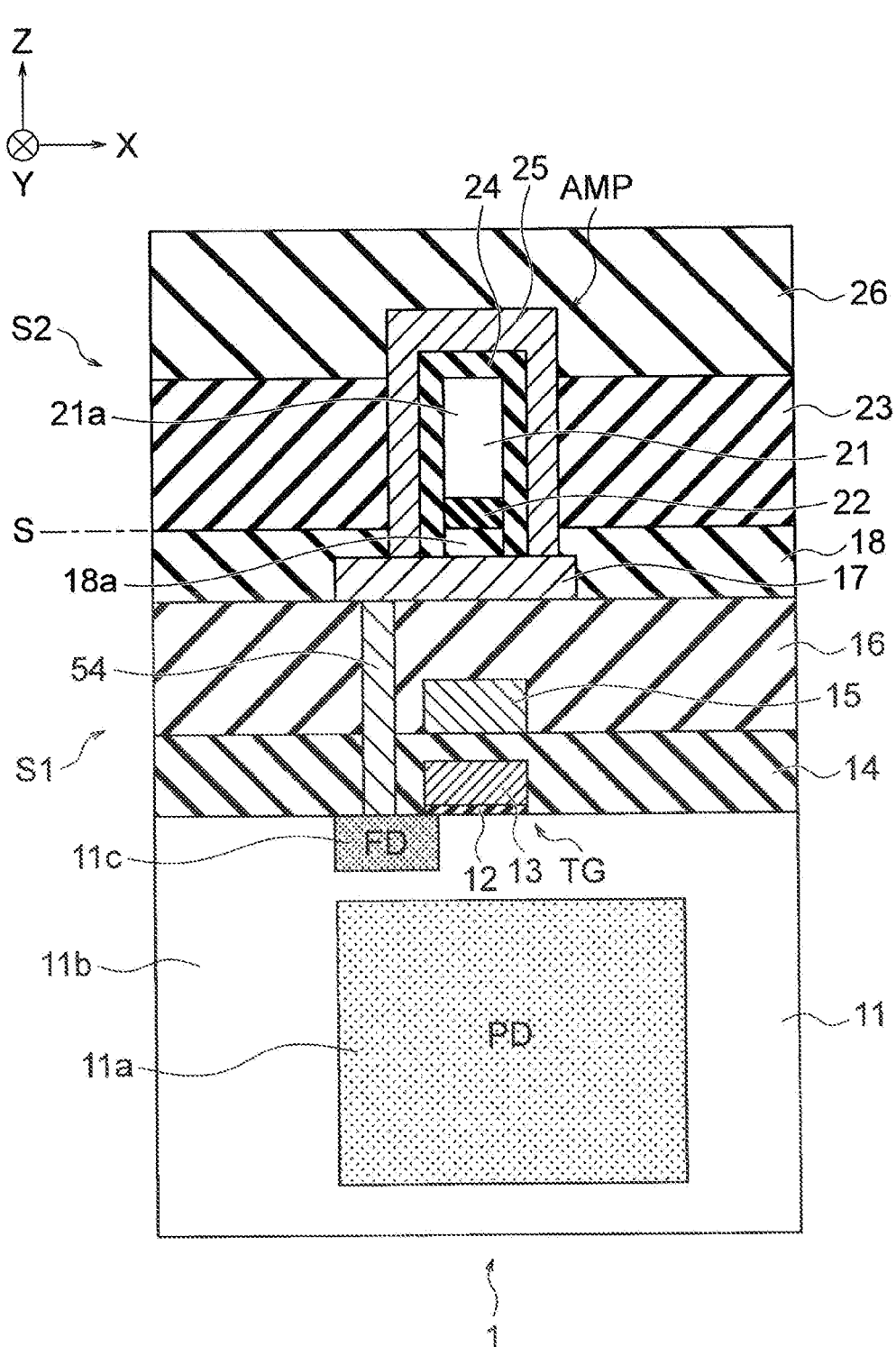
FIG. 19 is a cross-sectional view depicting a structure of a solid-state imaging apparatus according to a second variation of the first embodiment.

FIG. 19 is a cross-sectional view depicting a structure of a solid-state imaging apparatus according to a second variation of the first embodiment.

The solid-state imaging apparatus according to the present variation includes a wire 54 in addition to the components of the solid-state imaging apparatus according to the first embodiment. Meanwhile, the solid-state imaging apparatus according to the present variation does not include the wire 31.

The wire 54 is formed in the first interlayer insulating film 14 and the second interlayer insulating film 16 to electrically connect the floating diffusion section FD and the electrode 17. One end of the wire 54 is provided on the upper surface of the floating diffusion section FD, and the other end of the wire 54 is provided on the lower surface of the electrode 17. The wire 54 is, for example, a metal wire or a semiconductor wire. The wire 54 is an example of a third wire according to the present disclosure.

According to the present variation, using the wire 54 instead of the wire 31 allows the floating diffusion section FD and the tubular electrode 43 to electrically be connected by the wire 54 that is short. This enables a reduction in interwire capacity according to the present variation.

FIGS. 20A, 20B, 21A, and 21B are cross-sectional views illustrating a method for manufacturing the solid-state imaging apparatus according to the present variation.

First, in the first semiconductor substrate 11, ion injection is used to form the n-type region 11*a*, the p-type region 11*b*, and the n-type region 11*c* (FIG. 20A).

As a result, the photodiode PD and the floating diffusion section FD are formed in the first semiconductor substrate 11.

Then, the gate insulating film 12 is formed on the first semiconductor substrate 11, and the gate electrode 13 is formed on the gate insulating film 12 (FIG. 20A). As a result, the transfer transistor TG is formed on the first semiconductor substrate 11.

Then, the first interlayer insulating film 14 is formed on the first semiconductor substrate 11 via the gate insulating film 12 and the gate electrode 13 (FIG. 20A). Then, the wire 15 is formed on the first interlayer insulating film 14, and the second interlayer insulating film 16 is formed on the first interlayer insulating film 14 via the wire 15 (A of FIG. 20A).

Then, an opening is formed in the first interlayer insulating film 14 and the second interlayer insulating film 16, and the wire 54 is formed in the opening (FIG. 20A). The opening is formed in the upper surface of the floating diffusion section FD, and thus the wire 54 is formed on the floating diffusion section FD. The opening is formed by photolithography and dry etching.

Then, the electrode 17 is formed on the second interlayer insulating film 16, and the third interlayer insulating film 18 is formed on the second interlayer insulating film 16 via the electrode 17 (FIG. 20B). The electrode 17 according to the present variation is formed on the wire 54.

Figure 21A:
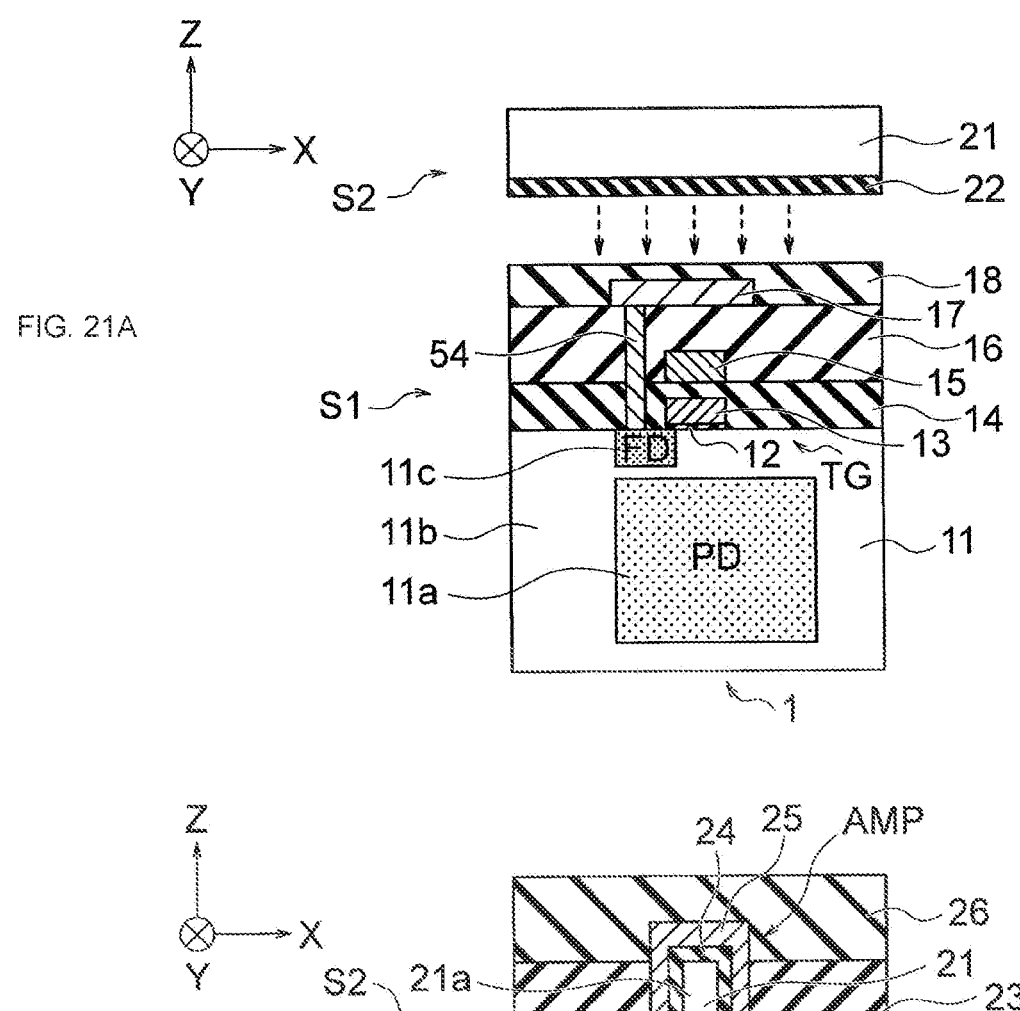
FIGS. 21A and 21B depict cross-sectional views (2/2) illustrating the method for manufacturing the solid-state imaging apparatus according to the second variation described above.

Then, the insulating film 22 is formed on the upper surface of the second semiconductor substrate 21, and the second semiconductor substrate 21 is turned upside down and laminated to the first semiconductor substrate 11 (FIG. 21A). As a result, the first semiconductor substrate 11 and the second semiconductor substrate 21 are laminated to each other via the first interlayer insulating film 14, the second interlayer insulating film 16, the third interlayer insulating film 18, the insulating film 22, and the like.

Figure 21B:
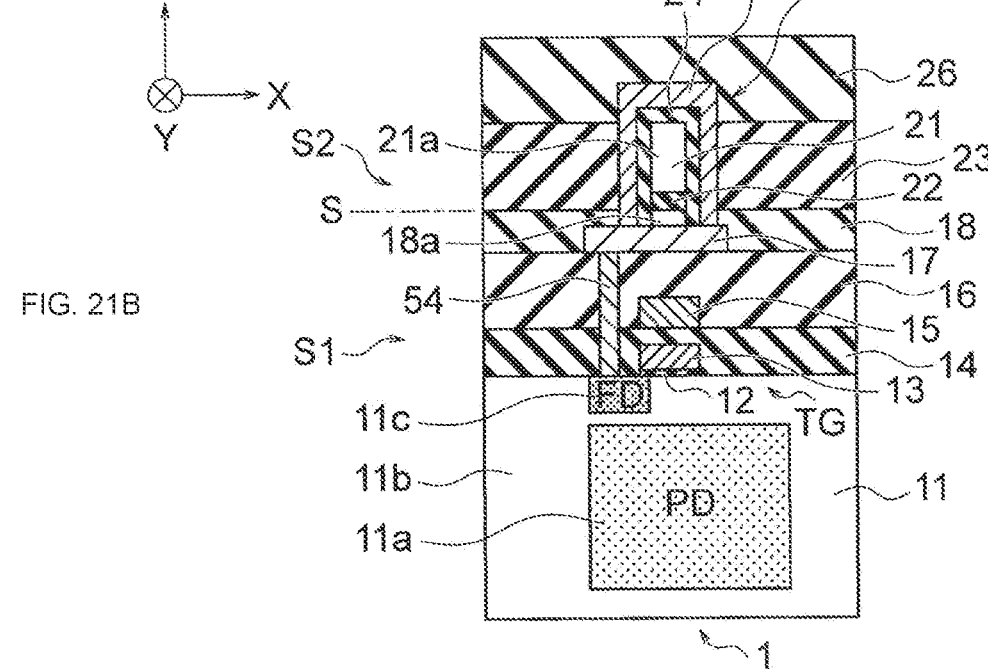

Then, the second semiconductor substrate 21 and the insulating film 22 are processed by photolithography and dry etching (FIG. 21B). As a result, a part of the second semiconductor substrate 21 is processed into the semiconductor layer 21*a*. Further, the insulating film 22 is processed in such a manner that the insulating film 22 remains on the lower surface of the semiconductor layer 21*a*.

Then, the fourth interlayer insulating film 23 is formed on the third interlayer insulating film 18, an opening is formed in the fourth interlayer insulating film 23 and the third interlayer insulating film 18, the insulating film 24 and the electrode 25 are formed in the opening, and the fifth interlayer insulating film 26 is formed on the fourth interlayer insulating film 23 (FIG. 21B). This process is executed in a manner similar to that of the process depicted in FIGS. 11A, 11B, 12A, 12B, and 13A. Hence, the opening formed in this process is formed in a manner similar to that of the opening H1 depicted in FIG. 11B. As a result, in this process, the insulating film 18*a* and the amplifying transistor AMP are formed. In the present variation, the thickness of the insulating film 24 is set smaller than the total of the thicknesses of the insulating film 22 and the insulating film 18*a*. Thus, the above-described conditions "T1>T2, T1>T3" and "T1≥2×T2, T1≥2×T3" can be realized (see FIG. 5). In this manner, the solid-state imaging apparatus according to the present variation is manufactured.

Third Variation of First Embodiment

Figure 22:
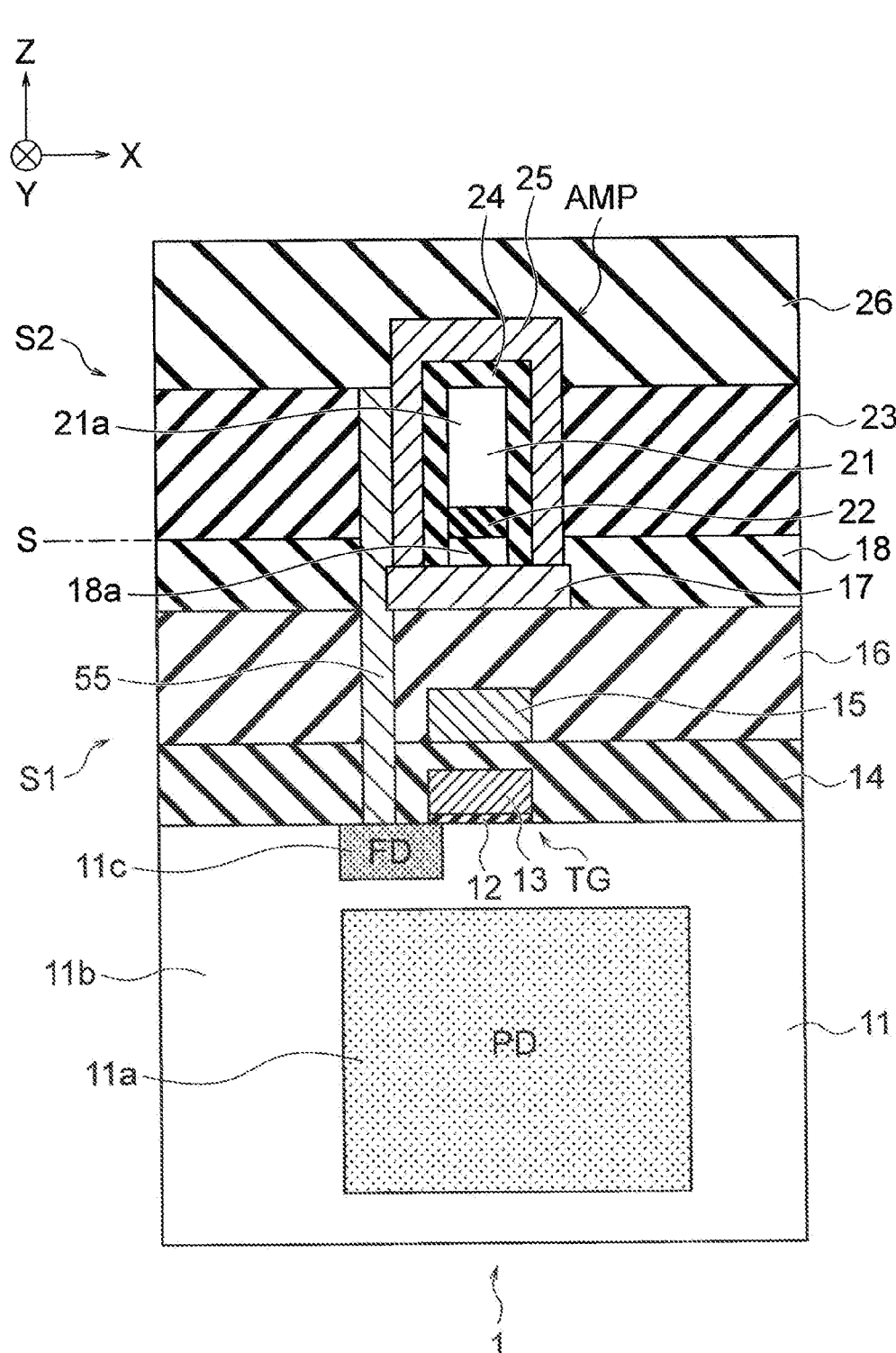
FIG. 22 is a cross-sectional view depicting a structure of a solid-state imaging apparatus according to a third variation of the first embodiment.

FIG. 22 is a cross-sectional view depicting a structure of a solid-state imaging apparatus according to a third variation of the first embodiment.

The solid-state imaging apparatus according to the present variation includes a wire 55 in addition to the components of the solid-state imaging apparatus according to the first embodiment. Meanwhile, the solid-state imaging apparatus according to the present variation does not include the wire 31.

The wire 55 is formed in the first interlayer insulating film 14, the second interlayer insulating film 16, the third interlayer insulating film 18, and the fourth interlayer insulating film 23 to electrically connect the floating diffusion section FD and the electrode 17. One end of the wire 55 is provided on the upper surface of the floating diffusion section FD, and the other end of the wire 55 is provided on the side surfaces of the electrodes 17 and 25. The wire 55 is, for example, a metal wire or a semiconductor wire. The wire 55 is an example of a fourth wire according to the present disclosure.

According to the present variation, using the wire 55 instead of the wire 31 allows the floating diffusion section FD and the tubular electrode 43 to electrically be connected by the wire 54 that is short. This enables a reduction in the interwire capacity according to the present variation.

FIGS. 23A, 23B, 24A, and 24B are cross-sectional views illustrating a method for manufacturing the solid-state imaging apparatus according to the present variation.

Figures 23A, 23B:
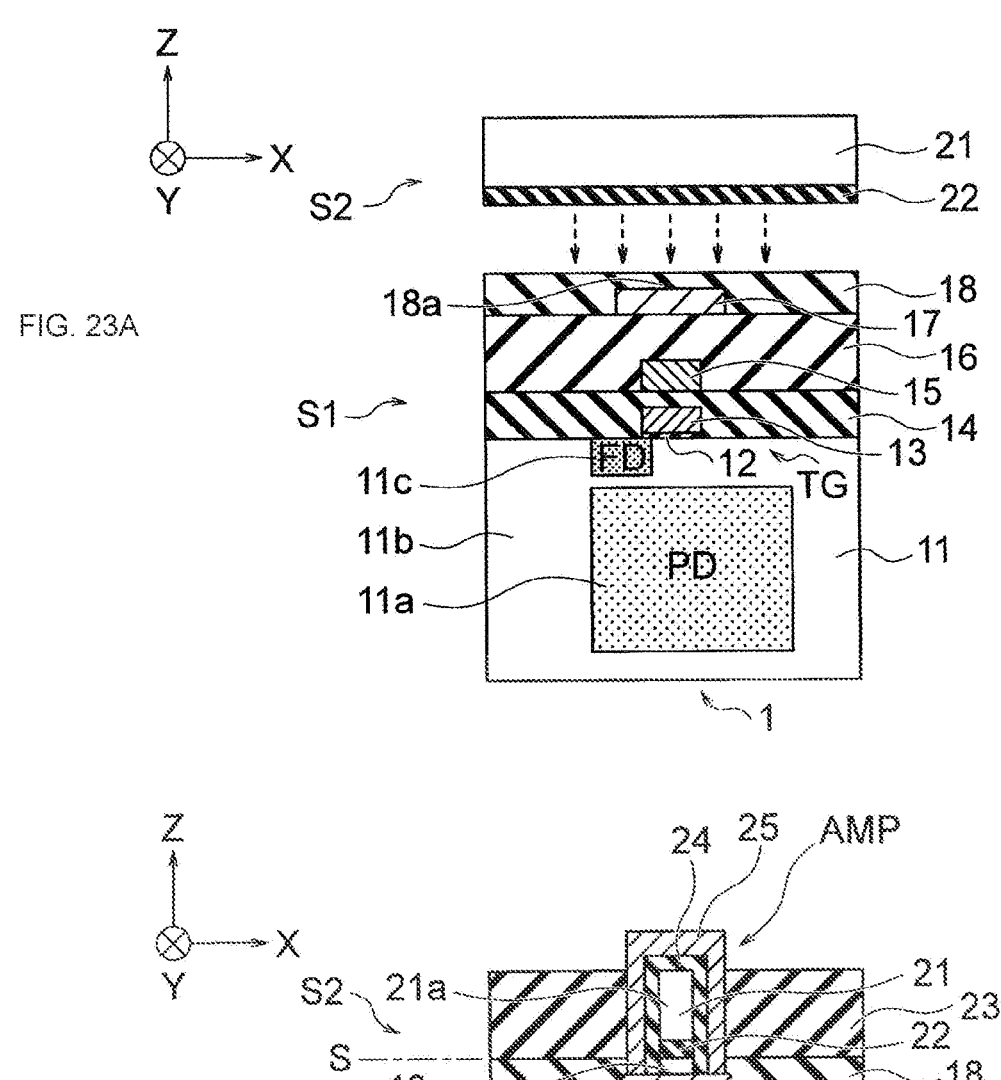
FIGS. 23A and 23B depict cross-sectional views (1/2) illustrating a method for manufacturing the solid-state imaging apparatus according to the third variation described above.

First, in the first semiconductor substrate 11, ion injection is used to form the n-type region 11*a*, the p-type region 11*b*, and the n-type region 11*c* (FIG. 23A). As a result, the photodiode PD and the floating diffusion section FD are formed in the first semiconductor substrate 11.

Then, the gate insulating film 12 is formed on the first semiconductor substrate 11, and the gate electrode 13 is formed on the gate insulating film 12 (FIG. 23A). As a result, the transfer transistor TG is formed on the first semiconductor substrate 11.

Then, the first interlayer insulating film 14 is formed on the first semiconductor substrate 11 via the gate insulating film 12 and the gate electrode 13 (FIG. 23A). Then, the wire 15 is formed on the first interlayer insulating film 14, and the second interlayer insulating film 16 is formed on the first interlayer insulating film 14 via the wire 15 (FIG. 23A). Then, the electrode 17 is formed on the second interlayer insulating film 16, and the third interlayer insulating film 18 is formed on the second interlayer insulating film 16 via the electrode 17 (FIG. 23A).

Then, the insulating film 22 is formed on the upper surface of the second semiconductor substrate 21, and the second semiconductor substrate 21 is turned upside down and laminated to the first semiconductor substrate 11 (FIG. 23A). As a result, the first semiconductor substrate 11 and the second semiconductor substrate 21 are laminated to each other via the first interlayer insulating film 14, the second interlayer insulating film 16, the third interlayer insulating film 18, the insulating film 22, and the like.

Then, the second semiconductor substrate 21 and the insulating film 22 are processed by photolithography and dry etching (FIG. 23B). As a result, a part of the second semiconductor substrate 21 is processed into the semiconductor layer 21*a*. Further, the insulating film 22 is processed in such a manner that the insulating film 22 remains on the lower surface of the semiconductor layer 21*a*.

Then, the fourth interlayer insulating film 23 is formed on the third interlayer insulating film 18, an opening is formed in the fourth interlayer insulating film 23 and the third interlayer insulating film 18, and the insulating film 24 and the electrode 25 are formed in the opening (FIG. 23B). This process is executed in a manner similar to that of the process depicted in A of FIGS. 11A, 11B, 12A, and 12B. Hence, the opening formed in this process is formed in a manner similar to that of the opening H1 depicted in FIG. 11B. As a result, in this process, the insulating film 18*a* and the amplifying transistor AMP are formed. In the present variation, the thickness of the insulating film 24 is set smaller than the total of the thicknesses of the insulating film 22 and the insulating film 18*a*. Thus, the above-described conditions "T1>T2, T1>T3" and "T1≥2×T2, T1≥2×T3" can be realized (see FIG. 5).

Figure 24A:
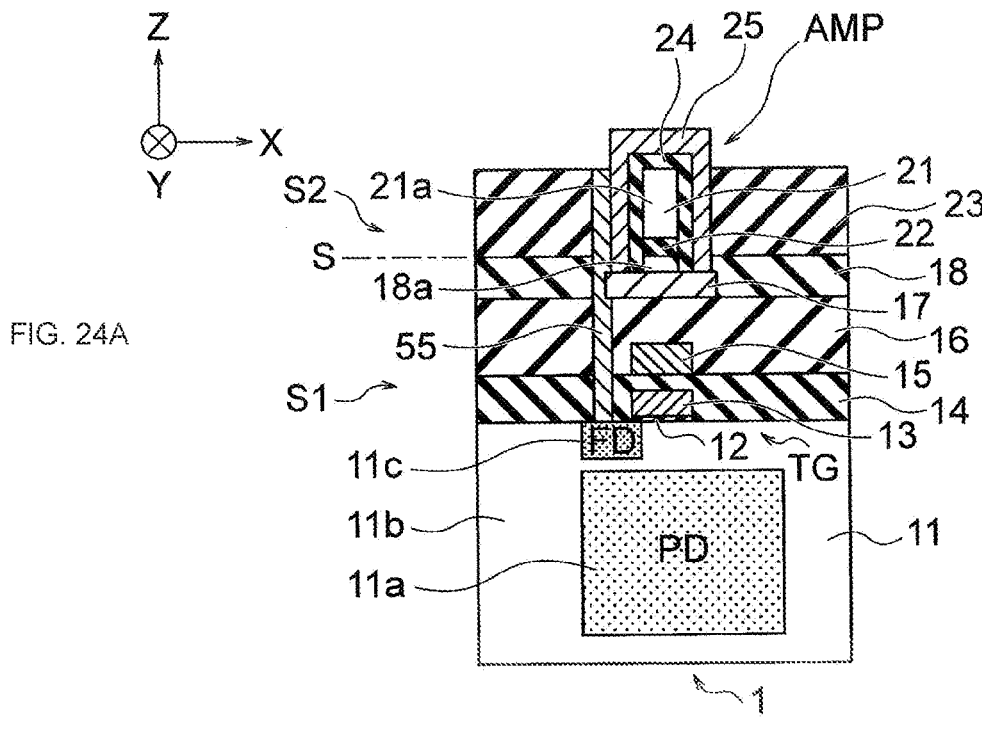
FIGS. 24A and 24B depict cross-sectional views (1/2) illustrating the method for manufacturing the solid-state imaging apparatus according to the third variation described above.

Then, an opening is formed in the first interlayer insulating film 14, the second interlayer insulating film 16, the third interlayer insulating film 18, and the fourth interlayer insulating film 23, and the wire 55 is formed in the opening (FIG. 24A). The opening is formed in the upper surface of the floating diffusion section FD, and thus the wire 55 is formed on the floating diffusion section FD. Additionally, the opening is formed in the side surfaces of the electrodes 17 and 25, and thus the wire 55 is formed on the side surfaces of the electrodes 17 and 25. The opening is formed by photolithography and dry etching.

Figure 24B:
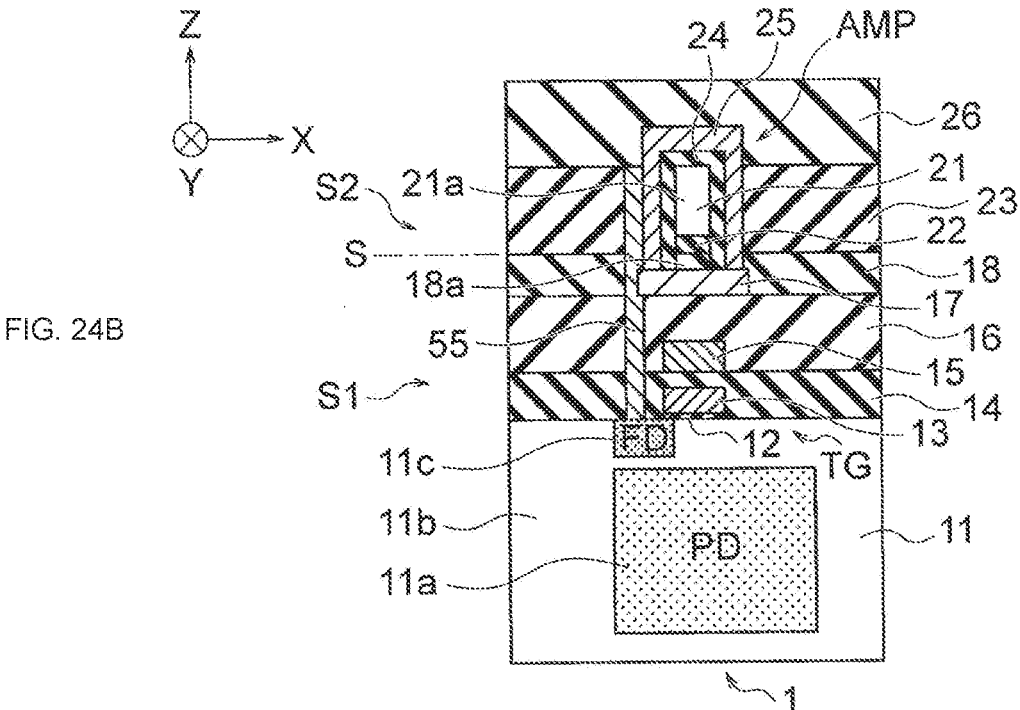

Then, the fifth interlayer insulating film 26 is formed on the fourth interlayer insulating film 23 (FIG. 24B). In this manner, the solid-state imaging apparatus according to the present variation is manufactured.

As described above, the tubular insulating film 42 according to the present embodiment and the variations thereof is formed in such a manner that the thickness T1 of the tubular insulating film 42 on the lower surface of the columnar semiconductor layer 41 is larger than each of the thicknesses T2 and T3 of the tubular insulating film 42 on the upper surface and the side surfaces of the columnar semiconductor layer 41. Thus, it is possible to realize the preferred amplifying transistor AMP in which, for example, the columnar semiconductor layer 41 can preferably be protected by the thick tubular insulating film 42 on the lower surface of the columnar semiconductor layer 41, or the like.

Note that the thickness T1 may be larger than only one of the thicknesses T2 and T3 instead of being larger than both the thicknesses T2 and T3. Additionally, the relation between the thicknesses T1 to T3 may be applied to a pixel transistor other than the amplifying transistor AMP.

Second Embodiment

Figure 25:
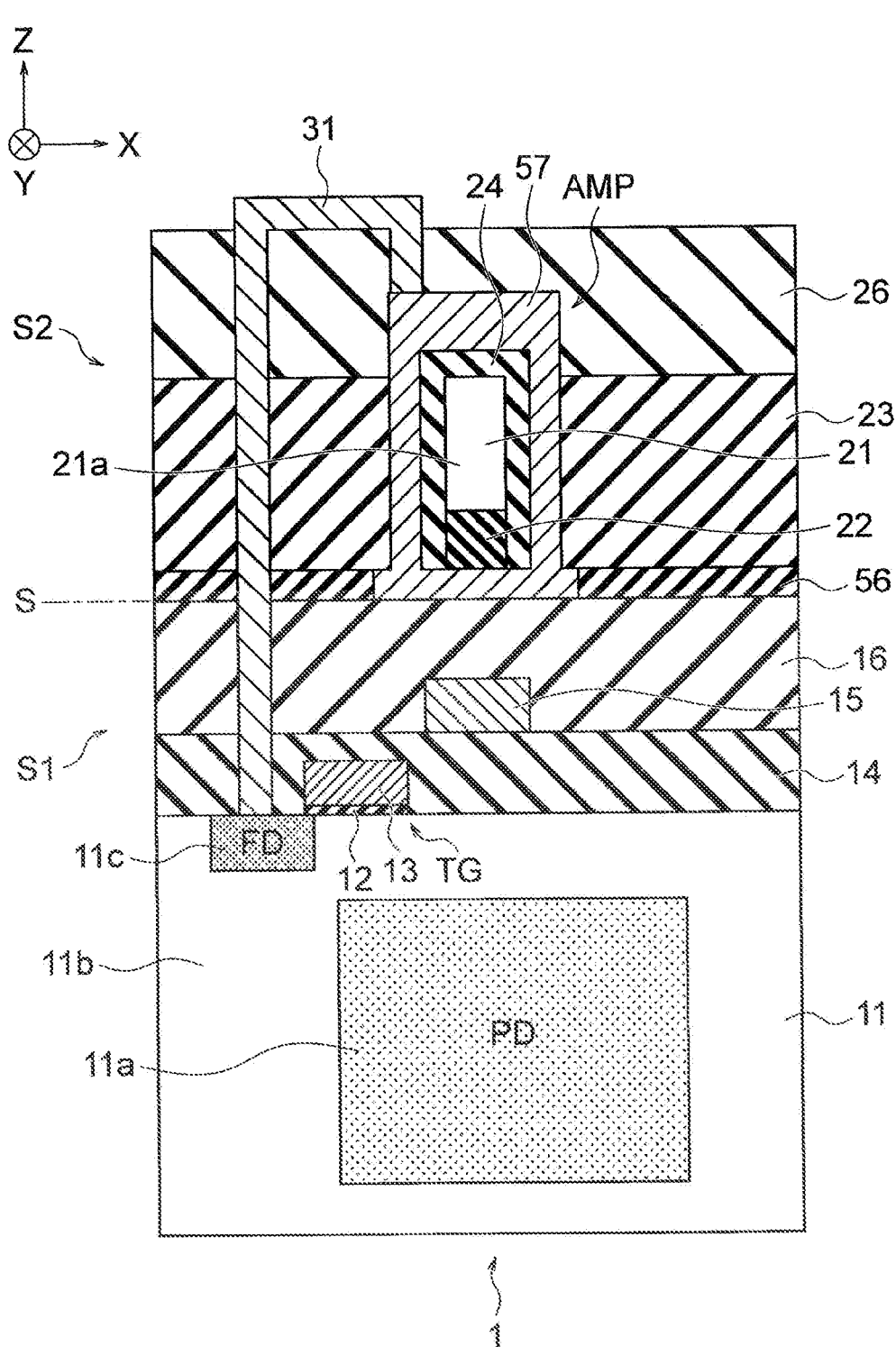
FIG. 25 is a cross-sectional view depicting a structure of a solid-state imaging apparatus according to a second embodiment.

FIG. 25 is a cross-sectional view depicting a structure of a solid-state imaging apparatus according to a second embodiment.

The solid-state imaging apparatus according to the present embodiment includes an insulating film 56 and an electrode 57 in addition to the components of the solid-state imaging apparatus according to the first embodiment. Meanwhile, the solid-state imaging apparatus according to the present embodiment does not include the electrode 17, the third interlayer insulating film 18, and the electrode 25.

The insulating film 56 is formed on the second interlayer insulating film 16 and interposed between the second interlayer insulating film 16 and the fourth interlayer insulating film 23. The insulating film 56 is, for example, a silicon nitride film. The insulating film 56 is an example of a second insulating film according to the present disclosure.

The electrode 57 is formed on the second interlayer insulating film 16 to form the amplifying transistor AMP according to the present embodiment. The electrode 57 is, for example, a polysilicon electrode. In the present embodiment, the insulating film 22 is provided on the lower surface of the semiconductor layer 21*a*, and the insulating film 24 is provided on the upper surface of the semiconductor layer 21*a* and the side surfaces of the semiconductor layer 21*a* and the insulating film 22. The insulating film 22 and the insulating film 24 form the amplifying transistor AMP according to the present embodiment together with the semiconductor layer 21*a* and the electrode 57. The electrode 57 is provided on the upper surface of the insulating film 24, the side surfaces of the insulating film 24, and the lower surfaces of the insulating film 22 and the insulating film 24. In the present embodiment, the wire 31 is provided on the floating diffusion layer FD and the electrode 57. The electrode 57 is an example of the first electrode according to the present disclosure.

The insulating film 56 according to the present embodiment has a thickness same as that of the electrode 57 on the lower surface of the insulating film 22 and is provided laterally to the electrode 57 on the lower surface of the insulating film 22. The reason is that the electrode 57 on the lower surface of the insulating film 22 is formed by sequentially forming the insulating film 56 and the insulating film 22 on the second interlayer insulating film 16, removing the insulating film 56 from between the second interlayer insulating film 16 and the insulating film 22, and subsequently forming the electrode 57 between the second interlayer insulating film 16 and the insulating film 22. That is, the electrode 57 is buried in the space obtained by removing the insulating film 56. Thus, the tubular electrode 43 can be formed using only the electrode 57.

According to the present embodiment, by manufacturing the solid-state imaging apparatus with use of the insulating film 56 instead of the third interlayer insulating film 18, the distance between the first semiconductor substrate 11 and the second semiconductor substrate 21 can be reduced. This allows the wire 31 to be shortened, allowing for a reduction in interwire capacity according to the present embodiment. Additionally, according to the present embodiment, the wire 31 on the floating diffusion layer FD can have a reduced aspect ratio.

FIG. 26 is a cross-sectional view depicting a structure of an amplifying transistor according to the second embodiment.

Like the amplifying transistor AMP according to the first embodiment, the amplifying transistor AMP according to the present embodiment includes the columnar semiconductor layer 41 having a columnar shape extending in the Y direction, the tubular insulating film 42 having a tubular shape extending in the Y direction, and the tubular electrode 43 having a tubular shape extending in the Y direction. However, the tubular insulating film 42 according to the first embodiment includes the insulating films 18a, 22, and 24, whereas the tubular insulating film 42 according to the present embodiment includes the insulating films 22 and 24. Additionally, the tubular electrode 43 according to the first embodiment includes the electrodes 17 and 25, whereas the tubular electrode 43 according to the present embodiment includes the electrode 57.

FIG. 26 depicts the thickness T1 of the tubular insulating film 42 on the lower surface of the columnar semiconductor layer 41, the thickness T2 of the tubular insulating film 42 on the upper surface of the columnar semiconductor layer 41, and the thickness T3 of the tubular insulating film 42 on the side surfaces of the columnar semiconductor layer 41. As is the case with the first embodiment, the thickness T1 according to the present embodiment is larger than each of the thickness T2 and the thickness T3 (T1>T2, T1>T3) and is, for example, twice each of the thicknesses T2 and T3 (T1≥2×T2, T1≥2×T3). Thus, according to the present embodiment, the thick tubular insulating film 42 on the lower surface of the columnar semiconductor layer 41 can preferably protect the columnar semiconductor layer 41.

FIGS. 27A, 27B, 28A, 28B, 29A, 29B, 30A, 30B, 31A, and 31B are cross-sectional views illustrating a method for manufacturing the solid-state imaging apparatus according to the second embodiment.

First, in the first semiconductor substrate 11, ion injection is used to form the n-type region 11a, the p-type region 11b, and the n-type region 11c (FIG. 27A). As a result, the photodiode PD and the floating diffusion section FD are formed in the first semiconductor substrate 11.

Then, the gate insulating film 12 is formed on the first semiconductor substrate 11, and the gate electrode 13 is formed on the gate insulating film 12 (FIG. 27A). As a result, the transfer transistor TG is formed on the first semiconductor substrate 11.

Then, the first interlayer insulating film 14 is formed on the first semiconductor substrate 11 via the gate insulating film 12 and the gate electrode 13 (FIG. 27B). Then, the wire 15 is formed on the first interlayer insulating film 14, and the second interlayer insulating film 16 is formed on the first interlayer insulating film 14 via the wire 15 (B of FIG. 27B).

Figure 28A:
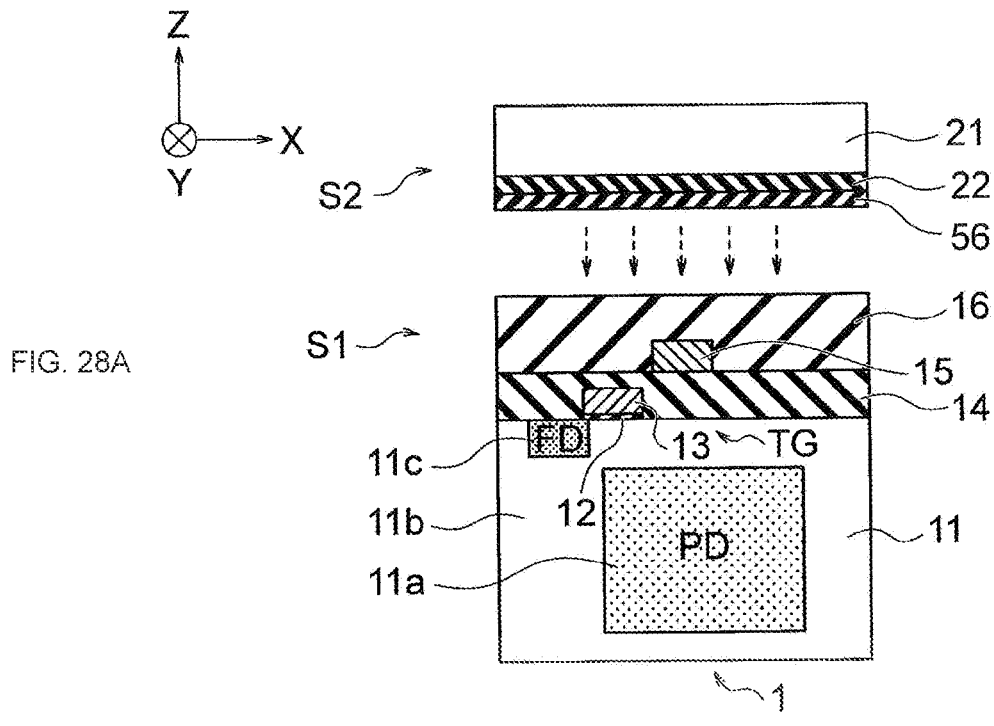
FIGS. 28A and 28B depict cross-sectional views (2/5) illustrating the method for manufacturing the solid-state imaging apparatus according to the second embodiment.

Then, the insulating film 22 and the insulating film 56 are sequentially formed on the upper surface of the second semiconductor substrate 21, and the second semiconductor substrate 21 is turned upside down and laminated to the first semiconductor substrate 11 (FIG. 28A). As a result, the first semiconductor substrate 11 and the second semiconductor substrate 21 are laminated to each other via the first interlayer insulating film 14, the second interlayer insulating film 16, the insulating film 56, the insulating film 22, and the like. The second semiconductor substrate 21 is laminated to the first semiconductor substrate 11 by, for example, plasma bonding.

Figure 28B:
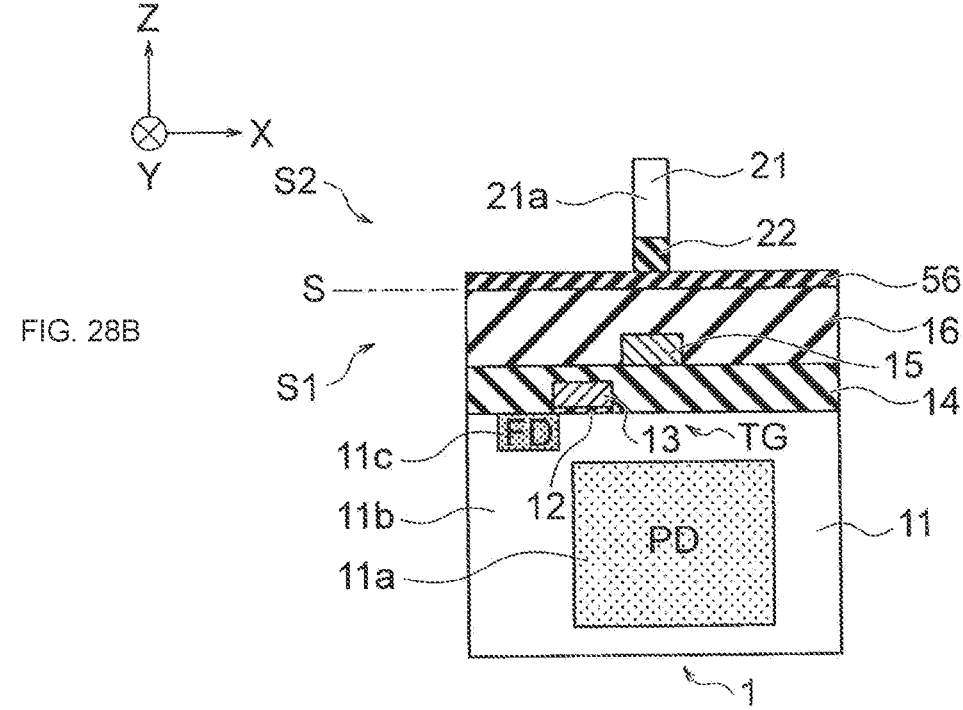

Then, the second semiconductor substrate 21 and the insulating film 22 are processed by photolithography and dry etching (FIG. 28B). As a result, a part of the second semiconductor substrate 21 is processed into the semiconductor layer 21a. Further, the insulating film 22 is processed in such a manner that the insulating film 22 remains on the lower surface of the semiconductor layer 21a.

Figure 29A:
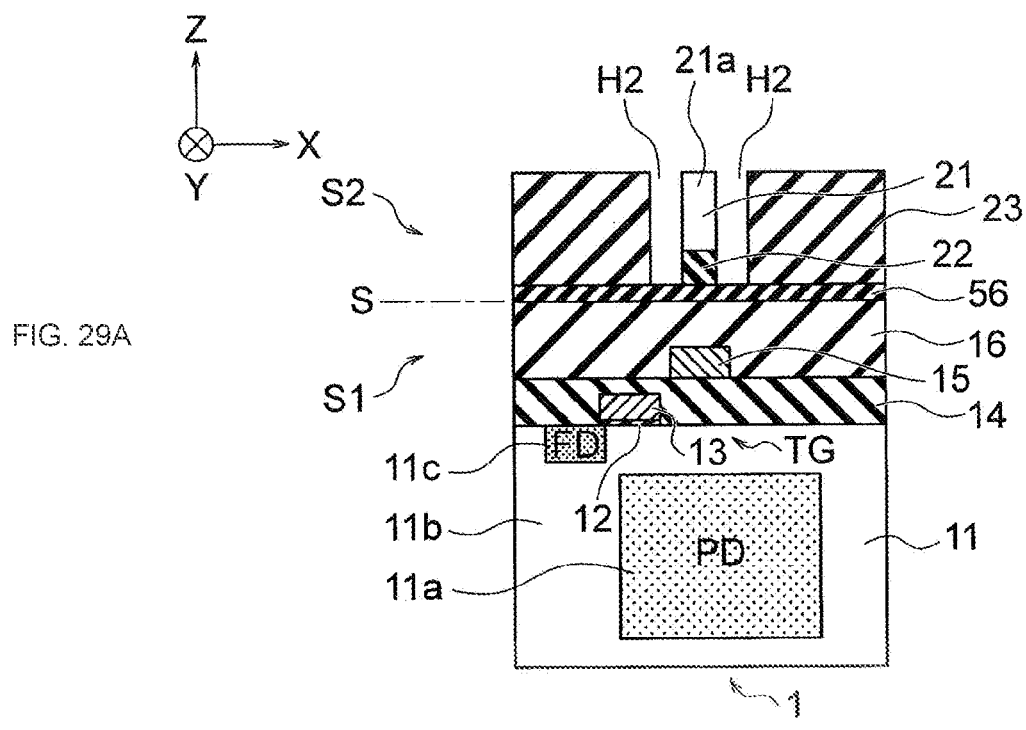
FIGS. 29A and 29B depict cross-sectional views (3/5) illustrating the method for manufacturing the solid-state imaging apparatus according to the second embodiment.

Then, the fourth interlayer insulating film 23 is formed on the second interlayer insulating film 16, and an opening H2 is formed in the fourth interlayer insulating film 23 (FIG. 29A). This process is executed in a manner similar to that of the process depicted in FIGS. 11A and 11B. Hence, the opening H2 is formed in a manner similar to that of the opening H1 depicted in B of FIG. 11B.

Figure 29B:
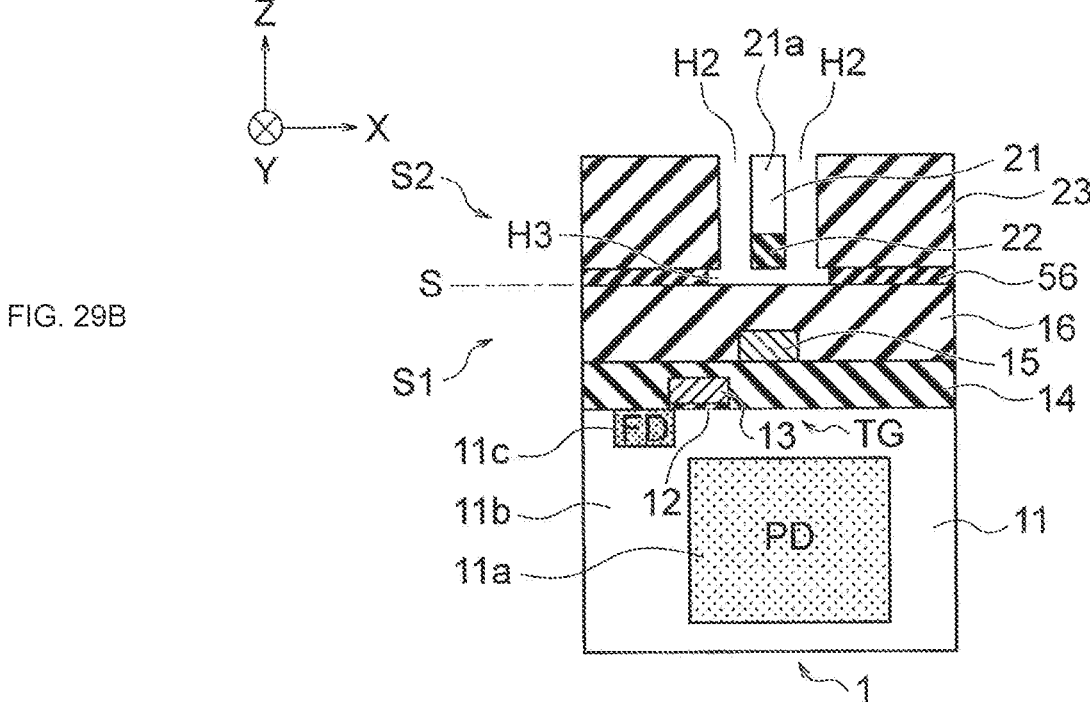

Then, wet etching with hot phosphoric acid is used to remove the insulating film 56 exposed in the opening H2 (FIG. 29B). This process removes a part of the insulating film 56, and specifically removes the insulating film 56 from the bottom of the opening H2 and between the second interlayer insulating film 16 and the insulating film 22. As a result, the opening H2 extends from a region in the fourth interlayer insulating film 23 to a region in the insulating film 56. In the present embodiment, the insulating film 56 is a silicon nitride film, and the other insulating film exposed in the opening H2 is a silicon oxide film. Hence, the insulating film 56 can selectively be etched by hot phosphoric acid.

Figure 30A:
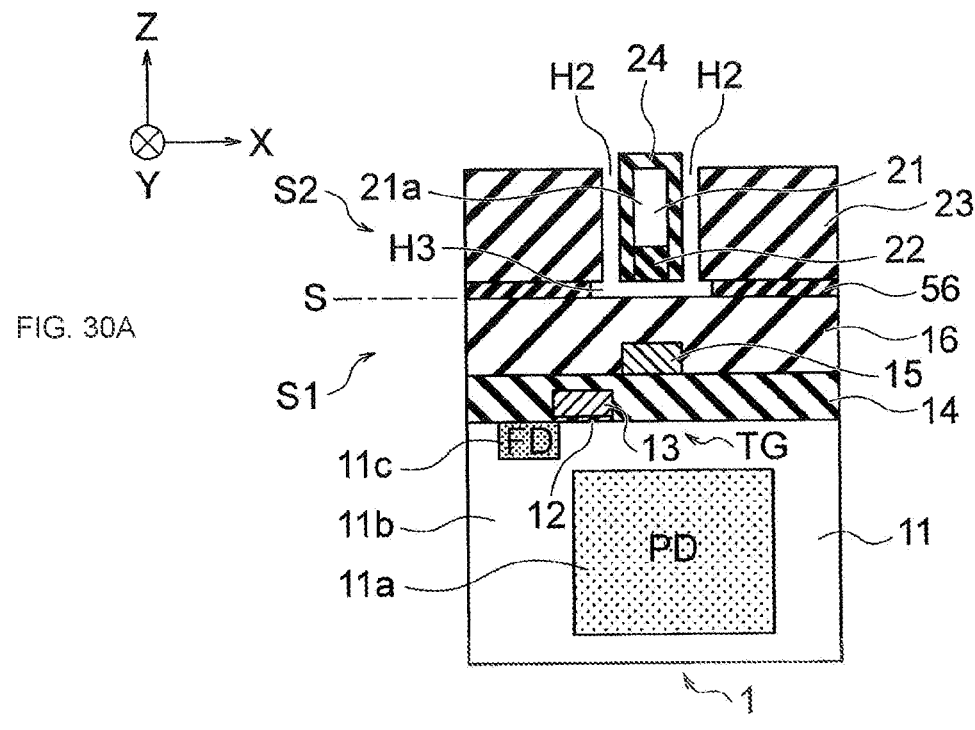
FIGS. 30A and 30B depict cross-sectional views (4/5) illustrating the method for manufacturing the solid-state imaging apparatus according to the second embodiment.

Then, the insulating film 24 is formed by thermal oxidation (FIG. 30A). The insulating film 24 is formed inside and outside the opening H2, and is specifically formed on the upper surface of the semiconductor layer 21a and on the side surfaces of the semiconductor layer 21a and the insulating film 22. In the present embodiment, the thickness of the insulating film 24 is set smaller than the thickness of the insulating film 22. Thus, the above-described conditions "T1>T2, T1>T3" and "T1≥2×T2, T1≥2×T3" can be satisfied (see FIG. 26).

Figure 30B:
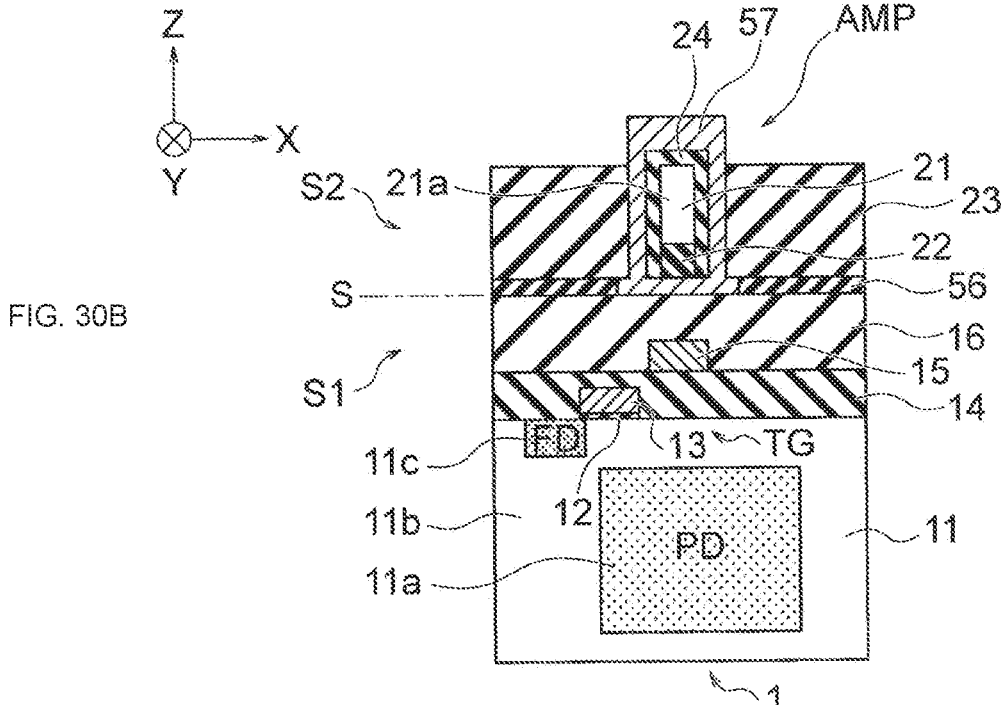

Then, thermal CVD is used to form the electrode 57 (FIG. 30B). The electrode 57 is formed inside and outside the opening H2, and is specifically formed on the upper surface of the insulating film 24, the side surfaces of the insulating film 24, and the lower surfaces of the insulating films 22 and 24. As a result, there is formed the amplifying transistor AMP that is depicted in FIG. 26 and that includes the columnar semiconductor layer 41, the tubular insulating film 42, and the tubular electrode 43.

Figure 31A:
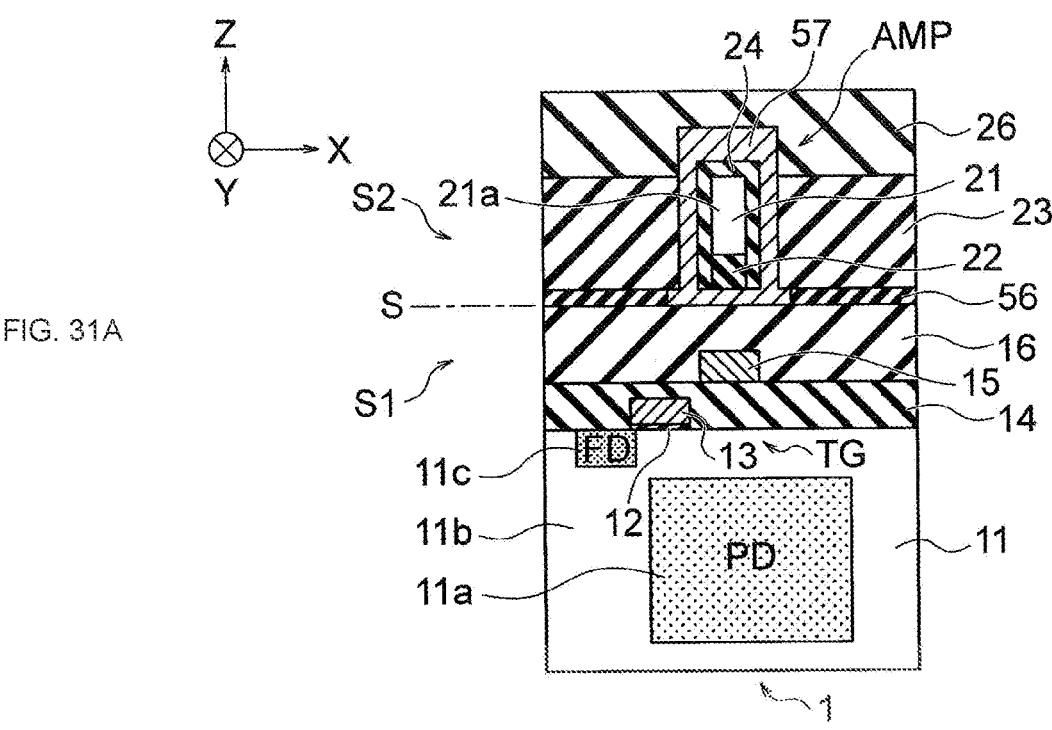
FIGS. 31A and 31B depict cross-sectional views (5/5) illustrating the method for manufacturing the solid-state imaging apparatus according to the second embodiment.

Then, on the fourth interlayer insulating film 23, the fifth interlayer insulating film 26 is formed to cover the amplifying transistor AMP (FIG. 31A).

Figure 31B:
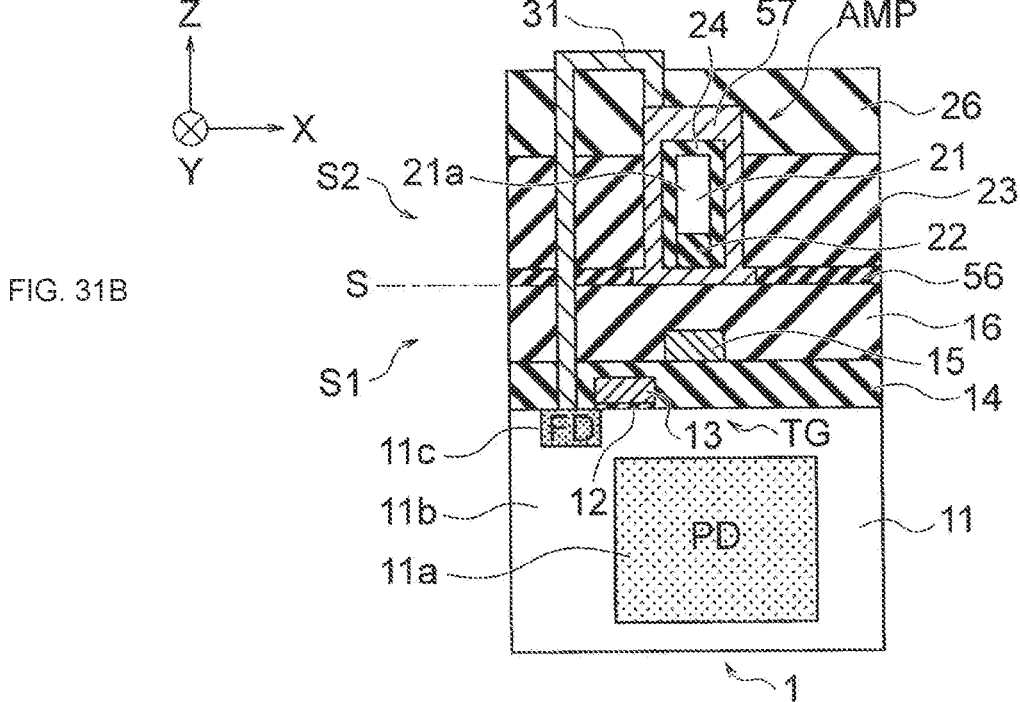

Then, a first opening is formed in the fifth interlayer insulating film 26, a second opening is formed in the first interlayer insulating film 14, the second interlayer insulating film 16, the insulating film 56, the fourth interlayer insulating film 23, and the fifth interlayer insulating film 26, and the wire 31 is formed in the first and second openings and on the fifth interlayer insulating film 26 (FIG. 31B). The first opening is formed in the upper surface of the electrode 57. The second opening is formed in the upper surface of the floating diffusion section FD. As a result, the electrode 57 and the floating diffusion section FD are electrically connected by the wire 31.

Subsequently, a color filter and an on-chip lens, not illustrated, are formed on the lower surface of the first semiconductor substrate 11. In this manner, the solid-state imaging apparatus according to the present embodiment is manufactured.

Variation of Second Embodiment

Figure 32:
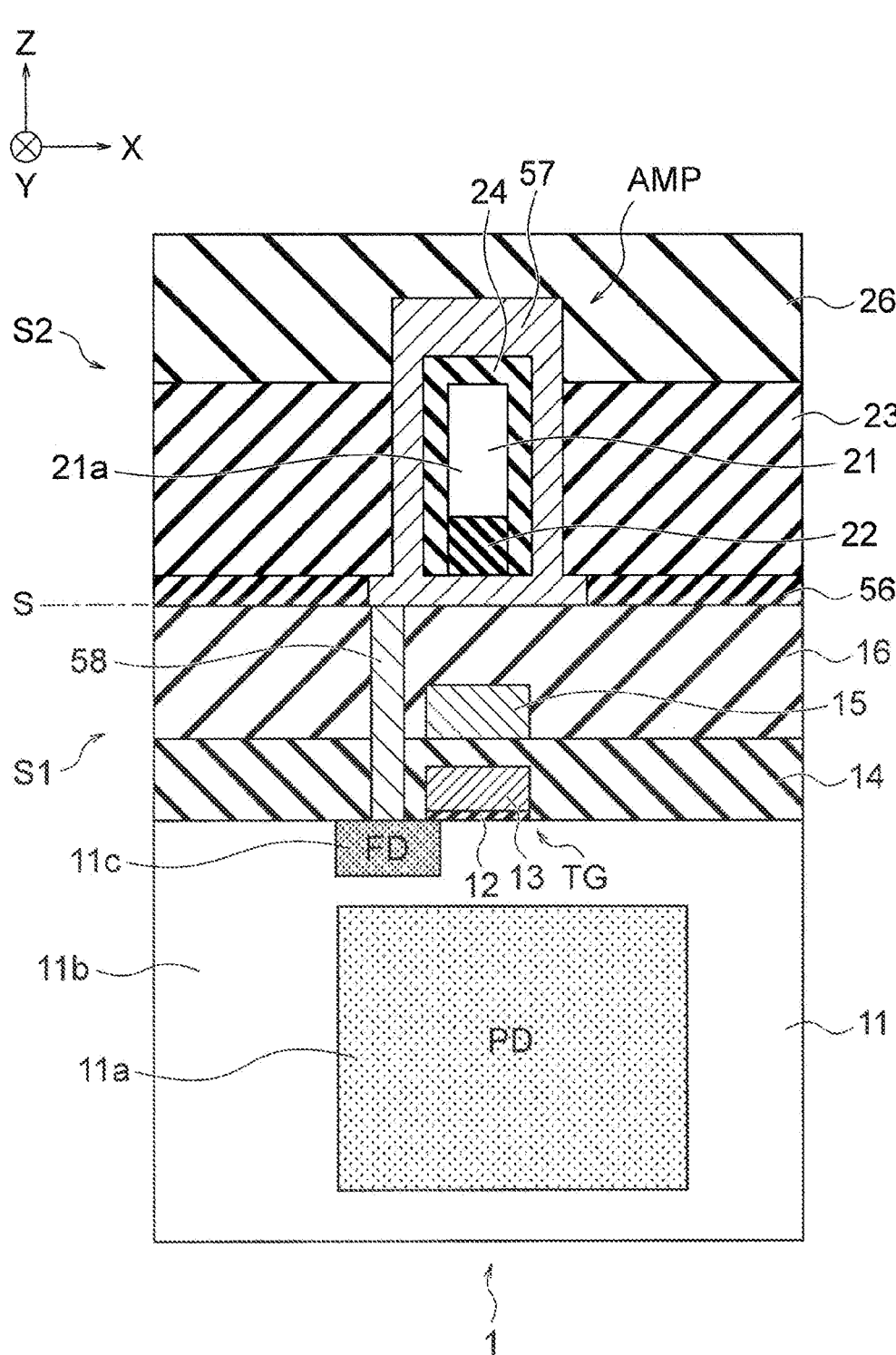
FIG. 32 is a cross-sectional view depicting a structure of a solid-state imaging apparatus according to a variation of the second embodiment.

FIG. 32 is a cross-sectional view depicting a structure of a solid-state imaging apparatus according to a variation of the second embodiment.

The solid-state imaging apparatus according to the present variation includes a wire 58 in addition to the components of the solid-state imaging apparatus according to the second embodiment. Meanwhile, the solid-state imaging apparatus according to the present variation does not include the wire 31.

The wire 58 has a structure similar to that of the wire 54 according to the second variation of the first embodiment. Specifically, the wire 58 is formed in the first interlayer insulating film 14 and the second interlayer insulating film 16 to electrically connect the floating diffusion section FD and the electrode 57. One end of the wire 58 is provided on the upper surface of the floating diffusion section FD, and the other end of the wire 58 is provided on the lower surface of the electrode 57. The wire 58 is, for example, a metal wire or a semiconductor wire. Like the wire 54, the wire 58 is an example of the third wire according to the present disclosure.

According to the present variation, using the wire 58 instead of the wire 31 allows the floating diffusion section FD and the tubular electrode 43 to electrically be connected by the wire 58 that is short. This enables a reduction in interwire capacity according to the present variation.

FIGS. 33A, 33B, 34A, and 34B are cross-sectional views illustrating a method for manufacturing the solid-state imaging apparatus according to the present variation.

Figure 33A:
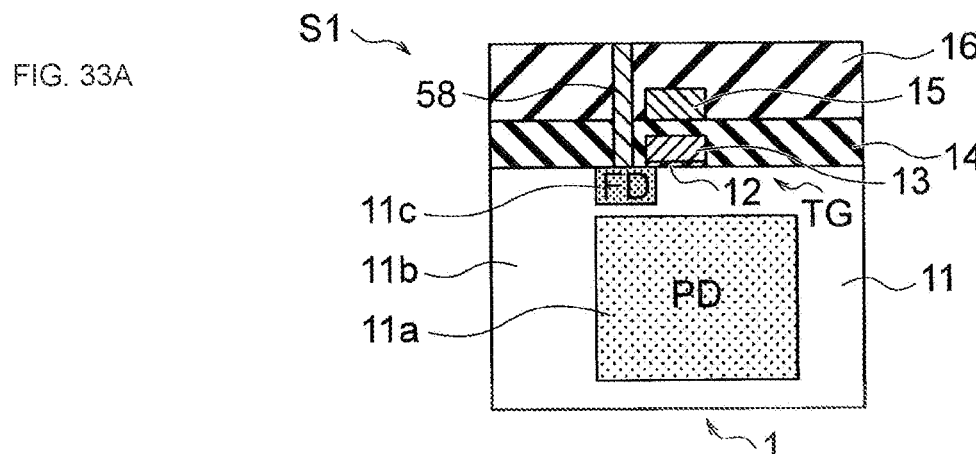
FIGS. 33A and 33B depict cross-sectional views (1/2) illustrating a method for manufacturing the solid-state imaging apparatus according to the variation described above.

First, in the first semiconductor substrate 11, ion injection is used to form the n-type region 11a, the p-type region 11b, and the n-type region 11c (FIG. 33A). As a result, the photodiode PD and the floating diffusion section FD are formed in the first semiconductor substrate 11.

Then, the gate insulating film 12 is formed on the first semiconductor substrate 11, and the gate electrode 13 is formed on the gate insulating film 12 (FIG. 33A). As a result, the transfer transistor TG is formed on the first semiconductor substrate 11.

Then, the first interlayer insulating film 14 is formed on the first semiconductor substrate 11 via the gate insulating film 12 and the gate electrode 13 (FIG. 33A). Then, the wire 15 is formed on the first interlayer insulating film 14, and the second interlayer insulating film 16 is formed on the first interlayer insulating film 14 via the wire 15 (FIG. 33A).

Then, an opening is formed in the first interlayer insulating film 14 and the second interlayer insulating film 16, and the wire 58 is formed in the opening (FIG. 33A). The opening is formed in the upper surface of the floating diffusion section FD, and thus the wire 58 is formed on the floating diffusion section FD. The opening is formed by photolithography and dry etching.

Figure 33B:
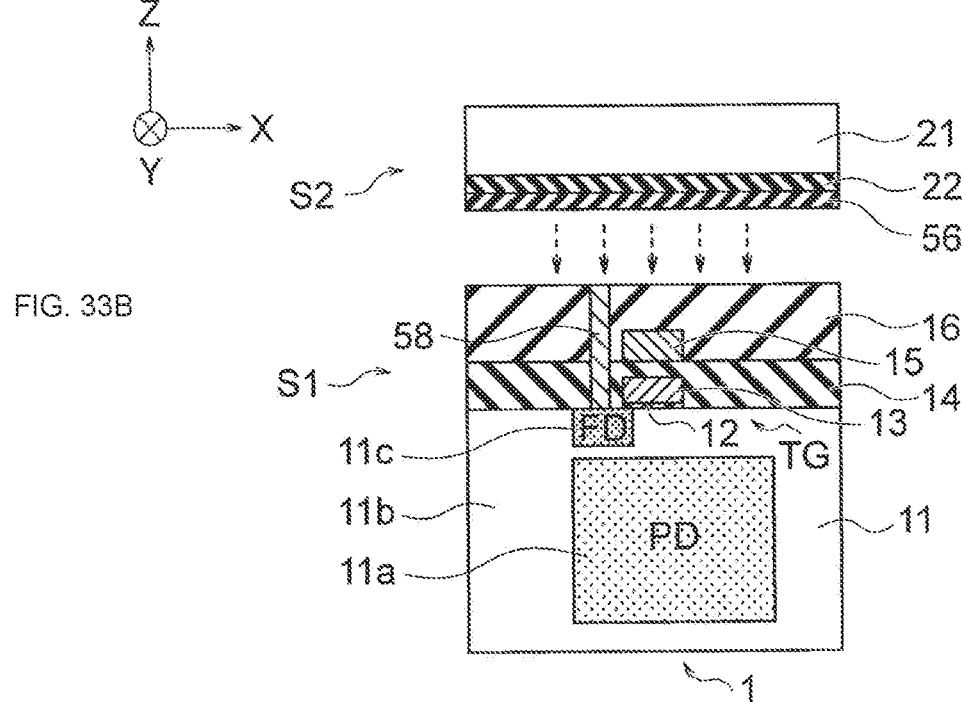

Then, the insulating film 22 and the insulating film 56 are sequentially formed on the upper surface of the second semiconductor substrate 21, and the second semiconductor substrate 21 is turned upside down and laminated to the first semiconductor substrate 11 (FIG. 33B). As a result, the first semiconductor substrate 11 and the second semiconductor substrate 21 are laminated to each other via the first interlayer insulating film 14, the second interlayer insulating film 16, the insulating film 56, the insulating film 22, and the like.

Figure 34A:
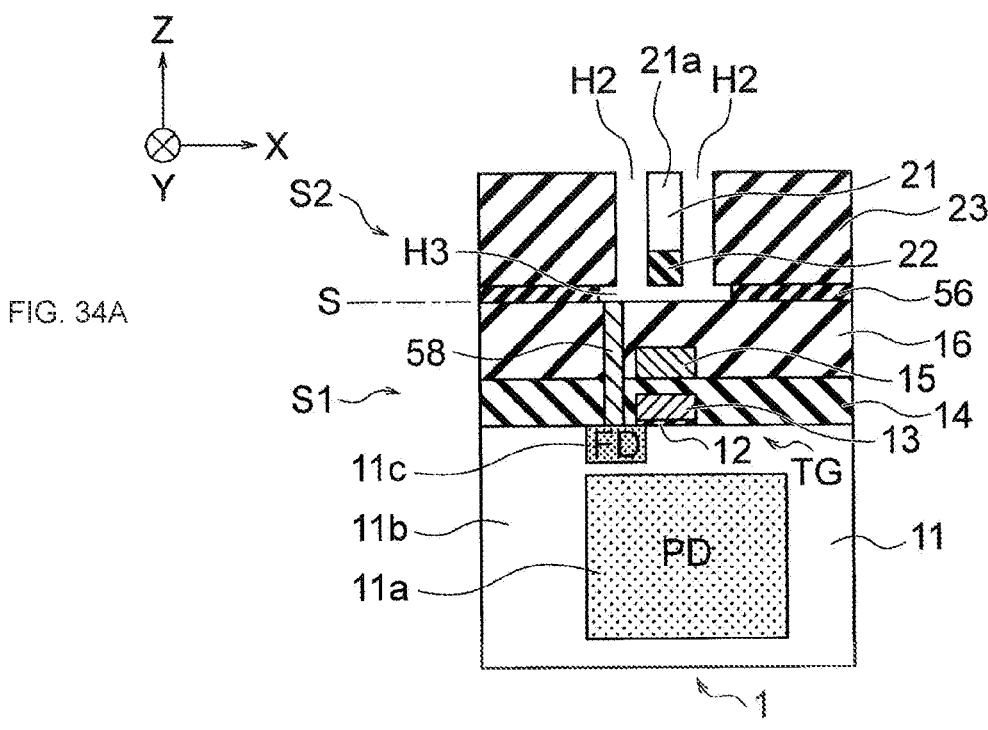
FIGS. 34A and 34B depict cross-sectional views (2/2) illustrating the method for manufacturing the solid-state imaging apparatus according to the variation described above.

Then, the second semiconductor substrate 21 and the insulating film 22 are processed by photolithography and dry etching (FIG. 34A). As a result, a part of the second semiconductor substrate 21 is processed into the semiconductor layer 21a. Further, the insulating film 22 is processed in such a manner that the insulating film 22 remains on the lower surface of the semiconductor layer 21a.

Then, the fourth interlayer insulating film 23 is formed on the second interlayer insulating film 16, the opening H2 is formed in the fourth interlayer insulating film 23, and wet etching with hot phosphoric acid is used to remove the insulating film 56 exposed in the opening H2 (FIG. 34A). This process is executed in a manner similar to that of the process depicted in FIGS. 29A and 29B. Thus, the opening H2 is formed in a manner similar to that of the opening H2 depicted in B of FIG. 29B.

Figure 34B:
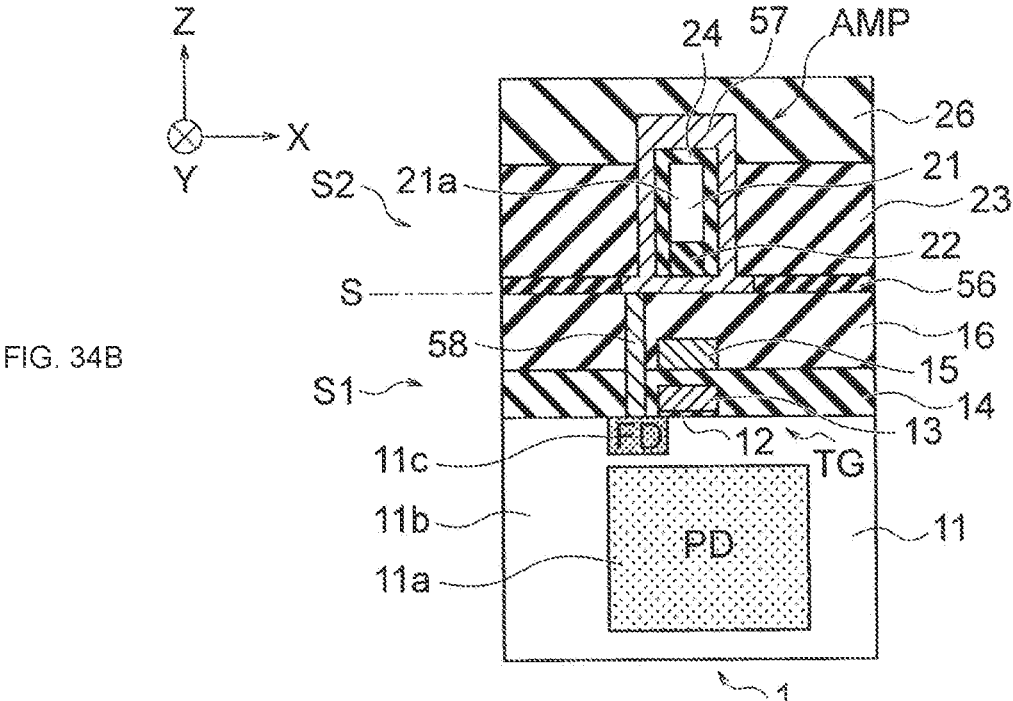

Then, the insulating film 24 and the electrode 57 are formed in the opening H2, and the fifth interlayer insulating film 26 is formed on the fourth interlayer insulating film 23 (FIG. 34B). This process is executed in a manner similar to that of the process depicted in A of FIGS. 30A, 30B, and 31A. Thus, the insulating film 24 and the electrode 57 are formed in a manner similar to that of the insulating film 24 and the electrode 57 depicted in FIG. 31A, and as a result, the amplifying transistor AMP is formed. In the present variation, the thickness of the insulating film 24 is set smaller than the thickness of the insulating film 22. Thus, the above-described conditions "T1>T2, T1>T3" and "T1≥2× T2, T1≥2×T3" can be realized (see FIG. 26). In this manner, the solid-state imaging apparatus according to the present variation is manufactured.

As described above, the tubular insulating film 42 according to the present embodiment and the variation thereof is formed in such a manner that the thickness T1 of the tubular insulating film 42 on the lower surface of the columnar semiconductor layer 41 is larger than each of the thicknesses T2 and T3 of the tubular insulating film 42 on the upper surface and the side surfaces of the columnar semiconductor layer 41. Accordingly, according to the present embodiment and the variation thereof, it is possible to realize the preferred amplifying transistor AMP in which, for example, the columnar semiconductor layer 41 can preferably be protected by the thick tubular insulating film 42 on the lower surface of the columnar semiconductor layer 41, or the like.

Applied Examples

FIG. 35 is a block diagram depicting a configuration example of electronic equipment. The electronic equipment depicted in FIG. 35 is a camera 100.

The camera 100 includes an optical section 101 having a lens group and the like, an imaging apparatus 102 that is the solid-state imaging apparatus according to the first or second embodiment, a DSP (Digital Signal Processor) circuit 103 that is a camera signal processing circuit, a frame memory 104, a display section 105, a recording section 106, an operation section 107, and a power supply section 108. Additionally, a bus line 109 is used to connect together the DSP circuit 103, the frame memory 104, the display section 105, the recording section 106, the operation section 107, and the power supply section 108.

The optical section 101 captures incident light (image light) from a subject to form an image on an imaging surface of the imaging apparatus 102. The imaging apparatus 102 converts the amount of incident light formed into an image on the imaging surface by the optical section 101, into an electrical signal on a per-pixel basis, and outputs the electric signal as a pixel signal.

The DSP circuit 103 executes signal processing on pixel signals output from the imaging apparatus 102. The frame memory 104 is a memory for storing one picture of a video or a still image captured by the imaging apparatus 102.

The display section 105 includes, for example, a panel display apparatus such as a liquid crystal panel or an organic EL panel to display the video or still image captured by the imaging apparatus 102. The recording section 106 records the video or still image captured by the imaging apparatus 102, in a recording medium such as a hard disk or a semiconductor memory.

Under the control of a user, the operation section 107 issues operation instructions for various functions of the camera 100. The power supply section 108 appropriately provides supply targets such as the DSP circuit 103, the frame memory 104, the display section 105, the recording section 106, and the operation section 107 with various power supplies used as operating power supplies for the supply targets.

Good images can be expected to be acquired by using, as the imaging apparatus 102, the solid-state imaging apparatus according to the first or second embodiment.

The solid-state imaging apparatus can be applied to various other products. For example, the solid-state imaging apparatus may be mounted in various mobile bodies such as an automobile, an electric car, a hybrid electric car, a motorcycle, a bicycle, a personal mobility device, an airplane, a drone, a ship, and a robot.

FIG. 36 is a block diagram depicting a configuration example of a mobile body control system. The mobile body control system depicted in FIG. 36 is a vehicle control system 200.

The vehicle control system 200 includes multiple electronic control units connected together via a communication network 201. In the example illustrated in FIG. 36, the vehicle control system 200 includes a driving system control unit 210, a body system control unit 220, an outside-vehicle information detecting unit 230, an in-vehicle information detecting unit 240, and an integrated control unit 250. FIG. 36 further depicts, as components of the integrated control unit 250, a microcomputer 251, a sound/image output section 252, and a vehicle-mounted network I/F (Interface) 253.

The driving system control unit 210 controls operation of apparatuses associated with a driving system of the vehicle in accordance with various programs. For example, the driving system control unit 210 functions as a control apparatus for a driving force generating apparatus for generating a driving force for the vehicle, such as an internal combustion engine or a driving motor, a driving force transmitting mechanism for transmitting the driving force to wheels, a steering mechanism adjusting the steering angle of the vehicle, and a braking apparatus generating a braking force for the vehicle.

The body system control unit 220 controls operation of various apparatuses installed in the vehicle body in accordance with various programs. For example, the body system control unit 220 functions as a control apparatus for a smart key system, a keyless entry system, a power window apparatus, and various lamps (for example, a headlamp, a backup lamp, a brake lamp, a blinker, and a fog lamp). In this case, the body system control unit 220 can receive a radio wave transmitted from a portable device replacing a key or signals from various switches. The body system control unit 220 receives input of such a radio wave or signals to control a door lock apparatus, a power window apparatus, lamps, and the like of the vehicle.

The outside-vehicle information detecting unit 230 detects information regarding the outside of the vehicle equipped with the vehicle control system 200. The outside-vehicle information detecting unit 230 connects to, for example, an imaging section 231. The outside-vehicle information detecting unit 230 causes the imaging section 231 to capture an outside image and receives the captured image from the imaging section 231. On the basis of the received image, the outside-vehicle information detecting unit 230 may execute object detection processing or distance detection processing on a human being, a car, an obstacle, a sign, characters on a road surface, or the like.

The imaging section 231 is a light sensor that receives light and that outputs an electric signal corresponding to the amount of light received. The imaging section 231 can output an electric signal as an image or ranging information. The light received by the imaging section 231 may be visible light or invisible light such as infrared light. The imaging section 231 includes the solid-state imaging apparatus according to the first or second embodiment.

The in-vehicle information detecting unit 240 detects information regarding the inside of the vehicle equipped with the vehicle control system 200. The in-vehicle information detecting unit 240 connects to, for example, a driver state detecting section 241 that detects the state of a driver. For example, the driver state detecting section 241 includes a camera that images the driver, and on the basis of detection information received from the driver state detecting section 241, the in-vehicle information detecting unit 240 may calculate the degree of fatigue or concentration of the driver or may determine whether the driver is dozing off. The camera may include the solid-state imaging apparatus according to the first or second embodiment and may be, for example, the camera 100 depicted in FIG. 35.

On the basis of in-vehicle or outside-vehicle information acquired by the outside-vehicle information detecting unit 230 or the in-vehicle information detecting unit 240, the microcomputer 251 can compute control target values for the driving force generating apparatus, the steering mechanism, or the braking apparatus and output control instructions to the driving system control unit 210. For example, the microcomputer 251 can perform cooperative control intended to achieve the functions of the ADAS (Advanced Driver Assistance System) such as collision avoidance, shock mitigation, cruise control based on inter-vehicle distance, adaptive cruise control, collision warning, and lane departure warning.

Additionally, by controlling the driving force generating apparatus, the steering mechanism, or the braking apparatus on the basis of information regarding the surroundings of the vehicle acquired by the outside-vehicle information detecting unit 230 or the in-vehicle information detecting unit 240, the microcomputer 251 can perform cooperative control intended for self-driving in which the vehicle travels automatedly without depending on the operation of the driver.

Additionally, the microcomputer 251 can output control instructions to the body system control unit 220 on the basis of outside-vehicle information acquired by the outside-vehicle information detecting unit 230. For example, the microcomputer 251 can perform cooperative control intended for glare prevention such as controlling the headlamp according to the position of a vehicle ahead or an oncoming vehicle detected by the outside-vehicle information detecting unit 230 to switch a high beam to a low beam.

The sound/image output section 252 transmits at least one of a sound output signal or an image output signal to an output apparatus that can visually or auditorily notify an occupant in the vehicle or the outside of information. The example in FIG. 36 illustrates, as such output apparatuses, an audio speaker 261, a display section 262, and an instrumental panel 263. The display section 262 may include, for example, an on-board display or a head-up display.

FIG. 37 is a plan view illustrating positions where the imaging section 231 in FIG. 36 is set.

A vehicle 300 depicted in FIG. 37 includes, as the imaging section 231, imaging sections 301, 302, 303, 304, and 305. The imaging sections 301, 302, 303, 304, and 305 are provided at positions such as a front nose, a side mirror, a rear bumper, and a back door of the vehicle 300, and a position above a windshield in the interior.

The imaging section 301 provided at the front nose mainly acquires images in front of the vehicle 300. The imaging sections 302 and 303 respectively provided at the left side mirror and at the right side mirror mainly acquire images lateral to the vehicle 300. The imaging section 304 provided at the rear bumper or at the back door mainly acquires images behind the vehicle 300. The imaging section 305 provided above the windshield in the interior mainly acquires images in front of the vehicle 300. The imaging section 305 is used to detect, for example, a vehicle ahead, a pedestrian, an obstacle, a traffic light, a traffic sign, a lane, or the like.

FIG. 37 illustrates examples of imaging ranges of the imaging sections 301, 302, 303, and 304 (hereinafter referred to as the "imaging sections 301 to 304"). The imaging range 311 indicates the imaging range of the imaging section 301 provided at the front nose. The imaging range 312 indicates the imaging range of the imaging section 302 provided at the left side mirror. The imaging range 313 indicates the imaging range of the imaging section 303 provided at the right side mirror. The imaging range 314 indicates the imaging range of the imaging section 304 provided at the rear bumper or at the back door. For example, image data captured by the imaging sections 301 to 304 are superimposed on one another to obtain a bird's-eye view image of the vehicle 300 as seen from above. The imaging ranges 311, 312, 313, and 314 are hereinafter referred to as the "imaging ranges 311 to 314."

At least one of the imaging sections 301 to 304 may have a function to acquire distance information. For example, at least one of the imaging sections 301 to 304 may be a stereo camera including multiple imaging apparatuses or an imaging apparatus including pixels for detection of a phase difference.

For example, on the basis of the distance information obtained from the imaging sections 301 to 304, the microcomputer 251 calculates the distance to each three-dimensional object in the imaging ranges 311 to 314 and a temporal variation in this distance (speed relative to the vehicle 300). On the basis of the calculation results, the microcomputer 251 can extract, as a vehicle ahead, a three-dimensional object nearest to the vehicle 300 on a traveling path and traveling at a predetermined speed (for example, 0 km/h or higher) in a direction substantially the same as that of the vehicle 300. Further, the microcomputer 251 can set an inter-vehicle distance to be previously provided between the vehicle 300 and the vehicle ahead in order to allow automatic brake control (including tracking stop control), automatic acceleration control (including tracking start control), and the like. In this manner, according to this example, cooperative control that is intended for automated driving in which the vehicle travels automatedly without depending on the operation of the driver can be performed.

For example, on the basis of the distance information obtained from the imaging sections 301 to 304, the microcomputer 251 can use three-dimensional object data related to a three-dimensional object to automatically avoid an obstacle by classifying the three-dimensional object data into a bicycle, a standard-sized vehicle, a large-sized vehicle, a pedestrian, an electric pole, or any other three-dimensional object for extraction. For example, the microcomputer 251 identifies an obstacle around the vehicle 300 either as an obstacle visible by the driver of the vehicle 300 or as an obstacle difficult to view by the driver. Then, the microcomputer 251 determines a collision risk indicating the degree of risk of a collision with each obstacle, and when the collision risk is equal to or greater than a set value and there is a possibility of a collision, the microcomputer 251 can assist operation for collision avoidance by outputting a warning to the driver via the audio speaker 261 or the display section 262, or performing forced deceleration or avoiding steering.

At least one of the imaging sections 301 to 304 may be an infrared camera that detects infrared rays. For example, the microcomputer 251 can recognize a pedestrian by determining whether or not the pedestrian is present in images captured by the imaging sections 301 to 304. Such recognition of a pedestrian is performed by, for example, a procedure of extracting features in the images captured by the imaging sections 301 to 304 as infrared cameras and a procedure of executing pattern matching processing on a series of features indicating the contour of an object to determine whether or not it is a pedestrian. When the microcomputer 251 determines that a pedestrian is present in the images captured by the imaging sections 301 to 304 and recognizes the pedestrian, the sound/image output section 252 controls the display section 262 in such a manner that the display section 262 displays and superimposes a square contour for emphasis on the recognized pedestrian. Additionally, the sound/image output section 252 may control the display section 262 in such a manner that an icon or the like indicating the pedestrian is displayed at a desired position.

Figure 38:
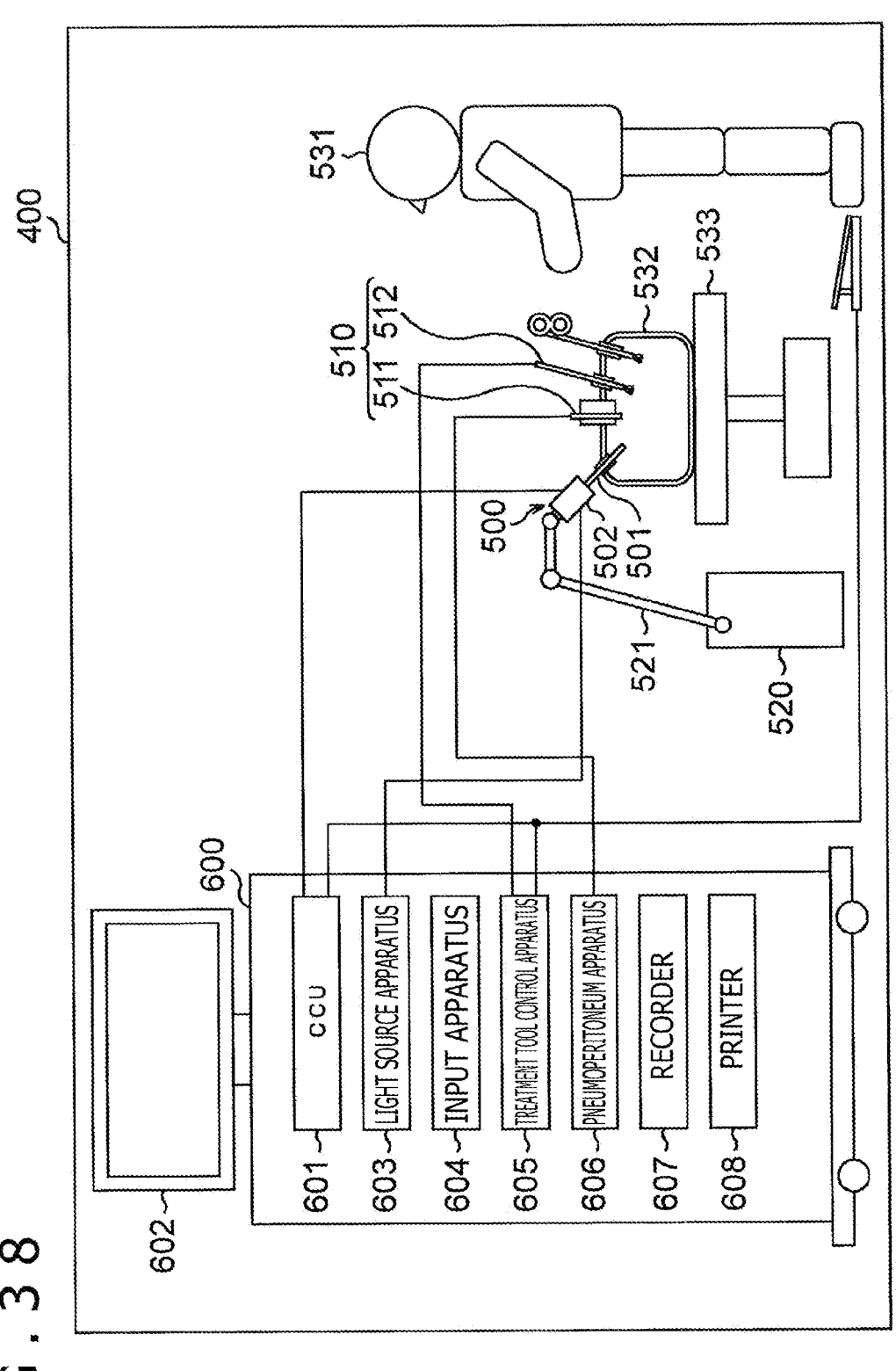
FIG. 38 is a diagram illustrating an example of a general configuration of an endoscopic surgery system.

FIG. 38 is a diagram illustrating an example of a general configuration of an endoscope surgery system to which the technology according to the present disclosure (present technology) can be applied.

FIG. 38 illustrates an operator (surgeon) 531 performing a surgery on a patient 532 on a patient bed 533 with use of an endoscope surgery system 400. As illustrated, the endoscope surgery system 400 includes an endoscope 500, other surgery tools 510 such as a pneumoperitoneum tube 511 and an energy treatment tool 512, a support arm apparatus 520 supporting the endoscope 500, and a cart 600 on which various apparatuses for the endoscope surgery are mounted.

The endoscope 500 includes a lens barrel 501 including a region that has a predetermined length from a tip of the lens barrel 501 and that is inserted into a body cavity of the patient 532, and a camera head 502 connected to a proximal end of the lens barrel 501. The illustrated example illustrates the endoscope 500 configured as what is called a rigid scope having the lens barrel 501 that is rigid. However, the endoscope 500 may be configured as what is called a flexible scope including a flexible lens barrel.

The lens barrel 501 includes an opening that is provided at the tip of the lens barrel 501 and in which an objective lens is fitted. A light source apparatus 603 is connected to the endoscope 500 and generates light, which is guided to the tip of the lens barrel by a light guide extended through the lens barrel 501. The light is then radiated to an observation target inside the body cavity of the patient 532 via the objective lens. Note that the endoscope 500 may be a forward-viewing scope or may be an oblique- or a side-viewing scope.

The camera head 502 is internally provided with an optical system and an imaging element, and the optical system focuses, on the imaging element, light reflected from the observation target (observation light). The imaging element photoelectrically converts the observation light to generate an electric signal corresponding to the observation light, that is, an image signal corresponding to the observation image. The image signal is transmitted to a camera control unit (CCU) 601 as RAW data.

The CCU 601 includes a CPU (Central Processing Unit), a GPU (Graphics Processing Unit), and the like to integrally control the operation of the endoscope 500 and the display apparatus 602. Further, the CCU 601 receives an image signal from the camera head 502 and executes, on the image signal, various types of image processing for displaying an image based on the image signal, for example, development processing (demosaic processing).

Under the control of the CCU 601, the display apparatus 602 displays the image based on the image signal on which the CCU 601 has executed the image processing.

The light source apparatus 603 includes, for example, a light source such as an LED (Light Emitting Diode) to feed the endoscope 500 with irradiation light used during imaging of an operative site and the like.

An input apparatus 604 is an input interface for an endoscope surgery system 11000. The user can input various pieces of information and indications to the endoscope surgery system 400 via the input apparatus 604. For example, the user inputs indications to change conditions for imaging (the type of irradiation light, magnification, a focal distance, and the like) by the endoscope 500, and the like.

A treatment tool control apparatus 605 controls driving of the energy treatment tool 512, used for cautery and incision of tissues, sealing of blood vessels, or the like. For the purpose of providing a field of view used by the endoscope 500 and a work space for the operator, a pneumoperitoneum apparatus 606 feeds gas into the body cavity of the patient 532 via the pneumoperitoneum tube 511 to inflate the body cavity. A recorder 607 is an apparatus that can record various pieces of information related to operations. A printer 608 is an apparatus that can print various pieces of information related to operations, in various forms such as texts, images, or graphs.

Note that the light source apparatus 603 feeding the endoscope 500 with irradiation light used during imaging of the operative site includes, for example, a white light source including LEDs, laser light sources, or a combination thereof. In a case where the white light source includes a combination of laser light sources for R, G, and B, the output intensity and output timing of each color (each wavelength) can accurately be controlled. Accordingly, the light source apparatus 603 can be used to adjust white balance of captured images. Additionally, in this case, by irradiating the observation target with laser light from each of the R, G, and B laser light sources in a time-division manner and controlling driving of the imaging element of the camera head 502 in synchronism with the irradiation timing, images corresponding to R, G, and B can be captured in a time-division manner. This method allows color images to be obtained without providing the imaging element with a color filter.

Additionally, driving of the light source apparatus 603 may be controlled in such a manner as to vary the intensity of output light at intervals of a predetermined time. By controlling driving of the imaging element of the camera head 502 in synchronism with the timing of variation of the light intensity to acquire images in a time division manner, and merging the images, images in high dynamic range can be generated that are free from what is called underexposed blocked up shadows and overexposed highlights.

Additionally, the light source apparatus 603 may be configured to be capable of feeding light in a predetermined wavelength band that is compatible with special light observation. The special light observation includes, for example, what is called narrow band imaging in which the dependency, on wavelength, of light absorption in body tissues is utilized to provide light in a band narrower than that of the irradiation light (that is, white light) during normal observation, thus imaging a predetermined tissue such as a blood vessel in a superficial portion of the mucous membrane in a high contrast. Alternatively, the special light observation may include fluorescence observation in which irradiation with excitation light is used to generate fluorescence to obtain images. The fluorescence observation allows observation of fluorescent light from a body tissue irradiated with excitation light (autofluorescence observation), and allows a fluorescent image to be obtained by locally injecting a reagent such as an indocyanine green (ICG) into the body tissue and irradiating the body tissue with excitation light corresponding to the fluorescence wavelength of the reagent, for example. The light source apparatus 603 can be configured to be capable of feeding narrow band light and/or excitation light corresponding to such special light observation.

Figure 39:
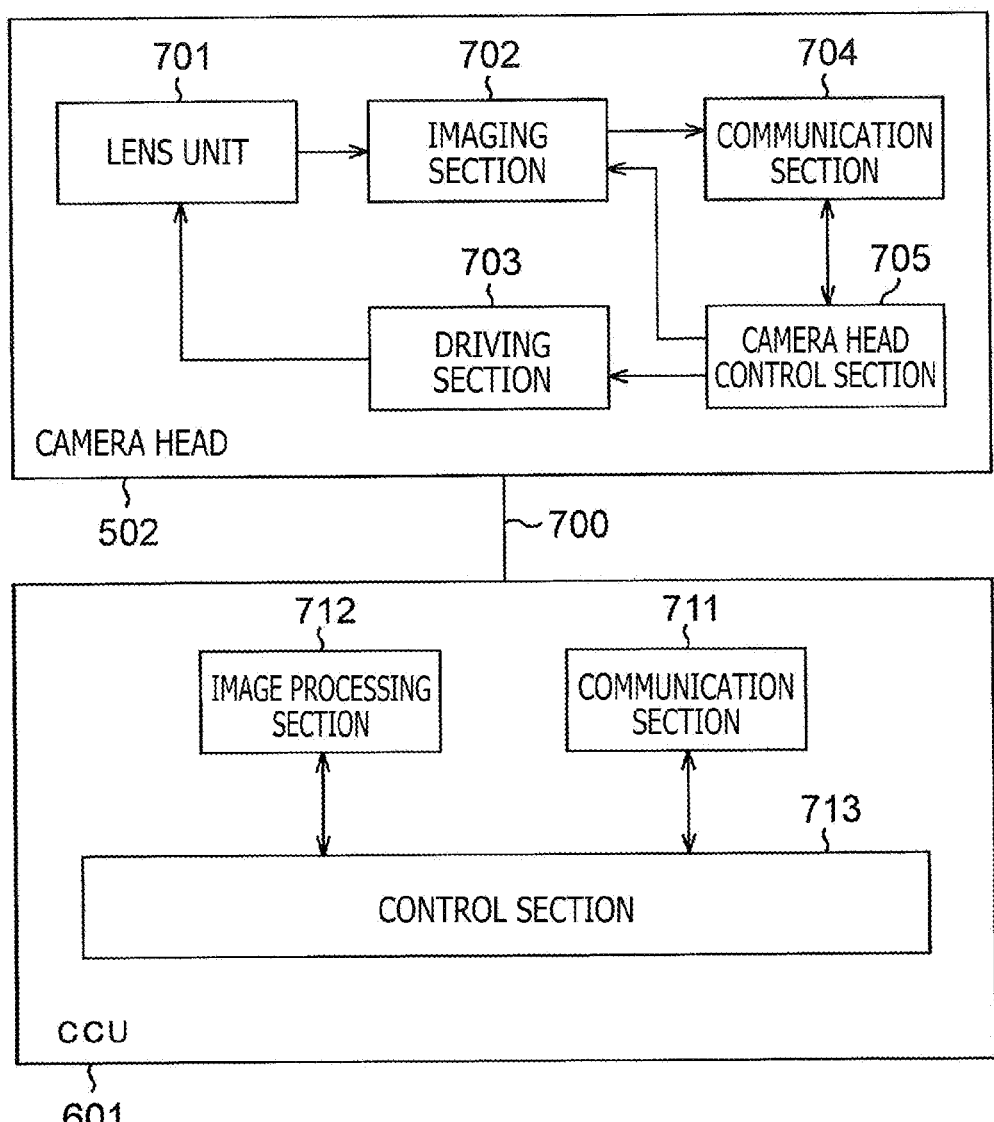
FIG. 39 is a block diagram illustrating an example of a functional configuration of a camera head and a CCU.

FIG. 39 is a block diagram illustrating an example of a functional configuration of the camera head 502 and the CCU 601 depicted in FIG. 38.

The camera head 502 includes a lens unit 701, an imaging section 702, a driving section 703, a communication section 704, and a camera head control section 705. The CCU 601 includes a communication section 711, an image processing section 712, and a control section 713. The camera head 502 and the CCU 601 are communicatively connected to each other by a transmission cable 700.

The lens unit 701 is an optical system provided in a connection with the lens barrel 501. Observation light captured from the tip of the lens barrel 501 is guided to the camera head 502 and enters the lens unit 701. The lens unit 701 includes a combination of multiple lenses including a zoom lens and a focus lens.

The imaging section 702 includes an imaging element. The imaging section 702 may include a single imaging element (what is called a single plate type) or multiple imaging elements (what is called a multiplate type). In a case where the imaging section 702 is of a multiplate type, a color image may be obtained by, for example, using the imaging elements to generate respective image signals corresponding to R, G, and B and merging the image signals. Alternatively, the imaging section 702 may include a pair of imaging elements for acquiring respective image signals for the right eye and the left eye that are compatible with 3D (Dimensional) display. The 3D display enables the operator 531 to more accurately recognize the depth of the biological tissue in the operative site. Note that, in a case where the imaging section 702 is of a multiplate type, multiple lens units 701 are provided in association with the imaging elements. The imaging section 702 is, for example, the solid-state imaging apparatus according to the first or second embodiment.

Additionally, the imaging section 702 need not necessarily be provided in the camera head 502. For example, the imaging section 702 may be provided inside the lens barrel 501 immediately after the objective lens.

The driving section 703 includes an actuator, and under the control of the camera head control section 705, moves the zoom lens and the focus lens in the lens unit 701 only by predetermined distances along an optical axis. This allows appropriate adjustment of the magnification and focus of images captured by the imaging section 702.

The communication section 704 includes a communication apparatus for transmitting and receiving various pieces of information to and from the CCU 601. The communication section 704 transmits an image signal obtained from the imaging section 702, to the CCU 601 via the transmission cable 700 as RAW data.

Additionally, the communication section 704 receives, from the CCU 601, a control signal for controlling driving of the camera head 502 and provides the control signal to the camera head control section 705. The control signal includes, for example, information indicating specification of a frame rate of a captured image, information indicating specification of an exposure value during imaging, information indicating specification of magnification and focus of a captured image, and/or other information related to imaging conditions.

Note that imaging conditions such as the frame rate, exposure value, magnification, and focus as described above may be appropriately specified by the user or automatically set by the control section 713 of the CCU 601 on the basis of the image signal acquired. In the latter case, the endoscope 500 is provided with what is called an AE (Auto Exposure) function, an AF (Auto Focus) function, and an AWB (Auto White Balance) function.

The camera head control section 705 controls driving of the camera head 502 on the basis of a control signal from the CCU 601 received via the communication section 704.

The communication section 711 includes a communication apparatus for transmitting and receiving various pieces of information to and from the camera head 502. The communication section 711 receives an image signal transmitted from the camera head 502 via the transmission cable 700.

Additionally, the communication section 711 transmits, to the camera head 502, a control signal for controlling driving of the camera head 502. The image signals and control signals can be transmitted by telecommunication, optical communication, or the like.

The image processing section 712 executes various types of image processing on the image signal that is RAW data transmitted from the camera head 502.

The control section 713 performs various types of control related to imaging of the operative site and the like by the endoscope 500, and display of a captured image obtained by imaging the operative site and the like. For example, the control section 713 generates a control signal for controlling driving of the camera head 502.

Additionally, the control section 713 causes the display apparatus 602 to display the captured image depicting the operative site and the like, on the basis of the image signal on which the image processing section 712 has executed the image processing. At this time, the control section 713 may use various image recognition technologies to recognize various objects in the captured image. For example, by detecting the shape, color, and the like of an edge of an object contained in the captured image, the control section 713 can recognize a surgery tool such as forceps, a particular biological site, hemorrhage, or mist during use of the energy treatment tool 512. When causing the display apparatus 602 to display the captured image, the control section 713 may use recognition results for the captured image to cause various pieces of surgical assistance information to be superimposed on an image of the operative site. By superimposing the surgical assistance information on the image and presenting the resultant image to the operator 531, burdens on the operator 531 can be reduced, and the operator 531 can reliably perform surgery.

The transmission cable 700 connecting the camera head 502 and the CCU 601 is an electric signal cable compatible with communication of electric signals, an optical fiber compatible with optical communication, or a composite cable thereof.

Here, in the illustrated example, wired communication is performed using the transmission cable 700. However, wireless communication may be made between the camera head 502 and the CCU 601.

The embodiments of the present disclosure have been described but may be varied for implementation without departing from the spirits of the present disclosure. For example, two or more embodiments may be combined for implementation.

Note that the present disclosure can also adopt the following configurations.

(1)

A solid-state imaging apparatus including:

a first semiconductor substrate including a photoelectric conversion section and a floating diffusion section; and a first transistor including a first semiconductor layer provided above the first semiconductor substrate, a first insulating film provided on a lower surface, an upper surface, and side surfaces of the first semiconductor layer, and a first electrode provided on a lower surface, an upper surface, and side surfaces of the first insulating film, in which the thickness of the first insulating film on the lower surface of the first semiconductor layer is larger than the thickness of the first insulating film on the upper surface or side surfaces of the first semiconductor layer.

(2)

The solid-state imaging apparatus according to (1), in which the thickness of the first insulating film on the lower surface of the first semiconductor layer is at least twice the thickness of the first insulating film on the upper surface or side surfaces of the first semiconductor layer.

(3)

The solid-state imaging apparatus according to (1), in which the first semiconductor layer, the first insulating film, and the first electrode extend in a first direction parallel to a surface of the first semiconductor substrate, and the first insulating film and the first electrode have a tubular shape surrounding the first semiconductor layer.

(4)

The solid-state imaging apparatus according to (1), in which the first semiconductor layer is a part of a second semiconductor substrate provided above the first semiconductor substrate.

(5)

The solid-state imaging apparatus according to (1), in which the first transistor includes an amplifying transistor, a select transistor, a reset transistor, or a switch transistor.

(6)

The solid-state imaging apparatus according to (1), in which the first insulating film includes a first film provided on the lower surface of the first semiconductor layer and a second film provided on the upper surface and side surfaces of the first semiconductor layer.

(7)

The solid-state imaging apparatus according to (6), in which the first insulating film further includes a third film provided on a lower surface of the first film.

(8)

The solid-state imaging apparatus according to (1), in which the first electrode includes a first layer provided on the lower surface of the first insulating film and a second layer provided on the upper surface and side surfaces of the first insulating film.

(9)

The solid-state imaging apparatus according to (1), further including:

a second insulating film that has a thickness same as that of the first electrode on the lower surface of the first insulating film and that is provided laterally to the first electrode on the lower surface of the first insulating film.

(10)

The solid-state imaging apparatus according to (1), further including:

a first wire that is provided on an upper surface of the first electrode and that electrically connects the first electrode and the floating diffusion section.

(11)

The solid-state imaging apparatus according to (1), further including:

a second semiconductor layer provided above the first semiconductor substrate; and a second wire that electrically connects the first semiconductor substrate and the second semiconductor layer.

(12)

The solid-state imaging apparatus according to (11), in which the second semiconductor layer is a part of a second semiconductor substrate provided above the first semiconductor substrate.

(13)

The solid-state imaging apparatus according to (1), further including:

a third wire that is provided on a lower surface of the first electrode and that electrically connects the first electrode and the floating diffusion section.

(14)

The solid-state imaging apparatus according to (1), further including:

a fourth wire that is provided on a side surface of the first electrode and that electrically connects the first electrode and the floating diffusion section.

(15)

A method for manufacturing a solid-state imaging apparatus, the method including:

forming a photoelectric conversion section and a floating diffusion section in a first semiconductor substrate; and forming a first transistor including a first semiconductor layer provided above the first semiconductor substrate, a first insulating film provided on a lower surface, an upper surface, and side surfaces of the first semiconductor layer, and a first electrode provided on a lower surface, an upper surface, and side surfaces of the first insulating film, in which the thickness of the first insulating film on the lower surface of the first semiconductor layer is set larger than the thickness of the first insulating film on the upper surface or side surfaces of the first semiconductor layer.

(16)

The method for manufacturing a solid-state imaging apparatus according to (15), in which the first semiconductor layer is formed by laminating the first semiconductor substrate and a second semiconductor substrate to each other and processing the second semiconductor substrate and the first semiconductor layer.

(17)

The method for manufacturing a solid-state imaging apparatus according to (16), in which the first insulating film includes a first film provided on the lower surface of the first semiconductor layer and a second film provided on the upper surface and side surfaces of the first semiconductor layer, and the first semiconductor substrate and the second semiconductor substrate are laminated to each other via the first film provided on a lower surface of the second semiconductor substrate.

(18)

The method for manufacturing a solid-state imaging apparatus according to (17), in which the first insulating film further includes a third film provided on a lower surface of the first film, and the first semiconductor substrate and the second semiconductor substrate are further laminated to each other via the third film provided on an upper surface of the first semiconductor substrate.

(19)

The method for manufacturing a solid-state imaging apparatus according to (16), in which the first electrode includes a first layer provided on the lower surface of the first insulating film and a second layer provided on the upper surface and side surfaces of the first insulating film, and the first semiconductor substrate and the second semiconductor substrate are laminated to each other via the first layer provided on an upper surface of the first semiconductor substrate.

(20)

The method for manufacturing a solid-state imaging apparatus according to (17), in which the first semiconductor substrate and the second semiconductor substrate are further laminated to each other via a second insulating film provided on a lower surface of the first film, and the first electrode is formed by removing, after the lamination, a part of the second insulating film between the first semiconductor substrate and the second semiconductor substrate, and forming, after the removal, a part of the first electrode between the first semiconductor substrate and the second semiconductor substrate.

REFERENCE SIGNS LIST

1: Pixel
2: Pixel array region
3: Control circuit
4: Vertical driving circuit
5: Column signal processing circuit
6: Horizontal driving circuit
7: Output circuit
8: Vertical signal line
9: Horizontal signal line
11: First semiconductor substrate
11*a*: n-type region
11*b*: p-type region
11*c*: n-type region
12: Gate insulating film

13: Gate electrode
14: First interlayer insulating film
15: Wire
16: Second interlayer insulating film
17: Electrode
18: Third interlayer insulating film
18*a*: Insulating film
21: Second semiconductor substrate
21*a*: Semiconductor layer
21*b*: Semiconductor layer
22: Insulating film
23: Fourth interlayer insulating film
24: Insulating film
25: Electrode
26: Fifth interlayer insulating film
31: Wire
41: Columnar semiconductor layer
42: Tubular insulating film
43: Tubular electrode
51: Wire
52: Contact electrode
53: Vertical wire
54: Wire
55: Wire
56: Insulating film
57: Electrode
58: Wire

The invention claimed is:

1. A solid-state imaging apparatus, comprising:
a first semiconductor substrate including a photoelectric conversion section and a floating diffusion section; and
a first transistor including a first semiconductor layer provided above the first semiconductor substrate, a first insulating film provided on a lower surface, an upper surface, and side surfaces of the first semiconductor layer, and a first electrode provided on a lower surface, an upper surface, and side surfaces of the first insulating film, wherein
a thickness of the first insulating film on the lower surface of the first semiconductor layer is larger than a thickness of the first insulating film on the upper surface or the side surfaces of the first semiconductor layer.

2. The solid-state imaging apparatus according to claim 1, wherein the thickness of the first insulating film on the lower surface of the first semiconductor layer is at least twice the thickness of the first insulating film on the upper surface or the side surfaces of the first semiconductor layer.

3. The solid-state imaging apparatus according to claim 1, wherein
the first semiconductor layer, the first insulating film, and the first electrode extend in a first direction parallel to a surface of the first semiconductor substrate, and
the first insulating film and the first electrode have a tubular shape surrounding the first semiconductor layer.

4. The solid-state imaging apparatus according to claim 1, wherein the first semiconductor layer is a part of a second semiconductor substrate provided above the first semiconductor substrate.

5. The solid-state imaging apparatus according to claim 1, wherein the first transistor includes an amplifying transistor, a select transistor, a reset transistor, or a switch transistor.

6. The solid-state imaging apparatus according to claim 1, wherein the first insulating film includes a first film provided on the lower surface of the first semiconductor layer and a second film provided on the upper surface and the side surfaces of the first semiconductor layer.

7. The solid-state imaging apparatus according to claim 6, wherein the first insulating film further includes a third film provided on a lower surface of the first film.

8. The solid-state imaging apparatus according to claim 1, wherein the first electrode includes a first layer provided on the lower surface of the first insulating film and a second layer provided on the upper surface and the side surfaces of the first insulating film.

9. The solid-state imaging apparatus according to claim 1, further comprising:
a second insulating film that has a thickness same as that of the first electrode on the lower surface of the first insulating film and that is provided laterally to the first electrode on the lower surface of the first insulating film.

10. The solid-state imaging apparatus according to claim 1, further comprising:
a first wire that is provided on an upper surface of the first electrode and that electrically connects the first electrode and the floating diffusion section.

11. The solid-state imaging apparatus according to claim 1, further comprising:
a second semiconductor layer provided above the first semiconductor substrate; and
a second wire that electrically connects the first semiconductor substrate and the second semiconductor layer.

12. The solid-state imaging apparatus according to claim 11, wherein the second semiconductor layer is a part of a second semiconductor substrate provided above the first semiconductor substrate.

13. The solid-state imaging apparatus according to claim 1, further comprising:
a third wire that is provided on a lower surface of the first electrode and that electrically connects the first electrode and the floating diffusion section.

14. The solid-state imaging apparatus according to claim 1, further comprising:
a fourth wire that is provided on a side surface of the first electrode and that electrically connects the first electrode and the floating diffusion section.

15. A method for manufacturing a solid-state imaging apparatus, the method comprising:
forming a photoelectric conversion section and a floating diffusion section in a first semiconductor substrate; and
forming a first transistor including a first semiconductor layer provided above the first semiconductor substrate, a first insulating film provided on a lower surface, an upper surface, and side surfaces of the first semiconductor layer, and a first electrode provided on a lower surface, an upper surface, and side surfaces of the first insulating film, wherein
a thickness of the first insulating film on the lower surface of the first semiconductor layer is set larger than a thickness of the first insulating film on the upper surface or the side surfaces of the first semiconductor layer.

16. The method for manufacturing the solid-state imaging apparatus according to claim 15, wherein the first semiconductor layer is formed by laminating the first semiconductor substrate and a second semiconductor substrate to each other and processing the second semiconductor substrate and the first semiconductor layer.

17. The method for manufacturing the solid-state imaging apparatus according to claim 16, wherein
the first insulating film includes a first film provided on the lower surface of the first semiconductor layer and a second film provided on the upper surface and the side surfaces of the first semiconductor layer, and the first semiconductor substrate and the second semiconductor substrate are laminated to each other via the first film provided on a lower surface of the second semiconductor substrate.

18. The method for manufacturing the solid-state imaging apparatus according to claim 17, wherein the first insulating film further includes a third film provided on a lower surface of the first film, and the first semiconductor substrate and the second semiconductor substrate are further laminated to each other via the third film provided on an upper surface of the first semiconductor substrate.

19. The method for manufacturing the solid-state imaging apparatus according to claim 17, wherein the first semiconductor substrate and the second semiconductor substrate are further laminated to each other via a second insulating film provided on a lower surface of the first film, and the first electrode is formed by removing, after the lamination, a part of the second insulating film between the first semiconductor substrate and the second semiconductor substrate, and forming, after the removal, a part of the first electrode between the first semiconductor substrate and the second semiconductor substrate.

20. The method for manufacturing the solid-state imaging apparatus according to claim 16, wherein the first electrode includes a first layer provided on the lower surface of the first insulating film and a second layer provided on the upper surface and the side surfaces of the first insulating film, and the first semiconductor substrate and the second semiconductor substrate are laminated to each other via the first layer provided on an upper surface of the first semiconductor substrate.

\* \* \* \* \*